United States Patent
Lupino et al.

(10) Patent No.: US 10,304,846 B2
(45) Date of Patent: May 28, 2019

(54) THREE DIMENSIONAL INTEGRATED CIRCUITS EMPLOYING THIN FILM TRANSISTORS

(71) Applicant: TACHO HOLDINGS, LLC, St. Louis Park, MN (US)

(72) Inventors: James John Lupino, St. Louis Park, MN (US); Tommy Allen Agan, Maple Grove, MN (US)

(73) Assignee: Tacho Holdings, LLC, St. Louis Park, MN (US)

( * ) Notice: Subject to any disclaimer, the term of this patent is extended or adjusted under 35 U.S.C. 154(b) by 0 days.

(21) Appl. No.: 15/560,902

(22) PCT Filed: Mar. 25, 2016

(86) PCT No.: PCT/US2016/024173
§ 371 (c)(1),
(2) Date: Sep. 22, 2017

(87) PCT Pub. No.: WO2016/154521
PCT Pub. Date: Sep. 29, 2016

(65) Prior Publication Data
US 2018/0151583 A1    May 31, 2018

Related U.S. Application Data

(60) Provisional application No. 62/137,819, filed on Mar. 25, 2015, provisional application No. 62/252,522, filed on Nov. 8, 2015.

(51) Int. Cl.
*H01L 27/11556* (2017.01)
*H01L 27/06* (2006.01)
(Continued)

(52) U.S. Cl.
CPC .... *H01L 27/11556* (2013.01); *H01L 27/0688* (2013.01); *H01L 27/1157* (2013.01);
(Continued)

(58) Field of Classification Search
CPC ......... H01L 27/11556; H01L 27/11524; H01L 27/1157; H01L 27/11582
(Continued)

(56) References Cited

U.S. PATENT DOCUMENTS

2004/0211963 A1    10/2004    Garni et al.
2005/0023656 A1*    2/2005    Leedy ...................... B81B 7/02
                                                            257/678
(Continued)

OTHER PUBLICATIONS

International Search Report and Written Opinion dated Jun. 29, 2016, for corresponding PCT Application No. PCT/US2016/024173.
(Continued)

*Primary Examiner* — Fernando Hidalgo
(74) *Attorney, Agent, or Firm* — Kinney & Lange, P.A.

(57) ABSTRACT

An integrated circuit which enables lower cost and improved features compared to standard crystalline silicon integrated circuits by utilizing thin film transistors (TFTs) in 2D and 3D memory and logic devices, including NAND flash memory and other nonvolatile memories such as RRAM, NRAM, MRAM, FeRAM or PCRAM. By utilizing TFTs, density is improved and die area and costs are reduced. Volumetric memory arrays of several layers may be fabricated with greatly reduced area requirements for periphery circuits and routing. Under 5% area requirements are possible. Ultra-wide I/O may be implemented without die area penalty. Vertical TFTs and logic gates provide better density and high speed approaching or exceeding that of crystalline silicon.

24 Claims, 88 Drawing Sheets

(51) Int. Cl.
*H01L 45/00* (2006.01)
*H01L 27/22* (2006.01)
*H01L 27/24* (2006.01)
*H01L 27/11524* (2017.01)
*H01L 27/1157* (2017.01)
*H01L 27/11582* (2017.01)

(52) U.S. Cl.
CPC .. *H01L 27/11524* (2013.01); *H01L 27/11582* (2013.01); *H01L 27/222* (2013.01); *H01L 27/2427* (2013.01); *H01L 27/2481* (2013.01); *H01L 45/04* (2013.01); *H01L 45/06* (2013.01); *H01L 45/141* (2013.01); *H01L 45/149* (2013.01)

(58) Field of Classification Search
USPC ...... 365/185.17, 53, 72, 113, 114, 129, 163, 365/174
See application file for complete search history.

(56) References Cited

U.S. PATENT DOCUMENTS

| | | | |
|---|---|---|---|
| 2006/0152960 A1* | 7/2006 | Sheats | H01L 51/0034 365/112 |
| 2009/0213633 A1* | 8/2009 | Rinerson | G11C 11/5685 365/51 |
| 2012/0098566 A1 | 4/2012 | Robinett | |
| 2013/0122672 A1* | 5/2013 | Or-Bach | H01L 21/8221 438/199 |
| 2014/0085967 A1 | 3/2014 | Liu et al. | |

OTHER PUBLICATIONS

International Preliminary Report on Patentability, for PCT Patent Application No. PCT/US2016/024173, dated Sep. 26, 2017, 8 pages.

* cited by examiner

| Structure | p-BiCS (Toshiba) | TCAT (Samsung) | 3D FG (Hynix) | Micron |
|---|---|---|---|---|
| | Tanaka. H, VLSIT 2007 | J. Jang, VLSIT 2009 | S. Whang, IEDM 2010 | G. Hawk, FMS 2011 |
| Key Features | - P+ SONOS Cell | - TANOS Cell | - Floating Gate | ? |
| Key Issue | - Large Cell Size<br>- Reliability | - Large Cell Size<br>- SL Resistance | - Process of bit separation<br>- Disturbance | ? |

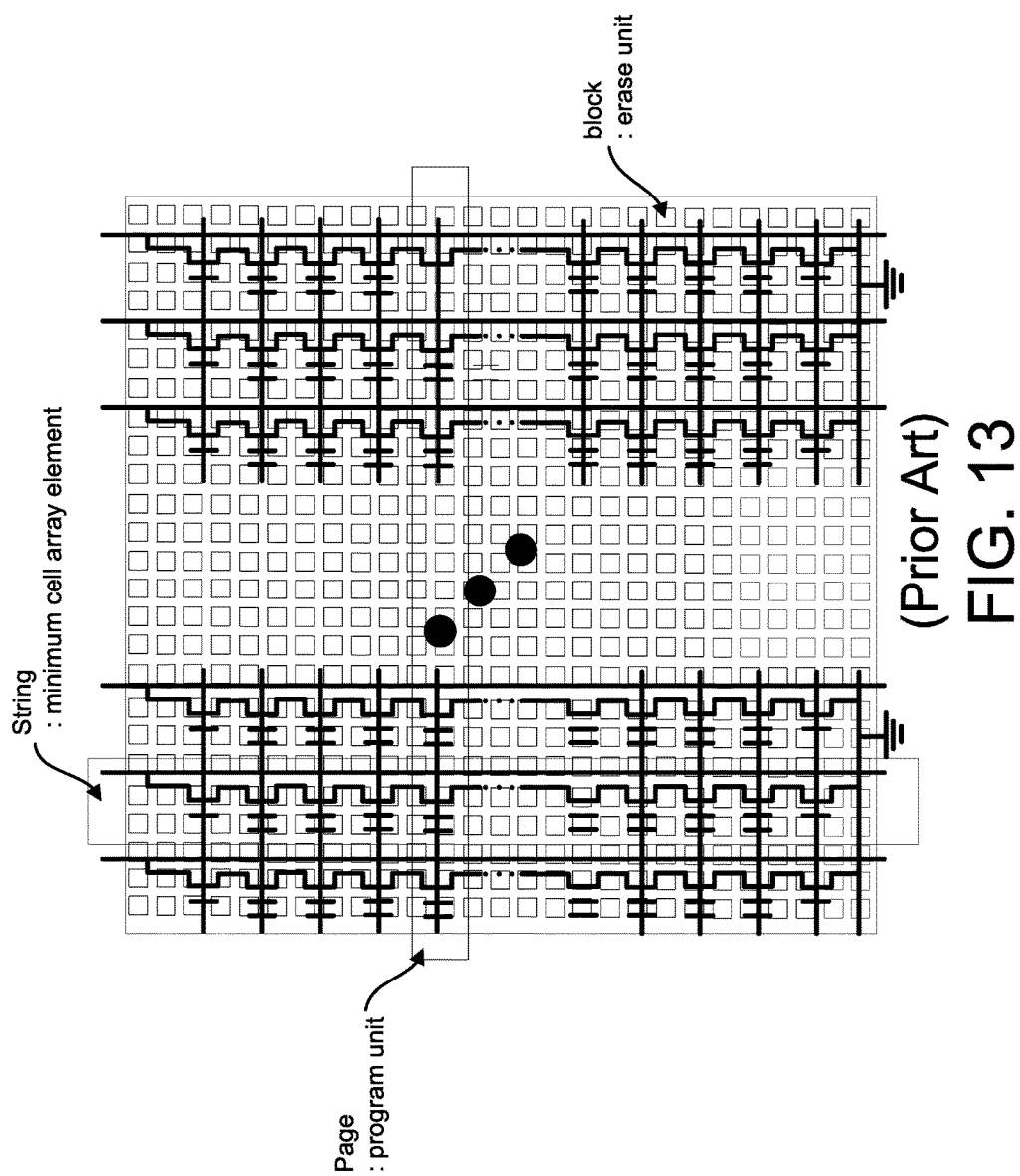

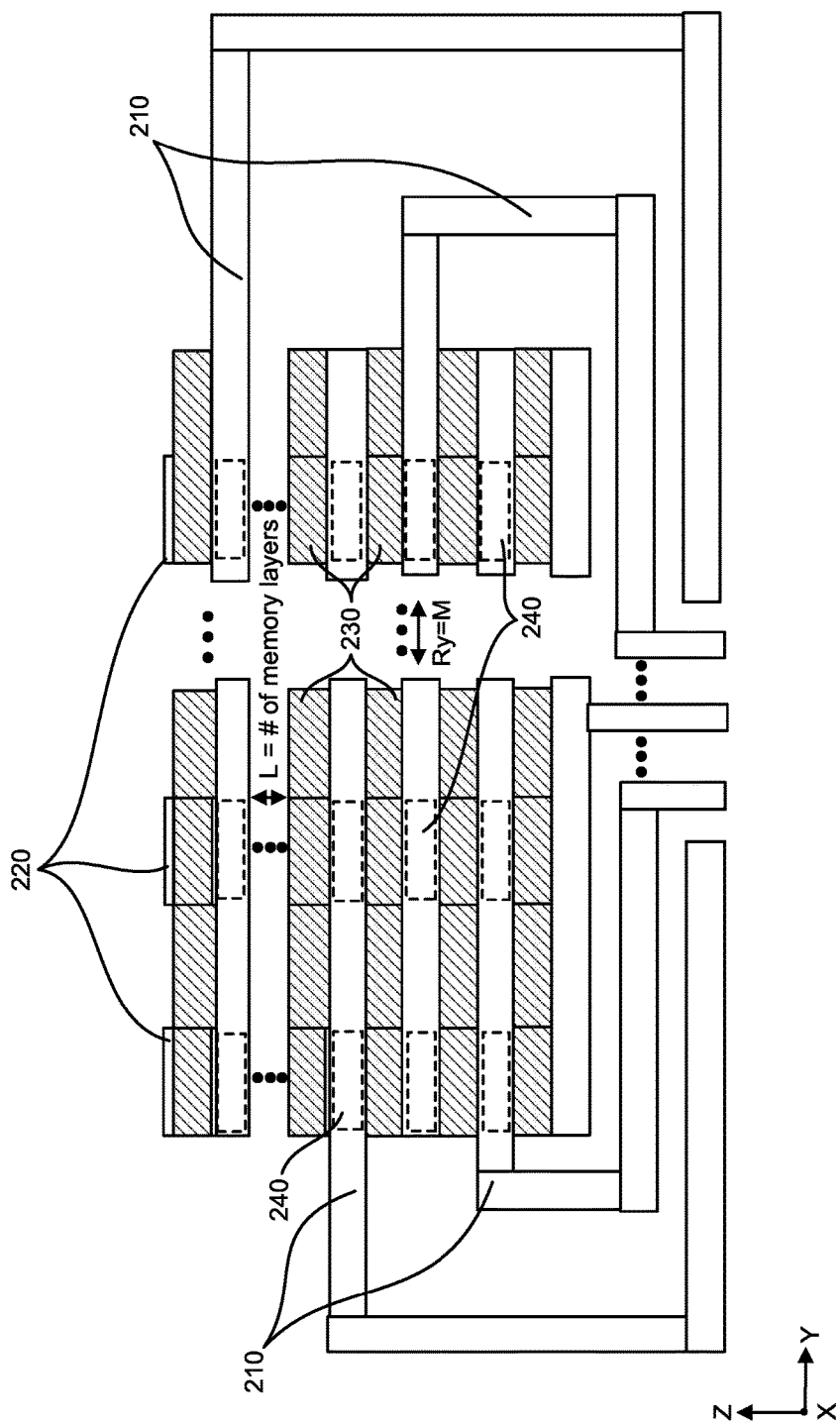

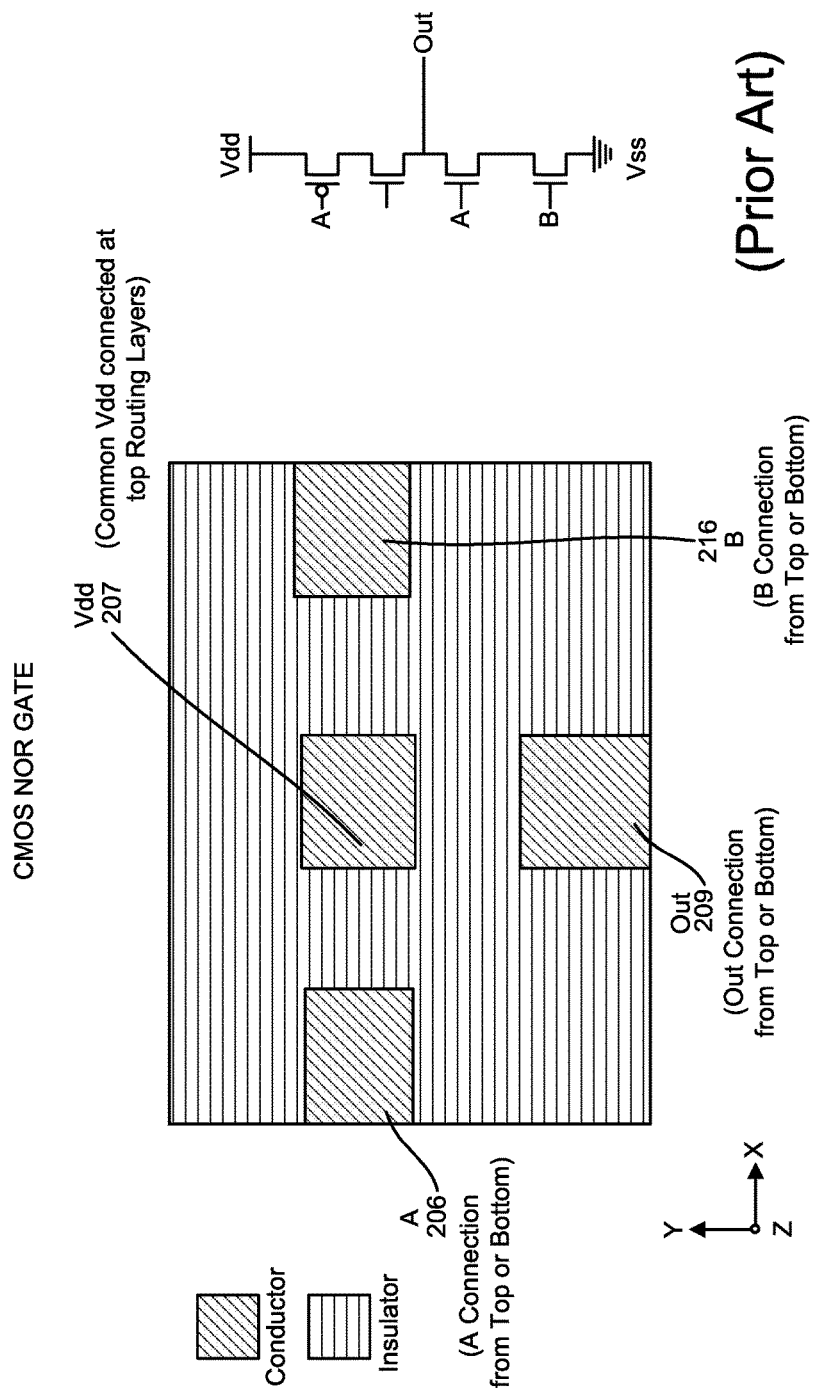

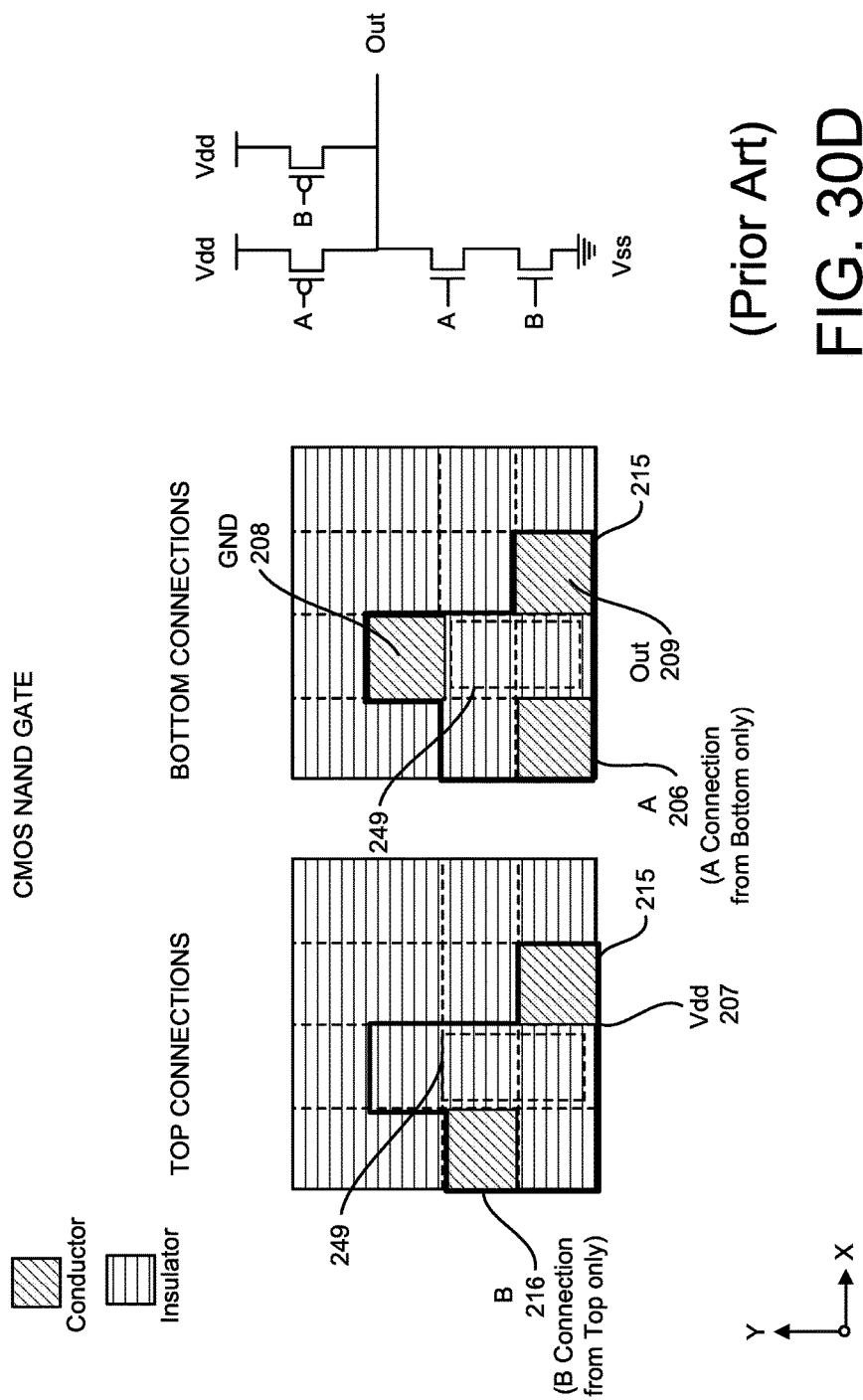

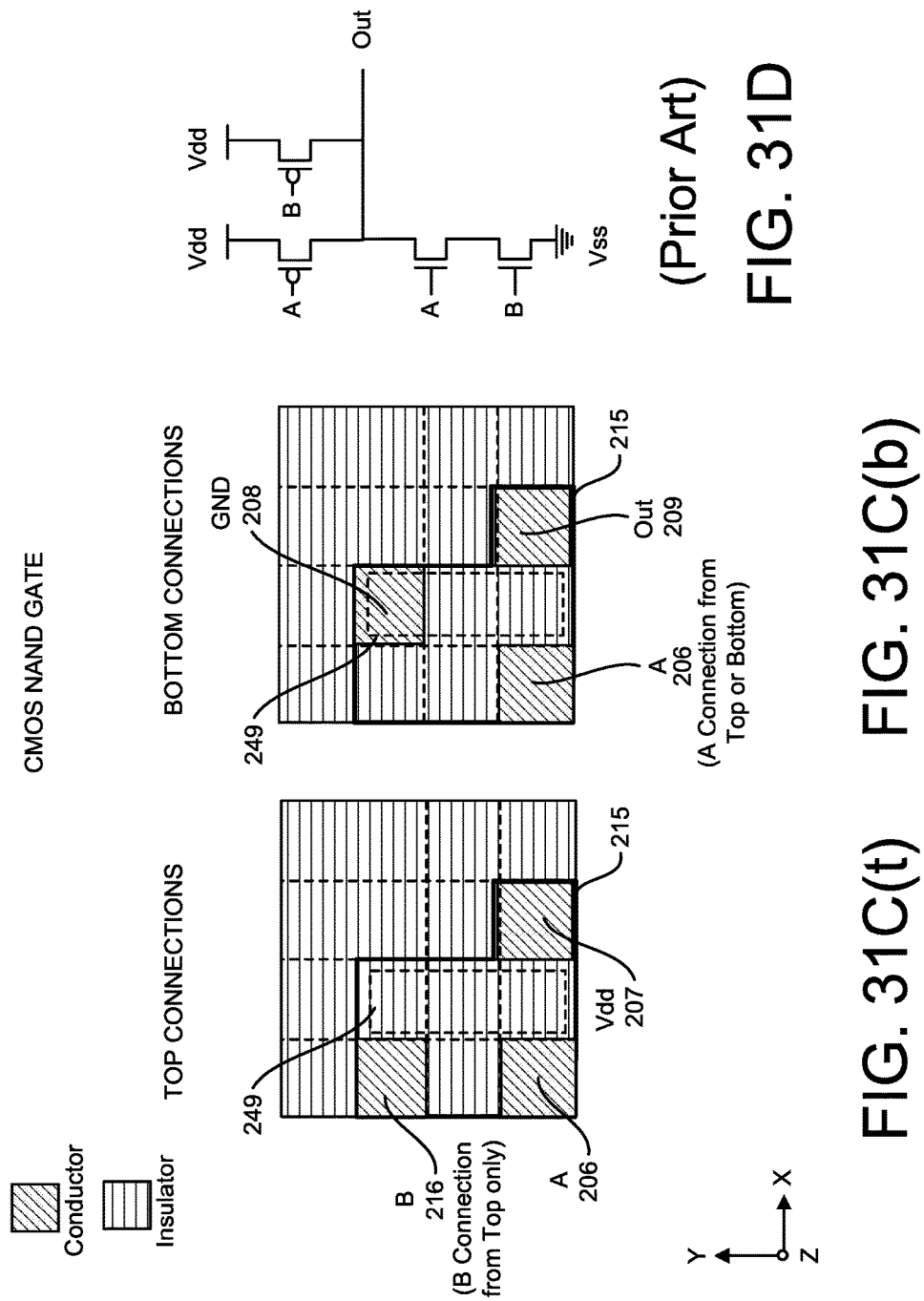

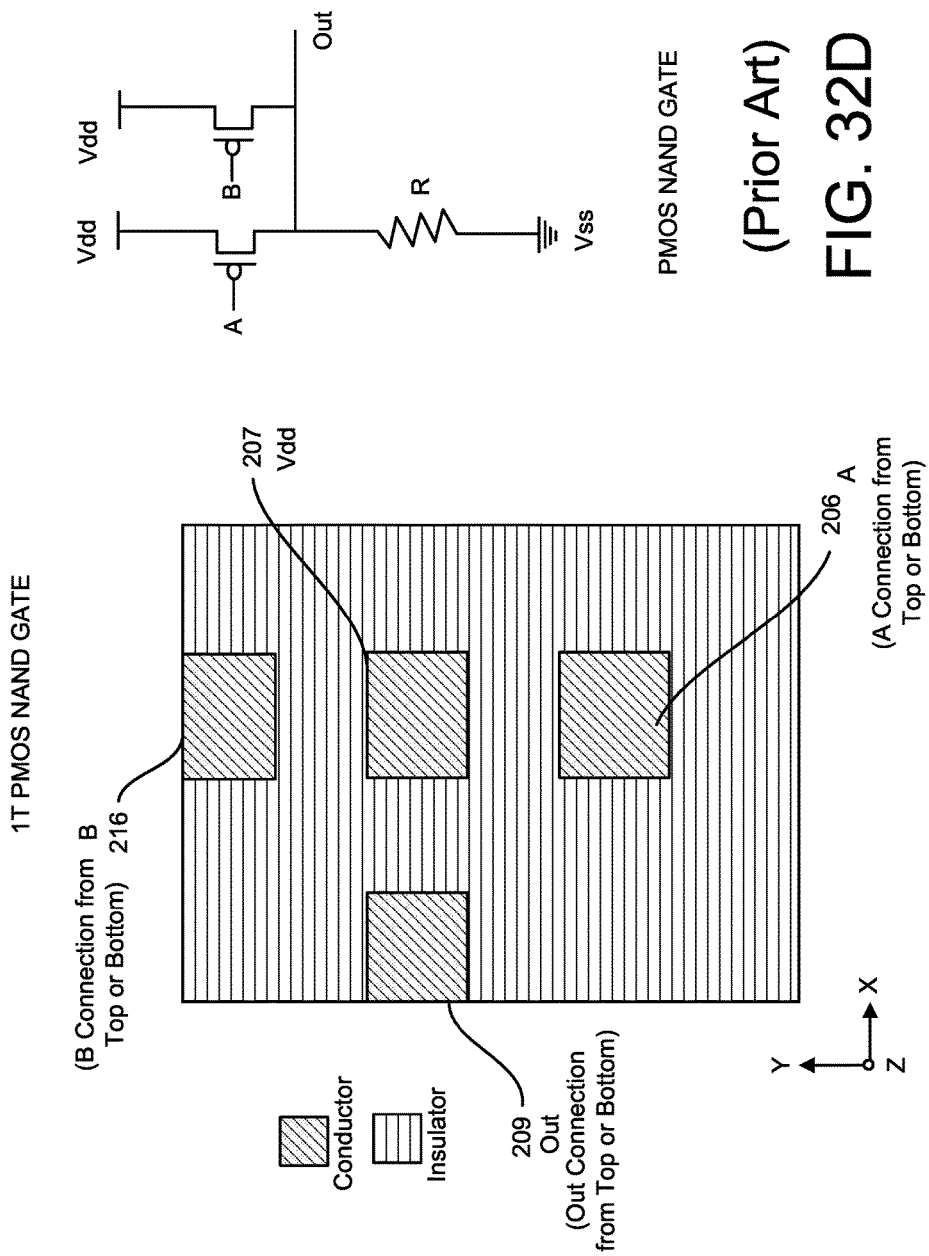

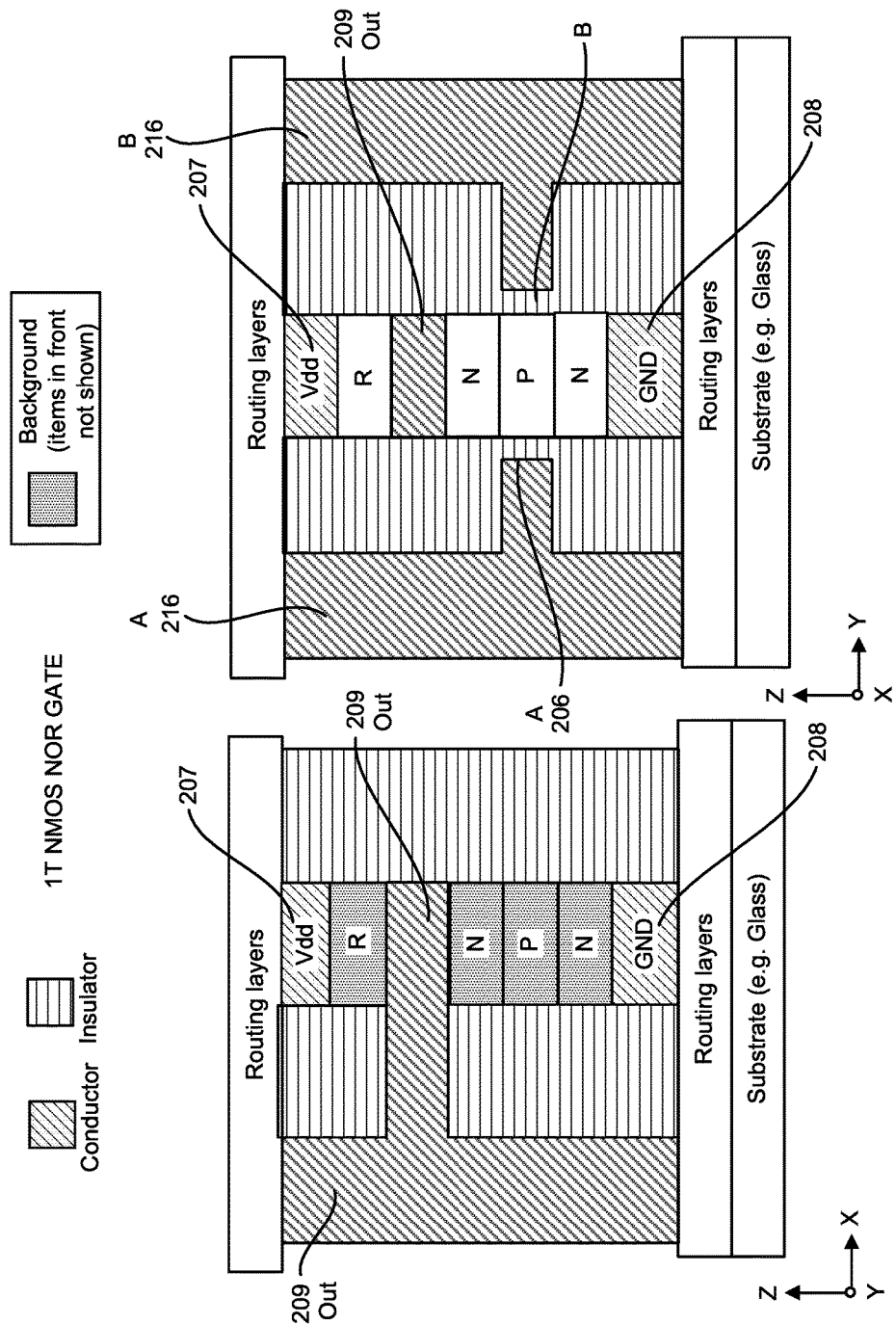

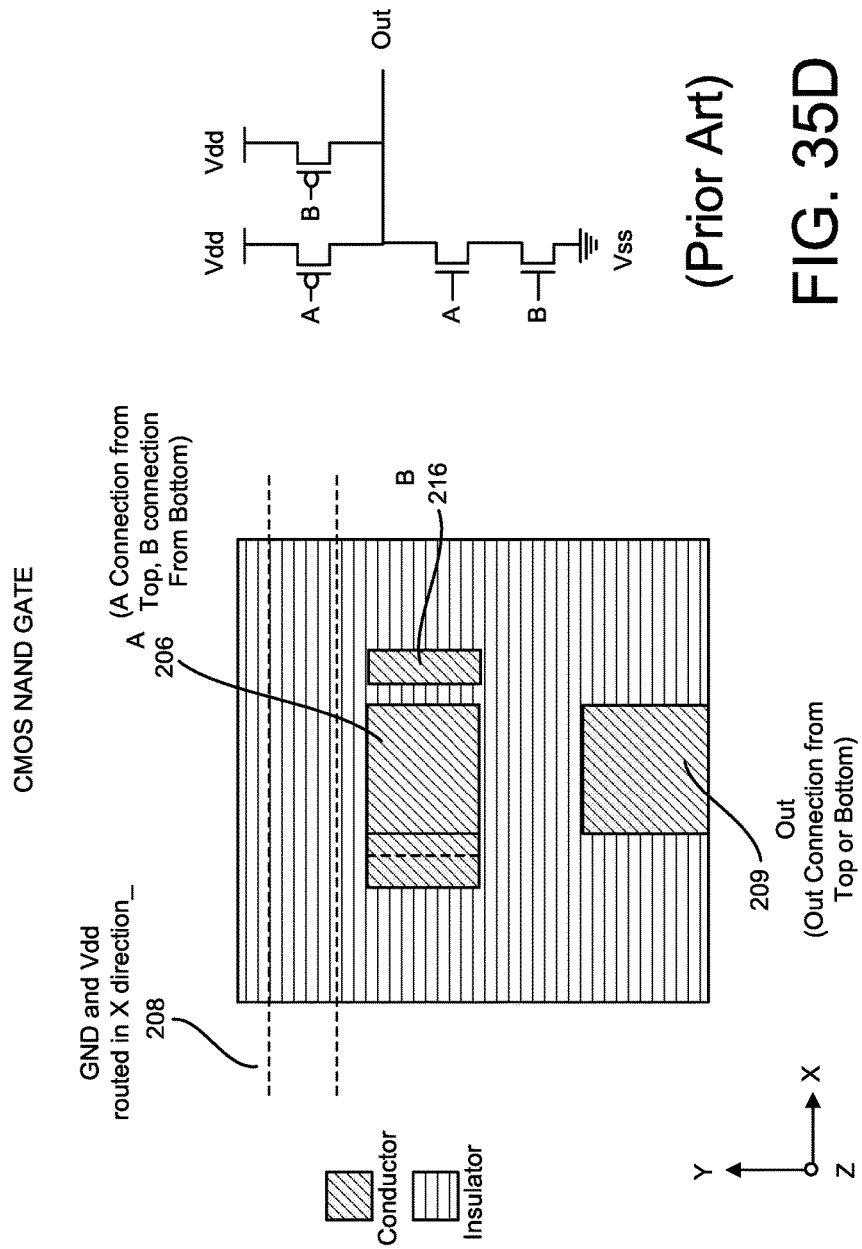

THREE DIMENSIONAL INTEGRATED CIRCUITS EMPLOYING THIN FILM TRANSISTORS

CROSS-REFERENCE TO RELATED APPLICATIONS

This application claims the benefit of U.S. Provisional Application No. 62/137,819 filed Mar. 25, 2015, and U.S. Provisional Application No. 62/252,522 filed Nov. 8, 2015. The specifications of each of these applications are incorporated herein by reference in their entirety.

FIELD OF APPLICATION/SUMMARY OF INVENTION

The present discloser is related to memory arrays and integrated circuits; more specifically, to 2D and 3D memory devices employing thin-film transistors (TFTs) in the control logic, selection elements, decoder logic, drivers, signal sense circuits and/or I/O circuits enabling low cost monolithic three-dimensional memory circuits and devices for stand-alone memory chips or on-chip embedded memory. The monolithic 3D stacking of memory layers and TFTs are employed to enable 3D memory and logic circuit devices with high density, low cost and high speed due to drastically reduced interconnect distances. Further, TFTs are implemented to enable high I/O connectivity to ICs of all types and may be fabricated on a multilayer substrate such as a printed circuit board to allow for design of I/O circuitry and related metal, optical or RF interconnects between ICs on a single component and potentially full integration of IC fabrication and interconnection of ICs onto a single substrate. Novel devices such as displays for cell phones, tablets and computers may be fabricated monolithically either above or below memory and logic circuitry on glass or flexible substrates with TFTs used for all the logic, drive and sense circuity for the display, memory and even processor. Built-In-Self-Test (BIST) circuitry and related LED/display indicators provide for lower cost testing and more utility to designers and users alike. Finally, wireless power enables total metal-interconnect-free chips thereby enabling lower cost assembly and wider flexibility to designers and users alike.

Numerous advantages are enabled by the various embodiments described herein over the prior art including but not limited to 1) Use of lower cost non-conductive (glass) substrates with existing TFT infrastructure for ultra-high production capacity, 2) Lower cost transistors compared to crystalline silicon and high temperature polysilicon, such as LTPS TFT, AOS TFT, and other low temperature processing TFTs, 3) Reduced die area (TFTs above or under memory cells; no need for significant area for peripheral circuits for decoding, sensing or driving the memory cells), 4) High speed I/O solutions enabled with TFTs—without die area penalty—including optical and wireless interconnects, 5) Low cost testing enabled by TFT-based BIST circuitry, 6) high density memory and logic employing vertical TFTs (VTFTs) and vertical logic gates, 7) Wireless power to chips, 8) Novel low cost module assembly and system designs including total wireless chips, 9) Novel products such as near total cell phone electronics on same substrate, and 10) Ultra high performance products enabled with emerging TFT materials, structures and process techniques.

REFERENCE NUMERALS AND OTHER DEFINITIONS

62—interconnects/vias or interconnect layer
63—routing layer (RL)
64—non-monocrystalline active device layer such as thin film transistor (TFT) layer
70—substrate (rigid or flexible; preferably non-conductive glass or plastic)
81—area available for thin film transistor
82—area for interconnect between conductive line and thin film transistor
84—X-axis conductive line
85—Y-axis conductive line
101—vertical channel NAND flash memory
104—peripheral circuits (of a prior art example)
110—bit lines (Y-axis conductive lines)
120—word lines (X-axis conductive lines)
122—X-axis conductive lines (WL, SSL, DSL, GSL, CSL)
124—Source Select Line (SSL)
126—Drain Select Line (DSL)
130—ground plane for heat source and heat sink
134—Source Select Transistor (SST)
136—Drain Select Transistor (DST)
140—vertical channels
150—memory cell region
182—area for interconnect between conductive line to memory cells and conductive line to TFT
200—Vertical thin film transistor (VTFT)
201—Ground electrode (GND) of vertical TFT (VTFT) of volumetric 1T1R memory array
202-T—Gate electrode (Word Line) of vertical TFT (VTFT) routed to top of volumetric 1T1R memory array
202-B—Gate electrode (Word Line) of vertical TFT (VTFT) routed to bottom of volumetric 1T1R memory array
203—Insulator layer (Dielectric) between Gate and Channel of VTFT
204—n-doped Semiconductor Material
205—p-doped Semiconductor Material
206—A (Input) Electrode to Logic Gate
207—Vdd Source Electrode
208—Vss Ground Electrode
209—Out (Output) Electrode from Logic Gate
209-T—Out (Output) Electrode from Vertical Logic Gate routed to top
209-B—Out (Output) Electrode from Vertical Logic Gate routed to bottom
210—bit lines (Y-axis conductive lines) of volumetric crosspoint memory array
210-S—bit lines (Y-axis conductive lines) of volumetric crosspoint memory array shared with memory cells on opposite sides of conductive line
211-S—bit lines (Y-axis conductive lines) of volumetric 1T1R memory array shared with memory cells on opposite sides of conductive line
220—word lines (Z-axis conductive lines) of volumetric crosspoint memory array
214—VLG (CMOS NAND type) Gross Cell Area
215—Minimum Discrete VLG Cell Area
216—B (Input) Electrode to Logic Gate
220-B—word lines routed to bottom of volumetric crosspoint array
220-T—word lines routed to top of volumetric crosspoint array
224—VLG (CMOS NOR type) Gross Cell Area
226—A Gate Electrode-Dielectric Contact area of VTFT
230—insulator material (e.g., SiO2) of volumetric crosspoint memory array
231—insulator material (e.g., SiO2) of volumetric 1T1R memory array
234—VLG (1T PMOS NAND type) Gross Cell Area
236—B Gate Electrode-Dielectric Contact area of VTFT 240—memory cell material of volumetric crosspoint memory array
241—Area indicating two neighboring VLGs sharing Vdd (207) and GND (208) electrodes
242—Area indicating two neighboring VLGs whereby Out (209) electrodes are routed to the top for one VLG and to the bottom for the other VLG in the same vertical area
244—VLG (1T NMOS NOR type) Gross Cell Area
246—VLG Gross Cell Area
248—VLG Net Cell Area
249—Semiconductor Stack Area—1F or 2F×3F (top or bottom view)
250—area above volumetric crosspoint memory array, where TFTs for connection to vertical (word) lines may be positioned
260—area below volumetric crosspoint memory array, where TFTs for connection to Y-axis (bit) lines may be positioned
270—area above volumetric 1T1R memory array, where TFTs for connection to vertical (word) lines may be positioned
272—area below volumetric 1T1R memory array, where TFTs for connection to Y-axis (bit) lines may be positioned
280—memory cell material of volumetric 1T1R memory array
290—memory cell area of volumetric crosspoint memory array
291—memory cell area of volumetric 1T1R memory array
300—memory layer
333X—I/O pads
400—volumetric memory array device—including memory cells, selection elements (diodes, transistors or ovonic switches), bit and word lines, and TFT-based decoder logic, sense circuits, and other controller logic
501—First electrode for routing
502—Second electrode for routing
601—First routing layer
602—Second routing layer
4090—Interconnect metal lines to I/O pads
AOS—amorphous oxide semiconductor
ASIC—Application Specific Integrated Circuit
ASSP—Application Specific Standard Product
BIST—Built in self-test
BL—Bit line
BL1, BL2 . . . BLn—Bit lines 1, 2 . . . n
CPU—Central Processing Unit
CSL—Common source line
DSL—Drain select line
DST—Drain select transistor
DSP—Digital Signal Processor
F—minimum feature size
Fm—minimum feature size of memory cells
FPGA—Field Programmable Gate Array
Ft—minimum feature size of TFTs, as determined by lithography means
GND—Ground
GSL—Ground select line
GPU—Graphical Processing Unit
L—number of layers of memory cells in a 3D volumetric memory array
LTPS—low temperature polysilicon
M—equal number of bit lines and number of word lines in a memory array of M×M memory cells
M1, M2 . . . Mn—Memory cell 1, 2 . . . n
MEMS—Microelectromechanical System
NS—NAND String
PLD—Programmable Logic Device
Rx—Number of repeated vertical memory stacks in the X-axis direction in a volumetric memory array (Rx=M/L or Rx=2M/L depending on array structure)
Ry—Number of repeated vertical memory stacks in the Y-axis direction in a volumetric memory array (Ry=M or Ry=M/2 depending on array structure)
RL—Routing lines layer
SSL—Source (or String) select line
SST—Source (or String) select transistor
TFT—thin film transistor
TG—Ground Select transistor
TS—Source (or String) Select transistor
V/G—Vdd and Ground on Opposite Ends of the Gate Stack
Vt—threshold voltage of a flash memory cell
VTFT—Vertical Thin Film Transistor
VLG—Vertical Logic Gate
VLG #1—First Vertical Logic Gate, with Out Electrode (209-B) routed to bottom
VLG #2—Second Vertical Logic Gate, with Out Electrode (209-T) routed to top
WL—Word line
WL1, WL2 . . . WLn—Word lines 1, 2 . . . n
X—reference number to pins of a common vertical logic gate

BACKGROUND 2D and 3D non-volatile memory devices is an area with much ongoing development in methods to improve performance, increase density and reduce die size (cost). As memory layers increase in 3D memory devices, there is an increasing need for die space to occupy the peripheral circuitry for control logic, decoder logic, drivers, sense circuitry, I/O circuits and other memory controller related logic. Hence, there is a need to reduce the die area required for such periphery circuitry in order to reduce the cost of memory devices. With regard to flash non-volatile memory devices (NAND and NOR), the required periphery circuity exceeds upwards of 30%. A significant amount of circuitry is devoted to counting the read and write cycles on a per bit or word basis for the purpose of improving reliability. Additional circuitry is required to provide all the required voltages to various word, bit and gate lines to correctly read and write the memory bits.

Flash memory is a type of non-volatile memory technology that can be electrically erased and reprogrammed. The original principal was based on modifying the stored charge in a floating gate of a transistor (invented by D. Kahng & S. M. Sze, of Bell Labs in 1967). There are two basic types of Flash Memory—NOR Flash Memory and NAND Flash Memory. NOR Flash was invented by Dr. Fujio Masuoka, Toshiba, in the early 1980's—commercialized by 1988—and NAND Flash was also invented by Dr. Fujio Masuoka, in the late 1980's—commercialized by 1995.

NAND flash uses floating-gate transistors for charge storage and is connected in a way that resembles a NAND gate; i.e., several transistors are connected in series, and only if all word lines are pulled high (above the transistors' threshold voltage, Vt) is the bit line pulled low. When the floating gate (charge storage layer) charge is modified, the threshold voltage of the cell (Vt-cell) is changed due to a resistance change; hence, information can be memorized in such fashion. To read, most of the word lines are pulled up above Vt of a programmed bit, while one of them is pulled up to just over the Vt of an erased bit. The series group will conduct (and pull the bit line low) if the selected bit has not been programmed. NAND flash uses tunnel injection for writing and tunnel release for erasing. Flash memory is limited in that although it can be read or programmed a byte or word at a time in a random access fashion, it must be erased a "block" at a time, thereby adding to overhead circuitry and latency. Flash memory is also limited in endurance, with a finite number of erase-write cycles, normally less than 100,000 erase-write cycles. This also adds to overhead in terms of error correction circuitry and redundancy.

FIG. 1 shows an equivalent circuit of a NAND type flash memory device according to the prior art [FIG. 1 of U.S. Pat. No. 7,863,671, assignee: Hynix Semiconductor]. A memory cell array includes a plurality of cell strings connected to associated bit lines, BL1, BL2, . . . Each unit cell string includes a source select transistor (SST), memory cells M1-M32, and a drain select transistor (DST). Each drain select transistor (DST) is connected to the one of bit lines, BLe and BLo. Each source select transistor (SST) is connected to a common source line (CSL). The memory cells M1-M32 are serially coupled between the source select transistor (SST) and the drain select transistor (DST). The number of memory cells included in one cell string is varied depending on the storage capacity of memory device used. The gate of the source select transistor (SST) at each cell string is commonly connected to a source select line (SSL). The source select line (SSL) transmits a string select signal supplied from a row decoder. A drain select line (DSL) transmits a drain select signal supplied from the row decoder. The drain select line (DSL) is connected to the gate of the drain select transistor (DST). The control gates of the memory cells M1-M32 are coupled to word lines WL1-WL32, respectively.

A memory cell includes a tunnel insulating layer, a floating gate, a dielectric layer, and a control gate. In the source select transistor (SST) and the drain select transistor (DST), a first polysilicon layer for the floating gate is in contact with a second polysilicon layer for the control gate via a contact hole passing through the integrate dielectric layer. When the contact resistance between the first polysilicon layer for floating gate and the second polysilicon layer for the control gate abnormally increases, signal transmission is delayed and chip failure occurs, thus causing a significant deterioration in fabrication efficiency.

The increased contact resistance is due to a polymer or a parasitic oxide layer formed while etching of the dielectric layer and remaining due to incomplete removal by an etchant, prior to deposition of the second polysilicon layer. In addition, because the contact between the first polysilicon layer and the second polysilicon layer inherently has a high resistance, a delay in signal transmission of the SSL and DSL and an occurrence of chip failure result.

FIG. 2 and FIG. 3 are prior art comparisons of a NAND type flash memory and NOR type flash memory. The cells in a NOR type memory are connected in parallel as opposed to in series (NAND), and hence occupy more die area ($10F^2$) compared to NAND memory cells ($5F^2$). NOR flash requires higher current than NAND, is faster than NAND and exhibits much better endurance compared to NAND. NAND flash on the other hand provides higher density due to the smaller cell, lower power consumption, and low cost compared to NOR.

The charge storage layer in flash memory may be either a floating gate made of a conductive material or a charge trap made of a non-conductive material that still may hold an embedded charge. FIG. 4 is a prior art drawing comparing a charge trap type flash memory (SONOS) to the originally developed floating gate type of flash memory.

The fundamental circuit in FIG. 1 is representative of either 2D or 3D constructions. A memory device is considered 2D when only one layer of memory cells are present; if more than one layer of memory cells are present in the vertical (z-axis) direction (perpendicular to the normal plane of the substrate), then the device is considered 3D. FIG. 5 [FIG. 2B of U.S. Pat. No. 8,932,955, Assignee: SanDisk Technologies Inc.] is one representation of a 2D NAND construction; FIG. 6-FIG. 8 are prior art representations of 3D NAND constructions. FIG. 6 is a summary chart shown by Sung Wook Park of SK Hynix comparing the four 3D NAND structures from the major memory manufacturers: Toshiba (Japan), Samsung (Korea), SK Hynix (Korea), and Micron (USA). FIG. 7 is an equivalent circuit of Bit-Cost Scalable (BiCS) Technology for 3D NAND Flash Memory promoted by Toshiba. FIG. 8 shows a construction of the Terabit Cell Array Transistor (TCAT) Technology for 3D NAND Flash Memory promoted by Samsung. There are a host of many different constructions for 3D NAND (and NOR) flash memory described in detail in the many prior art patent references.

3D flash memory constructions are such that control logic, decoder logic, sense circuits, I/O circuits and driver circuits necessarily are located as peripheral circuits, thereby increasing the required die area for a given memory design. This necessity for locating the circuits on the periphery of the memory array are illustrated in the prior art, FIG. 9-12. FIG. 9 [FIG. 1 of U.S. Pat. No. 6,906,940, Assignee: Macronix International] illustrates the large area for contact holes required for the independent word lines and bit lines for a prior art 3D memory structure. Peripheral circuits 104 are connected to the word lines and bit lines from layers 100a-100n through corresponding contact holes 102a-102n. For example, lines 100a-100n may represent bit lines from the first, second, third and nth layer of the memory structure, respectively. Since lines 100a-100n of the different layers are independent, then respective contact holes 102a-102n cannot be common. It should be appreciated that the same would be applicable if lines 100a-100n were word lines. Thus, the multitude of contact holes requires a large area and leads to reduced array efficiency. As the number of memory layers increase, the contact area must expand outwards, thereby offsetting density gains achieved through the three dimensional structure. FIG. 10 [FIG. 5 of U.S. Pat. No. 6,906,940, Assignee: Macronix International] is a prior art method to improve the memory capacity by enabling a decoding scheme in which word line and bit line concepts are extended to orthogonal planes associated with common word and bit lines resulting in a dramatic reduction in the number of contact holes. There's no teaching however related to the peripheral circuitry which remains outside the area of the matrix of memory cells and still occupies increasing space as the number of memory layers increases. FIG. 11 [FIG. 5 of U.S. Pat. No. 8,154,128, Assignee: Macronix International] illustrates yet another example of a prior art design showing a periphery region outside the area of the memory array region required for interconnect structures and—although not shown—decoder logic, drivers and other controller related circuitry. FIG. 12 [FIG. 19 of U.S. Pat. No. 8,437,192, Assignee: Macronix International] further indicates the routing of decoder logic to the area outside of the memory array region.

The area for such periphery circuitry can occupy a significant area of the die. For example, Samsung's 128Gb 3b/cell V-NAND Flash was reported in March 2015 to have a die area of 69.9 square millimeters (6.32 mm×10.9 mm) for a 32-layer design. The periphery circuitry area was estimated at 19 square millimeters which is about 30% of the total die area. Source: Andrew J. Walker http://www.3dincites.com/2015/03/samsungs-v-nand-flash-2015-isscc-way-left/

FIG. 14a and FIG. 14b are electrical schematic diagrams (FIG. 1B and FIG. 25, U.S. Pat. No. 8,824,209, assignee: Samsung) of a vertical NAND device according to a prior art. FIG. 15 [FIG. 4 of U.S. Pat. No. 8,437,192, Assignee: Macronix International] is an illustration of the construction of x-axis, y-axis and z-axis conductive lines in a 3D memory device according to a prior art and represents one of many constructions of 3D NAND flash memory devices.

BRIEF DESCRIPTION OF THE DRAWINGS

FIG. 6 is a summary comparison table of 3D or vertical constructed NAND flash memory proposed by the world's leading memory manufacturers according to the prior art.

FIG. 13 is an illustration describing common terms used related to NAND flash memory according to the prior art.

FIG. 20b is a cross section side view (right) of a 3D volumetric crosspoint memory array.

FIG. 26c—A top view illustration of a VLG (CMOS NAND Gate type).

FIG. 26d—A schematic of a CMOS NAND Gate according to the prior art.

FIG. 26e—A top view illustration of a VLG cell (CMOS NAND Gate type, 24F$^2$ gross area, 16F$^2$ net area).

FIG. 27c—A top view illustration of a VLG (CMOS NAND Gate type).

FIG. 27d—A schematic of a CMOS NAND Gate according to the prior art.

FIG. 27e and FIG. 27f—A top view illustration of a VLG cell (CMOS NAND Gate type, 18F$^2$ gross area, approximately 12F$^2$ net area).

FIG. 27g—A top view illustration of a VLG layer (CMOS NAND Gate type, approximately 12F$^2$ net area per cell).

FIG. 27h-1—Top view illustration of a VLG layer of approximately 12F$^2$ net area per cell.

FIG. 27h-2—Side cross section illustration of a VLG routing of Vdd, Out and B.

FIG. 28c—A top view illustration of a VLG (CMOS NOR Gate type).

FIG. 28d—A schematic of a prior art CMOS NOR Gate.

FIG. 28e—A top view illustration of a VLG cell (CMOS NOR Gate type, 24F$^2$ gross area, approximately 18F$^2$ net area).

FIG. 30c(t) and FIG. 30c(b)—Top(t) and Bottom(b) view illustrations of a VLG (CMOS NAND Gate type).

FIG. 30d—A schematic of a CMOS NAND Gate according to the prior art.

FIG. 30e—A top view illustration of a VLG layer (CMOS NAND Gate type, 16F$^2$ gross area, approximately 13F$^2$ net area).

FIG. 31c(t) and FIG. 31c(b)—Top(t) and Bottom(b) view illustrations of a VLG (CMOS NAND Gate type).

FIG. 31d—A schematic of a CMOS NAND Gate according to the prior art.

FIG. 31e—A top view illustration of a VLG layer (CMOS NAND Gate type, 16F$^2$ gross area, approximately 14F$^2$ net area).

FIG. 32c—A top view illustration of a VLG (1T PMOS NAND Gate type).

FIG. 32d—A schematic of a PMOS NAND Gate according to the prior art.

FIG. 32e—A top view illustration of a VLG cell (1T PMOS NAND Gate type, 24F$^2$ gross area, 16F$^2$ net area).

FIG. 33a and FIG. 33b—Side cross section illustrations of a VLG (1T NMOS NOR Gate type).

FIG. 33c—A top view illustration of a VLG (1T NMOS NOR Gate type).

FIG. 33d—A schematic of a prior art NMOS NOR Gate.

FIG. 33e—A top view illustration of a VLG cell (1T NMOS NOR Gate type, 24F$^2$ gross area, 16F$^2$ net area).

FIG. 34b—A top view illustration of a VLG layer (either CMOS or PMOS NAND Gate type or CMOS or NMOS NOR type), 16F$^2$ net area per cell with intersecting 24F$^2$ gross cell area.

FIG. 34c—A top view illustration of a VLG layer (either CMOS or PMOS NAND Gate type or CMOS or NMOS NOR type), 16F$^2$ net area per cell with intersecting 24F$^2$ gross cell area.

FIG. 35c—A top view illustration of a VLG (CMOS NAND Gate type).

FIG. 35d—A schematic of a prior art CMOS NAND Gate.

FIG. 35e—A top view illustration of a VLG cell (CMOS NAND Gate type) 8F$^2$ gross area.

DETAILED DESCRIPTION

Apparatus and associated methods relate to utilization of thin film transistors (TFTs) to electrically decouple memory arrays and logic circuitry from an insulator (dielectric) substrate and enable fabrication of TFTs above and under the memory cells of memory arrays thereby saving precious die space. Further, the larger the matrix of a memory array driven, the fewer number of transistors are needed thereby allowing one to design the decoder, sense and driver transistors with minimum features sizes much larger than the minimum feature size of the memory cells. For NAND and NOR flash memory devices, the conventional memory cell has the source or drain that is in the doped crystalline silicon substrate. This connection at the silicon substrate prevents this area of the substrate from being utilized for any other circuitry; in particular the periphery circuitry required to operate the memory cannot be placed under the memory cells. Some non-conventional designs of NAND devices such as U.S. Pat. No. 7,777,268 (Walker), teach that you do not need a connection of the memory cell directly to the silicon substrate. Walker however, does not teach the use of a non-semiconducting insulator (dielectric) substrate (e.g., glass or plastic) or the use of thin film transistors for the decoder logic, driver transistors, sense circuitry and other peripheral circuitry. Some embodiments utilize thin film transistors for both the memory cells (in the case of flash memory) and the associated circuitry for operation of the memory device. Furthermore, the TFTs for such circuitry for operation of the memory (decoder logic, sense circuitry, driver transistors, I/O circuitry and other controller logic) are substantially positioned above or below the memory cells thereby nearly eliminating the die area required on the periphery of the memory cells for such circuitry and thereby increase the density of the memory chip. As noted in U.S. patent application Ser. No. 14/580,240, filed Dec. 23, 2014, the minimum feature size of the TFTs for decoder logic, sense circuitry, driver transistors and other circuitry for operation of the memory device, may be much larger than the minimum feature size of the memory cell design.

Figure 17:
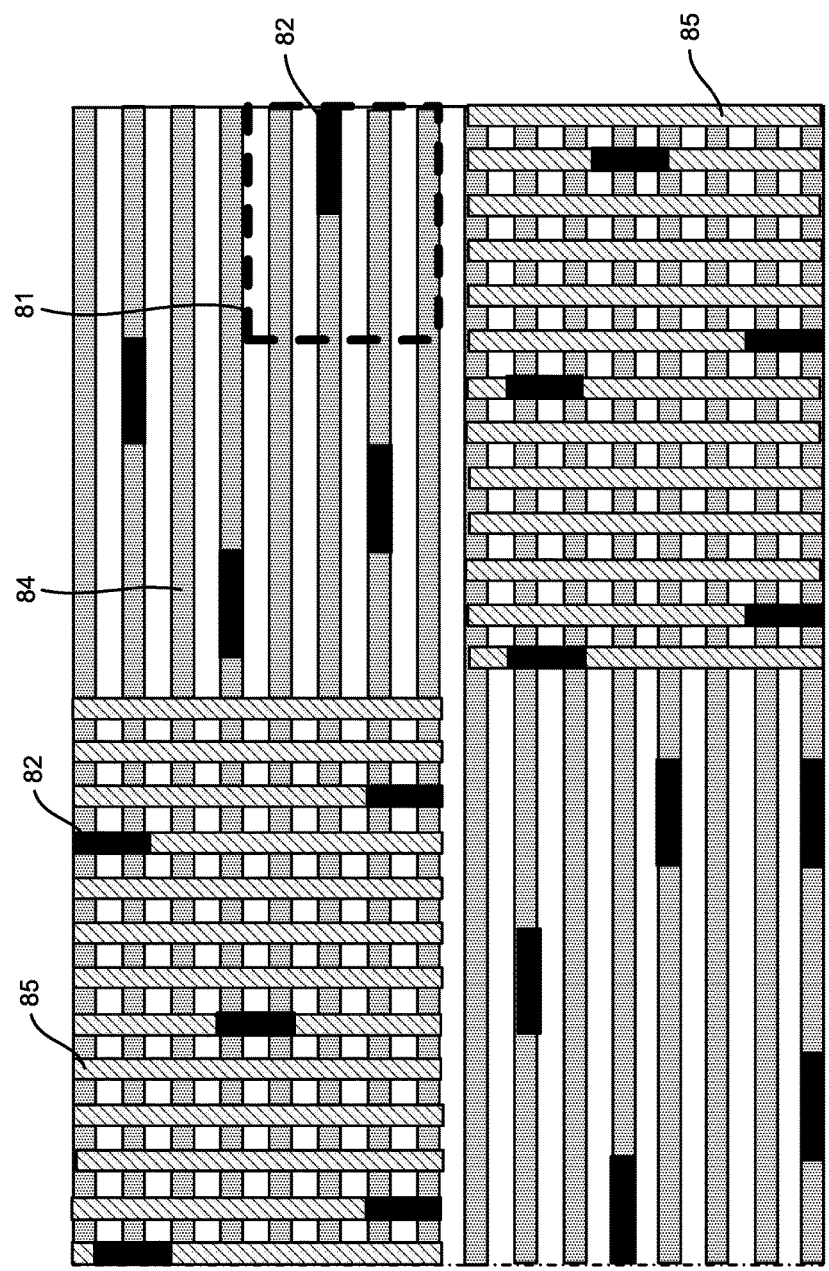
FIG. 17 is a top view illustration showing the interconnects of Y-axis and X-axis conductive lines at various intermediate points to allow for simple connection to an array of large transistors positioned above or below the memory cells.
Figure 18:
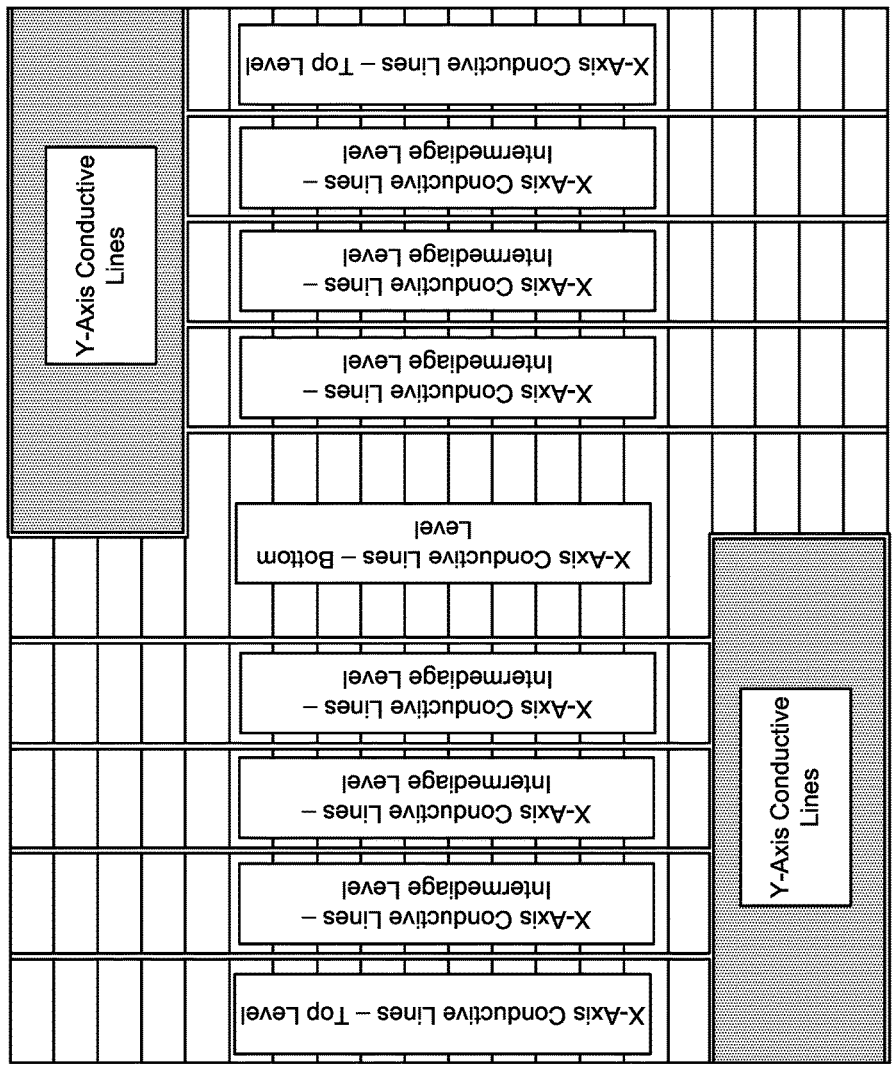
FIG. 18 is an illustration of an example of a design of the interconnect areas of TFTs for X-axis and Y-axis conductive lines of a 3D memory device.
Figure 19:
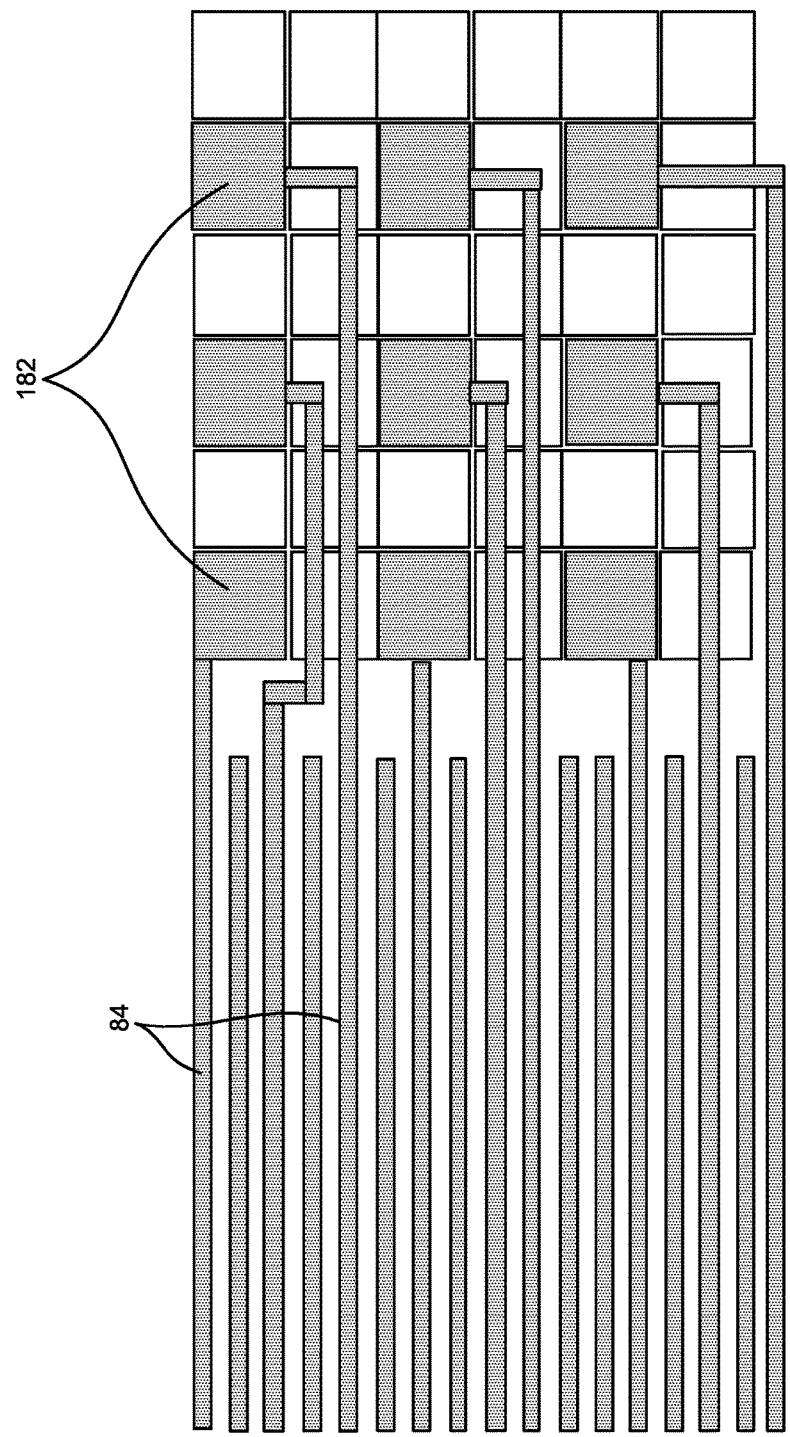
FIG. 19 is an illustration showing routing and interconnect area for conductive lines to the memory cells and conductive lines to the TFTs.

FIG. 17 is a top view illustration showing an example of the interconnects of Y-axis and X-axis conductive lines at various intermediate points to allow for connection to an array of large transistors positioned above or below the memory cells. FIG. 18 is an illustration of an example of a design of the interconnect areas of TFTs for X-axis and Y-axis conductive lines of a 3D memory device. In such embodiments indicated in FIG. 17 and FIG. 18, the conductive lines are routed either above or below the memory cells for connection to the TFTs. This routing and the process to create the area 82 for interconnect between conductive lines and TFTs represent additional photolithography steps at the small, more costly, minimum feature size technology of the memory layers. Alternatively—in particular in the case of 3D memories made by stacking layers of planar memories such as in planar crosspoint memories or the 3D memory structure described in the Third Embodiment below (Walker)—the respective x-axis and y-axis conductive lines may be routed such that the additional expensive photolithography steps noted above may be eliminated. Refer to FIG. 19 which is an illustration showing routing and interconnect area for conductive lines to the memory cells and conductive lines to the TFTs. The area for interconnect 182 of the conductive lines (either x-axis bit lines or y-axis word lines) to the respective conductive lines routed to the TFTs is of such size that allows routing and interconnect to the TFTs at above or below the memory cells to be fabricated at the same minimum feature size that the TFTs are designed at and hence, such routing may be done at lower cost than routing much smaller minimum feature size conductive lines and creating areas for interconnect 82 to the TFTs substantially positioned at above or below the memory cells.

Figure 34A:
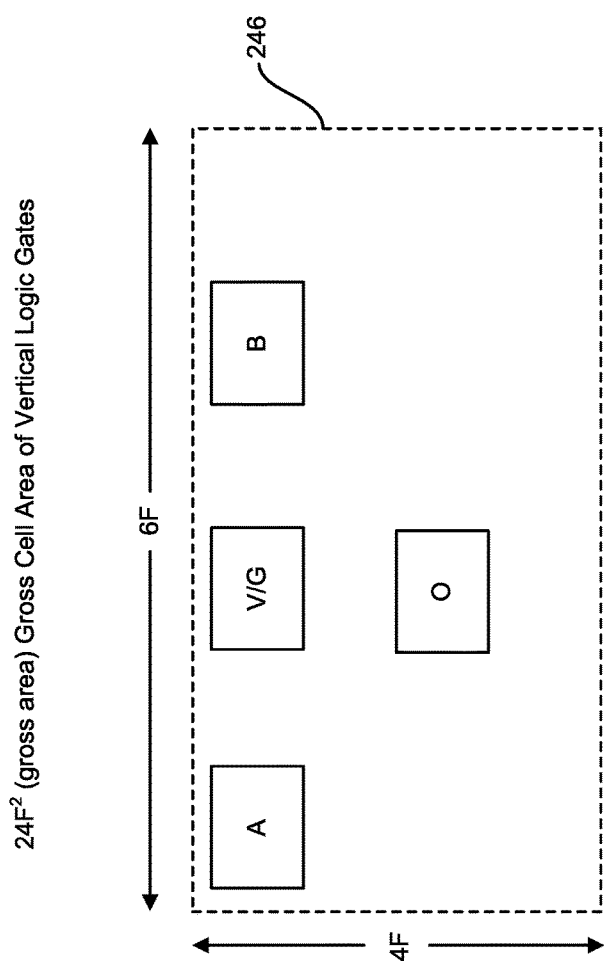
FIG. 34a—A top view illustration of the Gross area of a VLG cell (CMOS or PMOS NAND type or CMOS or NMOS NOR type).
Figure 34B:
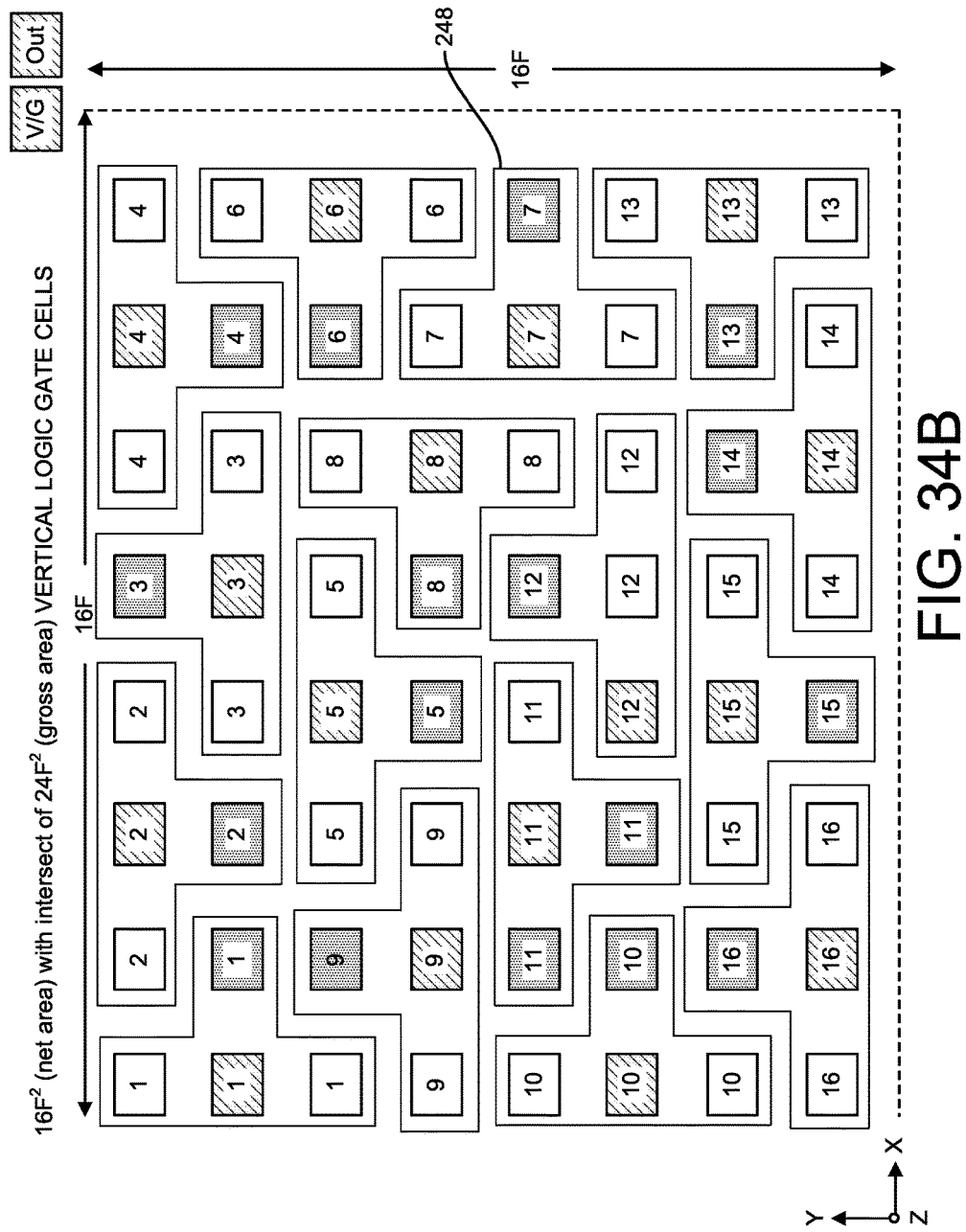
Figure 34C:
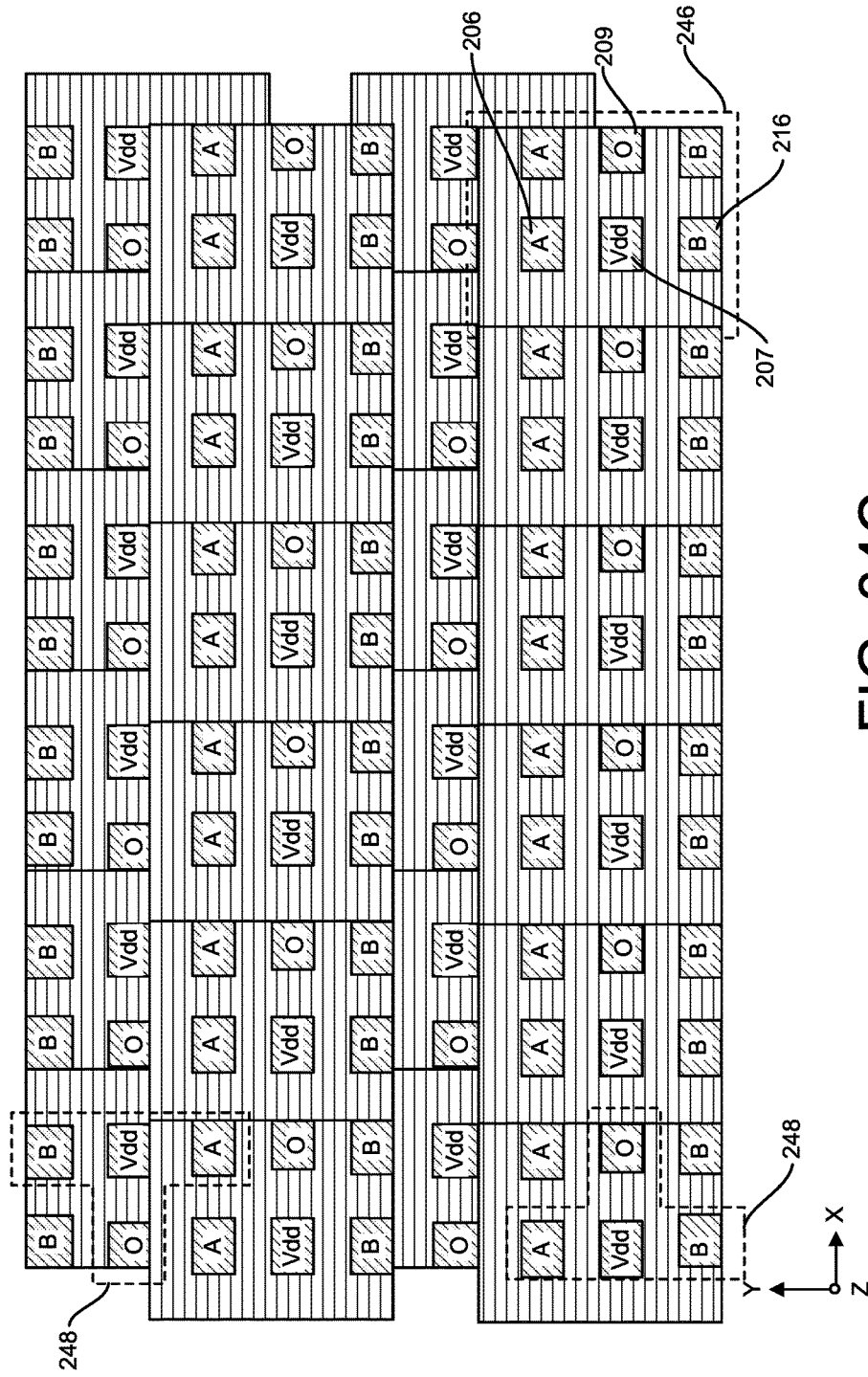
Figure 35A:
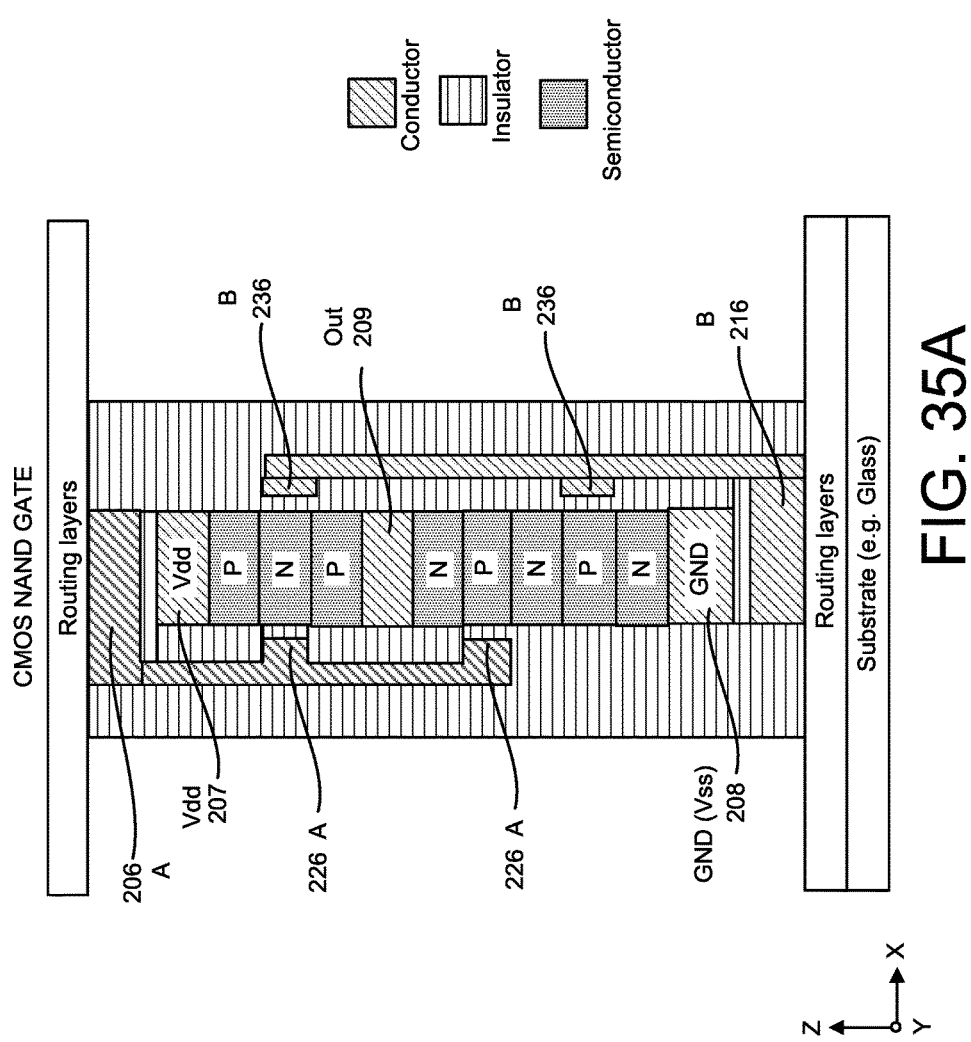
FIG. 35a and FIG. 35b—Side cross section illustrations of a VLG (CMOS NAND Gate type).
Figure 35B:
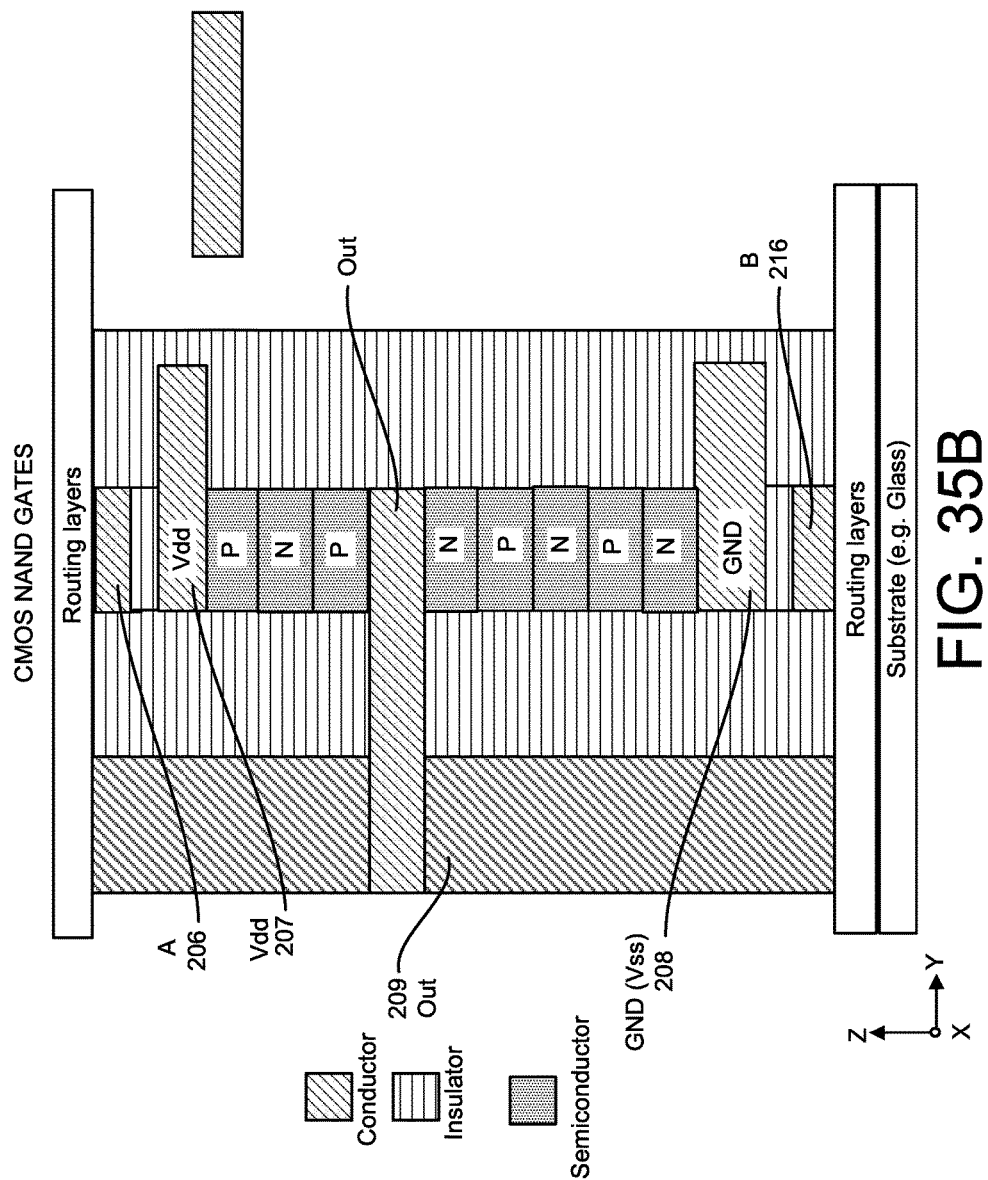
Figure 35E:
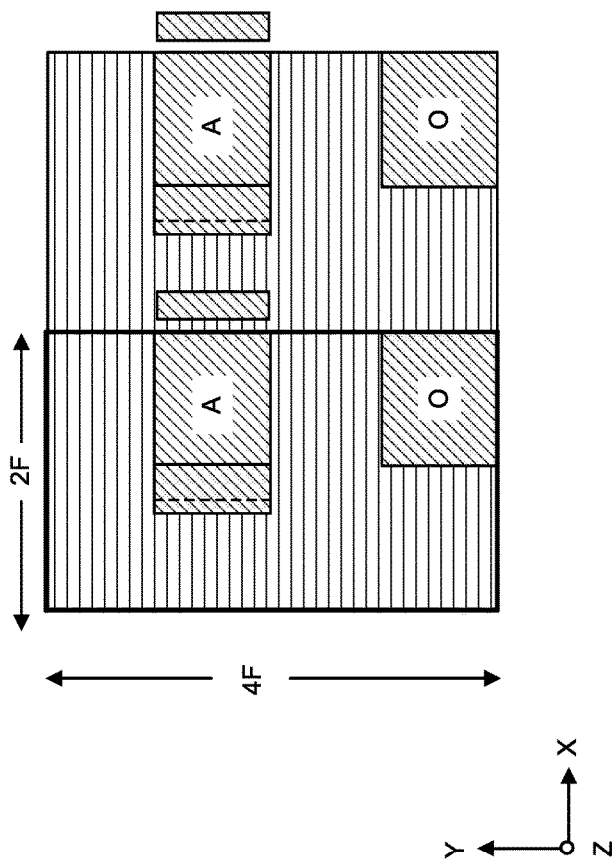
Figure 36:
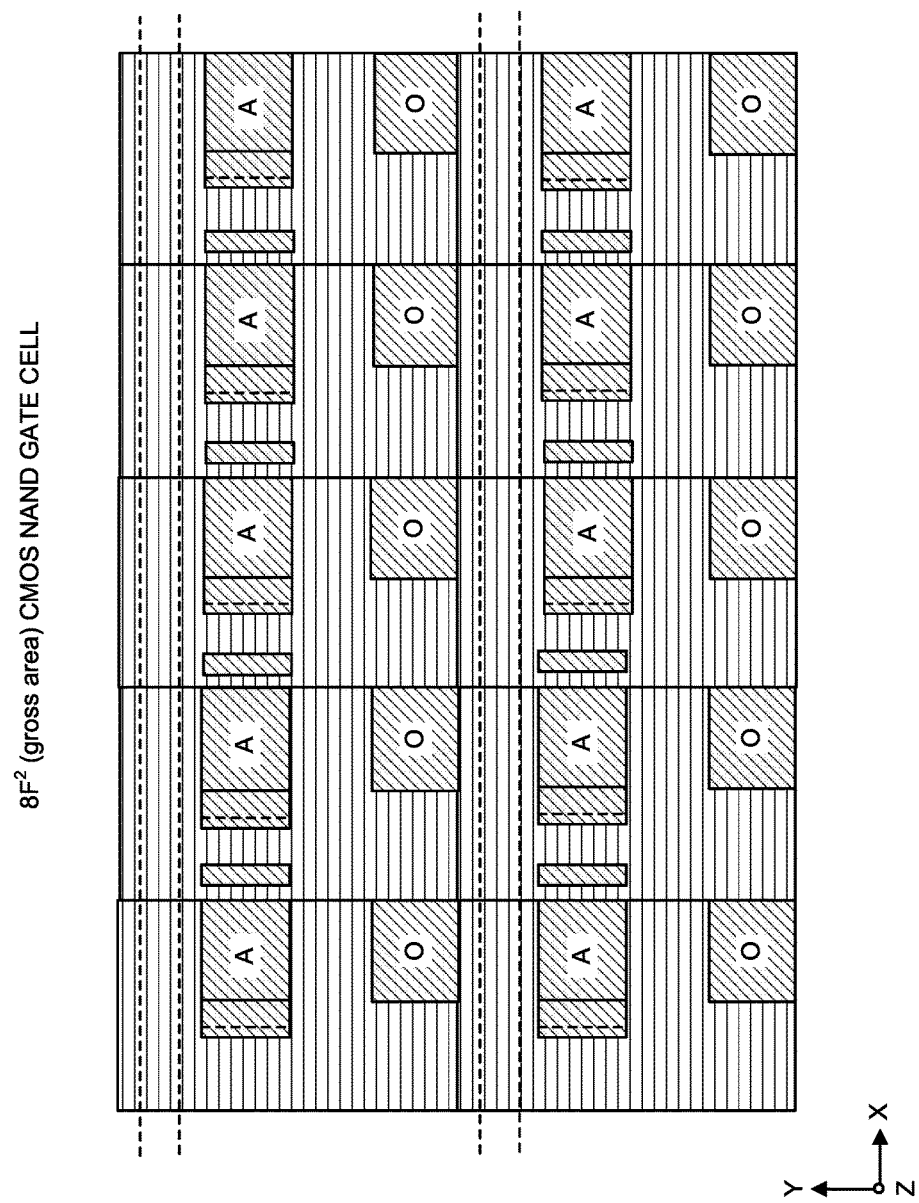
FIG. 36—A top view illustration of a VLG layer (either CMOS or PMOS NAND Gate type or CMOS or NMOS NOR type), 8F$^2$ gross cell area.
Figure 37A:
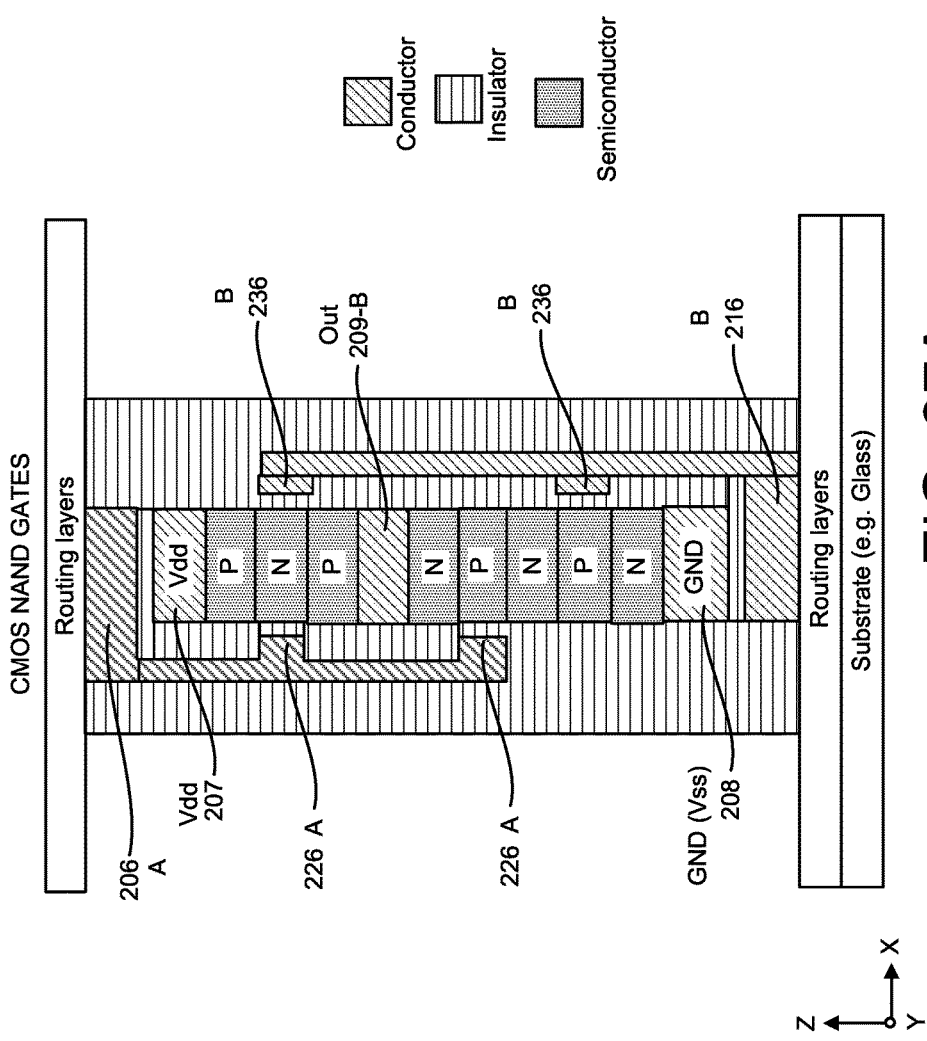
Figure 37B:
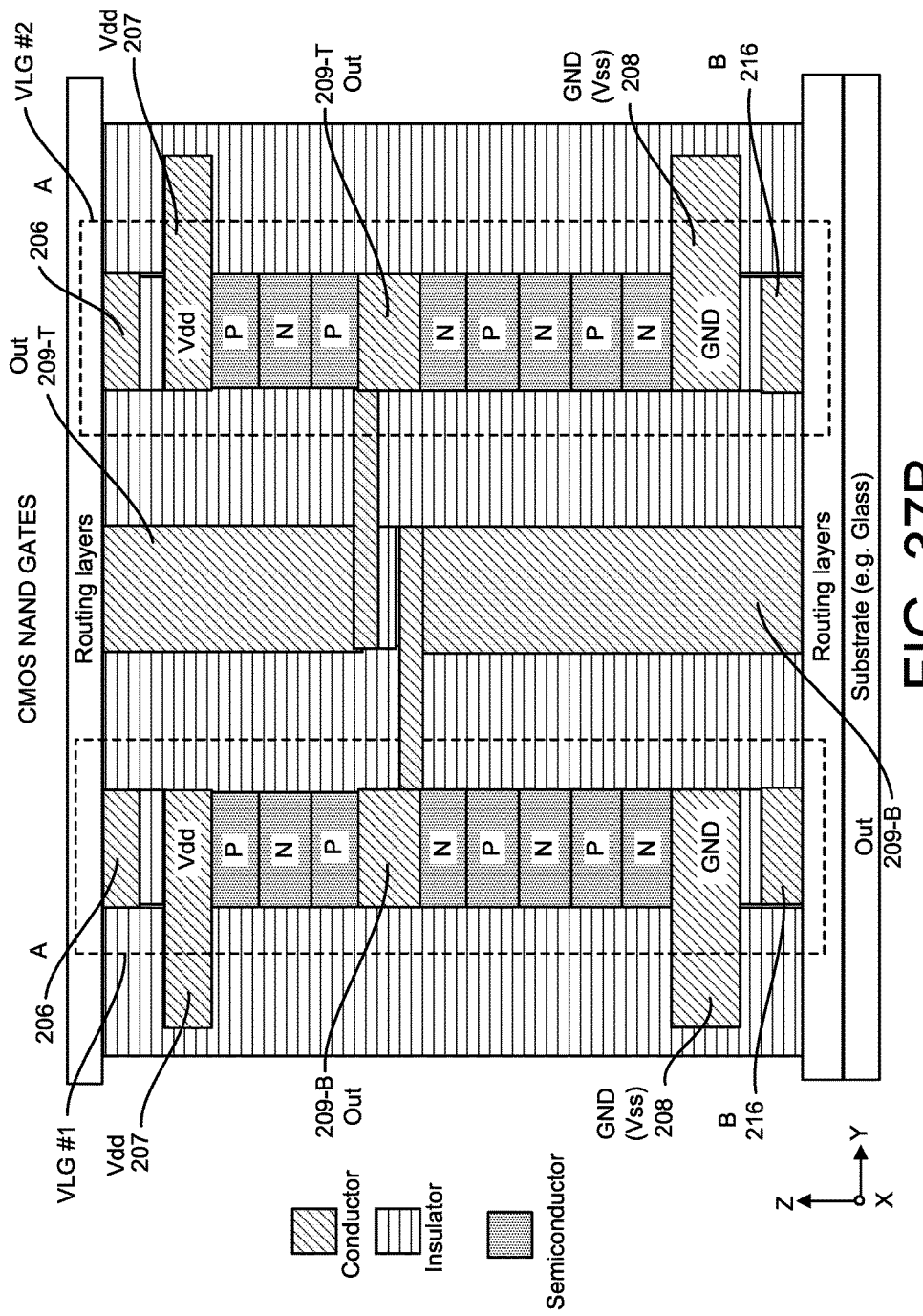
Figures 37C, 37D:
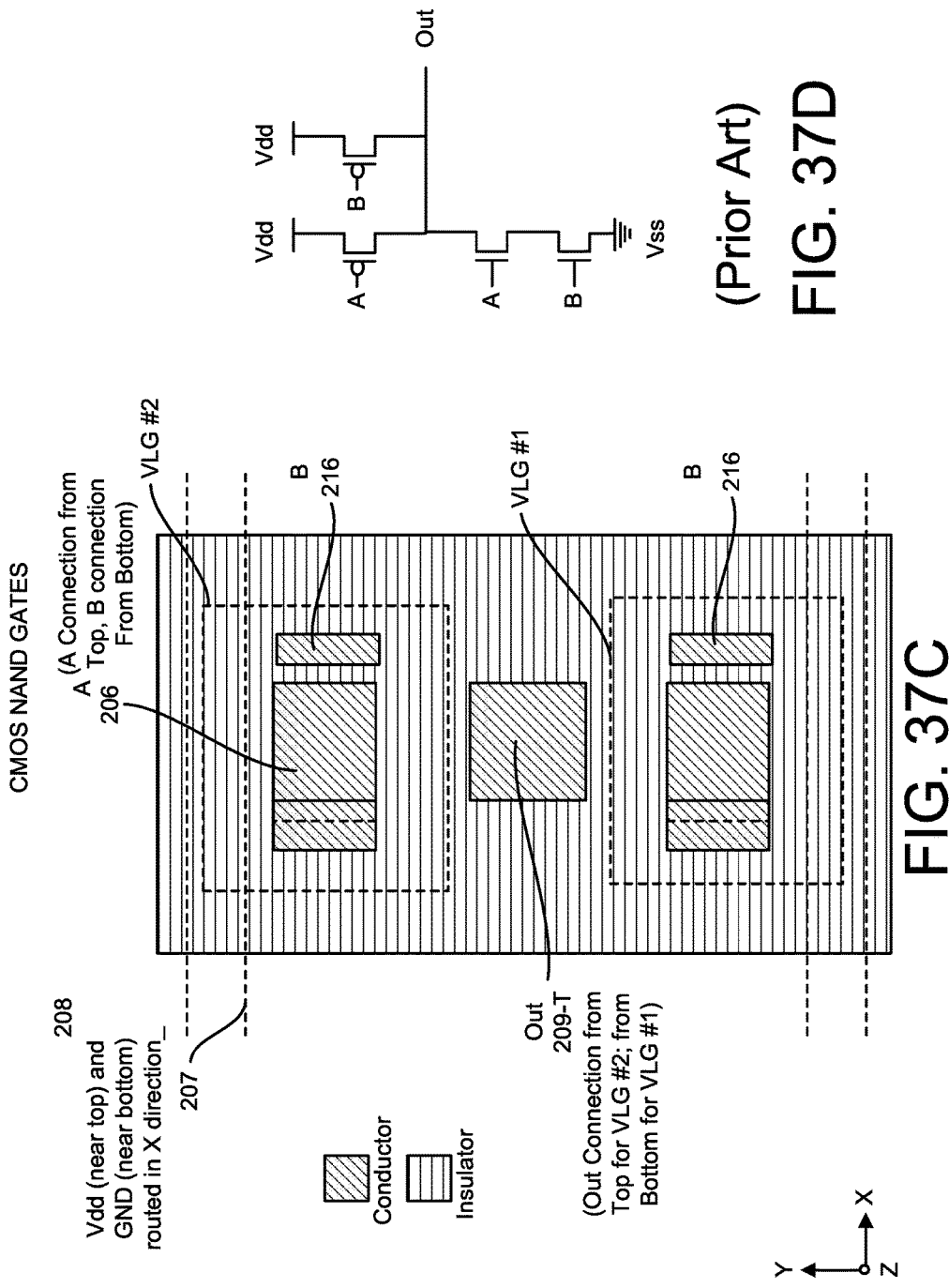
Figure 37E:
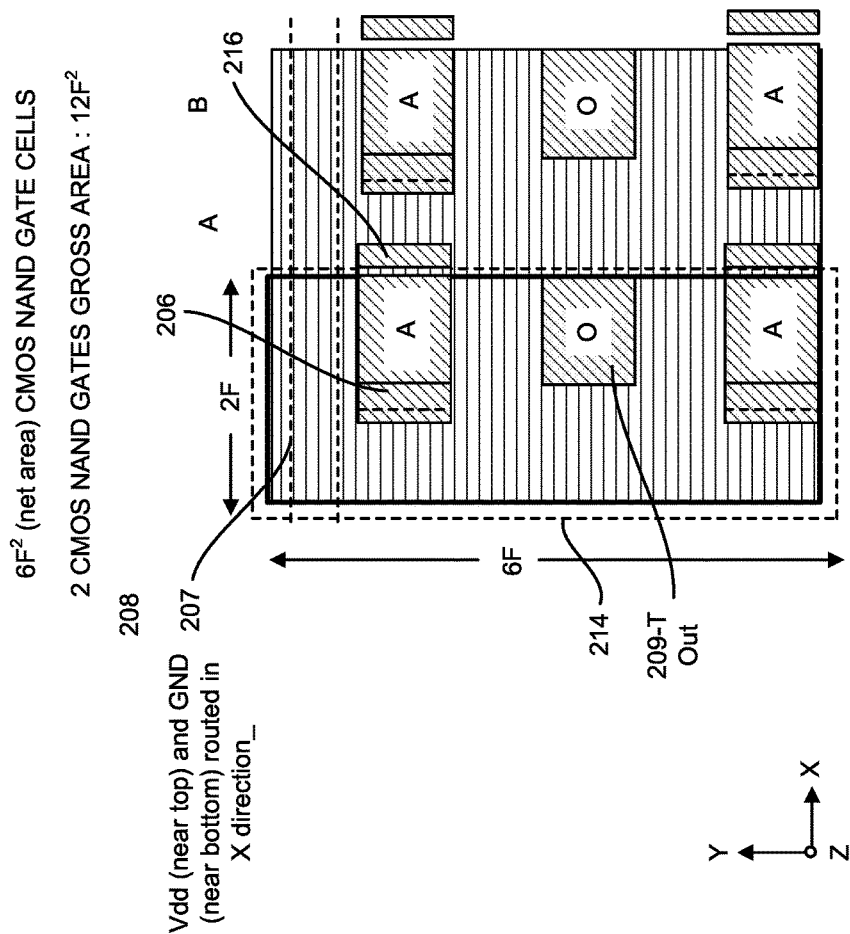
Figure 38:
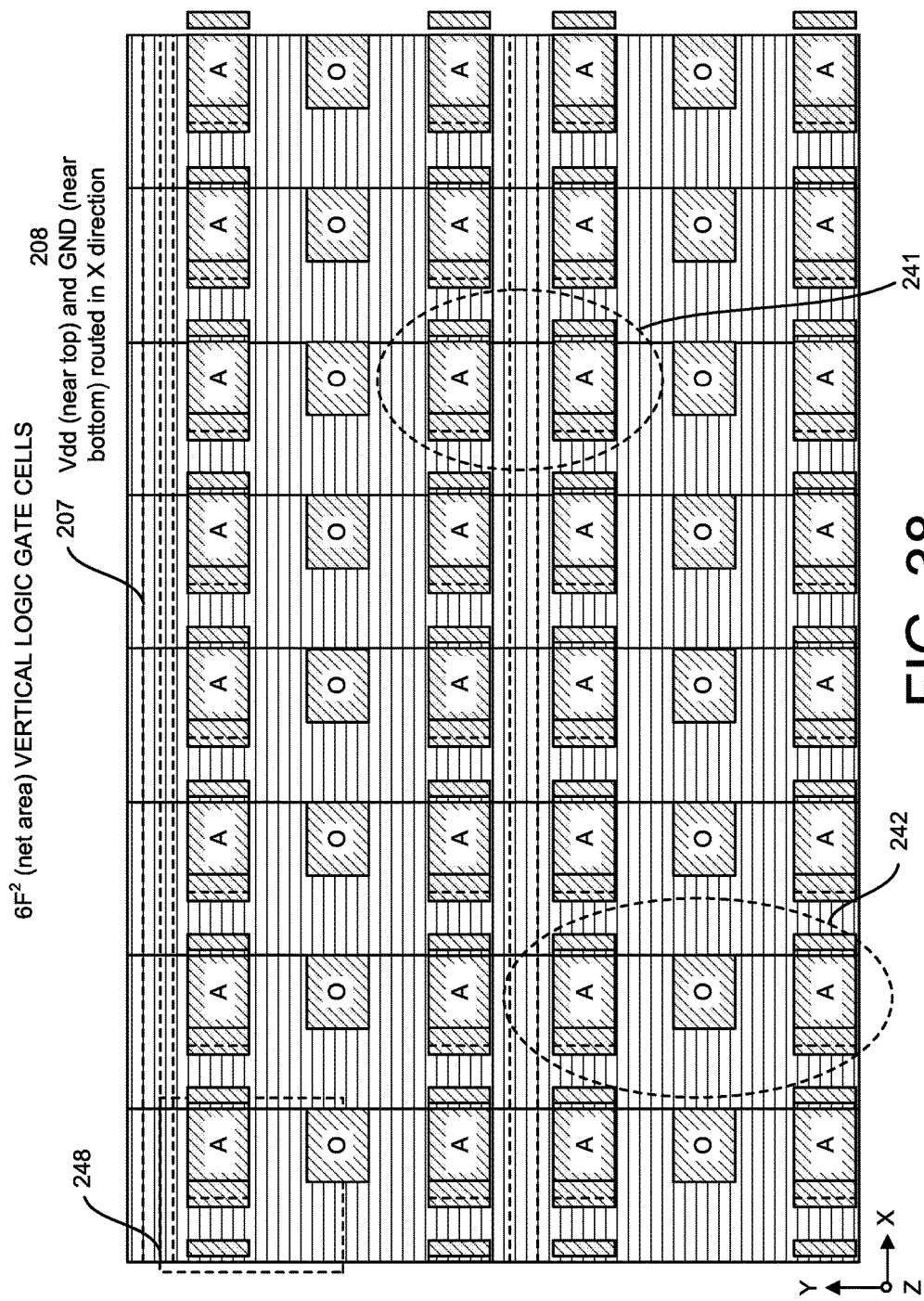

The embodiments described herein also may incorporate vertical thin film transistors (VTFTs) and vertical logic gates (VLGs) as described in U.S. Provisional Application No. 62/252,522 filed Nov. 8, 2015 which is hereby incorporated in its entirety by reference. As such the term minimum feature size used within this specification shall apply only to those features which are determined by lithography means and not be deposition means as discussed in more detail in U.S. Provisional Application No. 62/252,522. Enhanced designs of vertical CMOS NAND logic gates are described in FIG. 26a to FIG. 26e, FIG. 27a to FIG. 27g, FIG. 30a to FIG. 30e, FIG. 31a to FIG. 31e, and FIG. 35a to FIG. 35e, all designs of which employ a shared semiconductor channel layer in the PMOS VTFT connected to both the A and B inputs. The structure shown in FIG. 27a to FIG. 27g shows the contact area of the electrode-dielectric for A (226) and B (236) inputs on opposite sides of the semiconductor channel, whereby FIG. 30a to FIG. 30e and FIG. 31a to FIG. 31e show the contact area of the electrode-dielectric for A (226) and B (236) inputs on the same side of the semiconductor channel; which occupies an area measuring either 1F×2F (FIG. 30c(t) and FIG. 30c(b)) or 1F×3F (FIG. 31c(t) and FIG. 31c(b)). These structures sharing a semiconductor channel layer may be referred to as "3T CMOS NAND vertical logic gates" ("T" referring to transistor) whereby the one PMOS transistor is actually one that has a shared semiconductor channel layer for both the contact areas for A (226) and B (236) input gate electrodes. FIG. 32a to FIG. 32e shows a modified NAND VLG employing a resistor (R) in lieu of NMOS transistors, and still employing the shared semiconductor layer on the PMOS transistor. This structure in FIG. 32a to FIG. 32e may be referred to as a "1T PMOS NAND vertical logic gate". FIG. 28a to FIG. 28f and FIG. 33a to FIG. 33e show applications of a similar approach of a shared semiconductor channel layer—in this case in the NMOS VTFT—of a vertical CMOS NOR logic gate design and an NMOS NOR logic gate design respectively. These structures may respectively be referred to as a "3T NMOS NOR vertical logic gate" and a "1T NMOS NOR vertical logic gate". FIG. 34a, FIG. 34b and FIG. 34c are applicable to the vertical logic gates mentioned above in FIG. 26a-26e (CMOS NAND VLG), FIG. 28a-28e (CMOS NOR VLG), FIG. 32a-32e (1T PMOS NAND VLG), and FIG. 33a-33e (1T NMOS NOR VLG), which show the Gross Cell Area (246) of the vertical logic gates measuring $24F^2$ and optimum layouts to achieve Net Cell Area (248) of the vertical logic gates measuring $16F^2$. Higher density may be achieved by employing the structures and layout techniques shown in FIG. 30c(t), FIG. 30c(b) and FIG. 30e where the optimum layout of $6F^2$ Minimum Discrete VLG Cell Area (215) VLGs achieves an estimated $13F^2$ net cell area and FIG. 31c(t), FIG. 31c(b) and FIG. 31e where the optimum layout of $7F^2$ Minimum Discrete VLG Cell Area (215) VLGs achieves an estimated $13F^2$ net cell area. Further higher density yet is possible as shown in FIG. 35a to FIG. 35e and FIG. 36, in which case A (206) and B (216) inputs are routed from opposite ends of the VLG, Out (209) is routed from either the top or bottom, and the common electrodes Vdd (207) and GND (208) are both routed to the edge in the X-direction (or Y-direction). This layout provides for a gross cell area (246) for a VLG of $8F^2$ whereby the Out electrode (209) is accessible from both the top and bottom. Yet further density yet, is possible by routing the Out (209-T) electrode from one CMOS NAND Gate (VLG #1) to the top and the Out electrode (209-B) from a neighboring CMOS NAND Gate (VLG #2) to the bottom as shown in FIG. 37a to FIG. 37e and FIG. 38. This layout provides for a net cell area (248) for a VLG of $6F^2$—as indicated in FIG. 38—whereby the Out electrode (209) is accessible from either the top or bottom but not from both, and the A (206) input is routed from the top and the B (216) input is routed from the bottom. This efficient layout shows that a pair of neighboring VLGs share Vdd (207) and GND (208) electrodes in the area indicated (241). Another area (242) indicates two neighboring VLGs whereby Out (209) electrodes are routed to the top for one VLG (VLG #2) and to the bottom for the other VLG (VLG #1) in the same vertical area. The same two neighboring VLGs do not share Vdd (207) and GND (208) electrodes and the same vertical area for routing their respective Out (209-T and 209-B) electrodes to the top and bottom. It may be desirable in practice to have vias from routing layers below a given VLG layer to the top routing layers; hence the net cell area of VLGs for a given design will be larger than $6F^2$ but less than $8F^2$.

The shared semiconductor channel layer is uniquely viable with the vertical TFT structure and provides for manufacturing cost savings in both material and process costs. One skilled in the art will recognize that a host of other logic gates may be designed employing the teachings described herein as well as those disclosed in the related applications and hence, the disclosed embodiments shall not be limited to apply only to NAND and NOR gates.

Thermally Assisted Integrated Circuit—Flash Memory

One aspect of the some embodiments disclosed herein is that an additional current is put on one or more ground planes heating the memory cell volume—including the charge trap layer—in a macro sense. That is, each individual cell does not need to be addressed individually for thermal anneal. The ground planes associated with the some embodiments disclosed herein may be used for multiple purposes including 1) lower resistance ground plane compared to using a substrate as ground, 2) a heat sink attached to other heat sinking components such as pins and planes external to the device, and 3) a source of heat for thermal annealing of the charge trap layer. The use of the ground planes 130 as both a heat sink and heat source is advantageous in the thermal annealing process from the perspective of controlling the process. For example, one can control when and how hot the internal annealing temperature is obtained and provide a means for which the heat is dissipated once it has performed the annealing task. The location of a ground plane 130 may be positioned between a TFT layer and a memory layer as indicated in FIG. 16b. Memory blocks or sections may be divided to allow for one redundant block or section such that thermal annealing may be performed on the device via sequential annealing steps on various blocks or sections without interruption of operation of the memory. The ground plane 130 would also be divided into sections corresponding to the memory sections enable the sequential annealing described. The application of redundant circuitry to enable sequential annealing of different circuitry by heating via a sectionalized ground plane 130 may be broadly applied to other integrated circuits including memory or logic.

Semiconductor Materials for Memory Cell Semiconductor Channels and TFTS

All TFT technologies existing today or that may be developed in the future apply to various embodiments disclosed herein, including but not limited to a-Si, poly-Si, LTPS, CGSI, IGZO, Graphene-based TFTs, CNT-based TFTs, and all those stated in the many prior art references and in U.S. application Ser. No. 14/580,240, filed Dec. 23, 2014. In essence, any thin film transistor technology—which is not electrically coupled to the substrate body shall be included in the definition of thin film transistors, regardless of processing temperature, albeit the preference is less than 450 C. These semiconductor materials may be used for the TFTs as well as the semiconductor channel in the memory cells. Substrates may be rigid or flexible, glass or plastic or any other substrate suitable for fabrication of integrated circuits.

All TFT materials existing today or that may be developed in the future apply to various embodiments disclosed herein, including but not limited to a-Si, poly-Si, LTPS—low temperature poly-silicon, CGSI, IGZO and other amorphous oxide semiconductors, Graphene-based TFTs, CNT-based TFTs. In essence, any thin film transistor technology—which is not electrically coupled to the substrate body—which exists today or is developed in the future, shall be included in the definition of thin film transistors, regardless of processing temperature, albeit the preference is less than 450 C. Some novel promising TFTs in development include the following four:

1) "black phosphorus" reported by several universities including McGill University, Montreal, Canada, Université de Montreal, Montreal, Canada, Fudan University, Shanghai, Canada, and University of Science and Technology, Hefei, China,
2) Zinc oxynitride (ZnON) TFTs such as reported by BOE (China), Samsung (Korea) and others in the following prior art papers: High Mobility Zinc Oxynitride TFT for AMOLED, Meili Wang, Li Zhang, Dongfang Wang, Liangchen Yan, Guangcai Yuan, Gang Wang, SID 2014 Symposium Digest of Technical Papers, Vol. 45, Issue 1, pages 949-951, June 2014, ISSN 0097-966/14/4503-0949, DOI: 10.1002/j.2168-0159.2014.tb00246.x, The Development of High Mobility Zinc Oxynitride TFT for AMOLED, Liangchen Yan, Meili Wang, Li Zhang, Dongfang Wang, Fengjuan Liu, Guangcai Yuan, Gang Wang, SID 2015 Symposium Digest of Technical Papers, Vol. 46, Issue 1, pages 769-771, June 2015, ISSN 0097-966X/15/4502-0769, DOI: 10.1002/sdtp.10213, Development of High Mobility Zinc Oxynitride Thin Film Transistors, Yan Ye, Rodney Lim, Harvey You, Evelyn Scheer, Anshu Gaur, Hao-chien Hsu, Jian Liu, Dong Kil Yim, Aki Hosokawa, John M. White, SID 2013 Symposium Digest of Technical Papers, Vol. 44, Issue 1, pages 14-17, June 2013, ISSN 0097-966X/13/4401-0014, DOI: 10.1002/j.2168-0159.2013.tb06127.x, and High Performance Nanocrystalline ZnOxNy for Imaging and Display Applications, Eunha Lee, Taeho Shin, Anass Benayad, HyungIk Lee, Dong-Su Ko, HeeGoo Kim, Sanghun Jeon, and Gyeong-Su Park, SID 2015 Symposium Digest of Technical Papers, Vol. 46, Issue 1, pages 681-684, June 2015, ISSN 0097-966X/15/4502-0681, DOI: 10.1002/sdtp.10263,
3) Zinc Tin Oxide (ZTO) TFT and Indium Tin Zinc Oxide (ITZO) TFT, such as described in the following prior art papers: Fabrication of Zinc Tin Oxide TFTs by Self-Aligned Imprint Lithography (SAIL) on Flexible Substrates, Warren Jackson, Carl Taussig, Rich Elder, William M. Tong, Randy Hoffman, Tim Emery, Dan Smith, Tim Koch, SID 2009 Symposium Digest of Technical Papers, ISSN/009-0966X/09/3902-0873, DOI: 10.1889/1.3256934 and High Mobility ITZO BCE Type TFTs for AMOLED Applications, Fengjuan Liu, Dongfang Wang, Longbao Xin, Liangchen Yan, Meili Wang, Guangcai Yuan, and Gang Wang, SID 2015 Symposium Digest of Technical Papers, Vol. 46, Issue 1, pages 1180-1183, June 2015, ISSN 0097-966X/15/4503-1180, DOI: 10.1002/sdtp.10048, Nanocrystalline ZnON; High mobility and low band gap semiconductor material for high performance switch transistor and image sensor application, Eunha Lee, Anass Benayad, Taeho Shin, HyungIk Lee, Dong-Su Ko, Tae Sang Kim, Kyoung Seok Son, Myungkwan Ryu, Sanghun Jeon & Gyeong-Su Park, SCIENTIFIC REPORTS |4:4948 |DOI: 10.1038/srep04948, May 13, 2014, Anion control as a strategy to achieve high-mobility and high-stability oxide thin-film transistors, Hyun-Suk Kim, Sang Ho Jeon, Joon Seok Park, Tae Sang Kim, Kyoung Seok Son, Jong-Baek Seon, Seok-Jun Seo, Sun-Jae Kim, Eunha Lee, Jae Gwan Chung, Hyungik Lee, Seungwu Han, Myungkwan Ryu, Sang Yoon Lee & Kinam Kim, SCIENTIFIC REPORTS |3:1459|DOI: 10.1038/srep01459, Mar. 15, 2013
and 4) a new wide-bandgap ultra-thin-film metal oxide nMOSFET developed at National Chiao Tung University, Taiwan (Albert Chin), reported to have a high ION/IOFF of $>10^7$ and high mobility of 0.54X SiO2/Si device operated at 1 MV/cm—the high mobility TFT is due to stronger overlapped orbitals as described in the following paper: Extremely High Mobility Ultra-Thin Metal-Oxide with $ns^2np^2$ Configuration, C. W. Shih, Albert Chin, Chun-Fu Lu, and S. H. Yi, Proceedings IEDM15-145, 978-1-4673-9894-7/15/ ©2015 IEEE Doped amorphous metal oxide TFTs such a vanadium-doped zinc tin oxide (VZTO) are also promising TFTs. Various embodiments described herein shall not be limited however to the TFTs mentioned herein or in the prior art references. Significant development is underway in the TFT area; the new TFT materials and devices that become available shall apply to the scope and spirit of the various embodiments disclosed herein, as one skilled in the art would understand and appreciate.

These semiconductor materials may be used for the TFTs as well as in the semiconductor channel in certain memory cells such as NAND or NOR flash. Substrates may be rigid or flexible, glass (e.g., soda lime, aluminosilicate, borasilicate or other compositions) or plastic or any other substrate used in fabrication of integrated circuits or flat panel displays.

Metal oxide TFTs fabricated with thin semiconductor layers (less than 50 nm and preferably less than 10 nm) are of particular use with the various embodiments described herein. TFTs with such thin layers are believed to have significant better mobility due to less domain irregularities associated with amorphous materials; hence, resistance is reduced and the materials behave more like poly-crystalline material.

Built in Self Test (BIST)

Built in self-test (BIST) is a known technique for testing the correctness of chips. Typically the BIST circuitry is required to be minimized due to limited die area and the need to keep costs down. This results in higher costs in test and more difficulty in testing parts at the wafer level, at the chip packaged level, and in the field. Various embodiments disclosed herein employ TFTs to create BIST circuitry that enables better test coverage on chip without sacrificing precious die area allocated for memory cells. This further enables a quicker and easier wafer test, package test and makes field testing practical. In addition there could be several photo diode (LED) indicators—on-chip or off-chip—to provide indication signals which are visible by an observer stating a certain condition of the chip. For example: 1) a green diode may indicate "no errors" and that the self-test is up to date and everything is working well; 2) a yellow light may indicate that there are no known errors but the "self-test is overdue"; 3) a red light may indicate there were "errors" i.e., chip not working correctly; 4) a blue light may indicate that there are messages to be read; and so on. A small perhaps 7 segment display could be integrated on chip or off-chip to display any error codes. Often when there is a system problem, the first question asked is—is it a software or hardware problem? The implementation of the above mentioned LED and display indicators could answer the questions of the type of problem and source of problem with just a glance to the LED and display indicators. Furthermore, a self-correction mode may enable self-correcting under certain circumstances. For example, if a certain number of bits no longer function correctly, those bits may be removed from operation or replaced by redundant bits. BIST circuitry fabricated with TFTs could be placed above or below other core circuitry of an IC without sacrificing die area and hence would enable more circuity to provide additional functions such as scheduling tests. Thus a chip can regularly perform the self-test and report the result via diode and display indicators or report the condition of the chip from a local memory. When a system is built and each chip has a diode indicating proper function, the task of diagnosis becomes much easier and cheaper. Proper electronic functioning can be determined at a glance of the system.

Integrated Display, Memory, Processor and other

The principles described herein and those described in U.S. application Ser. No. 14/580,240 may be applied to novel integrated modules which include some or all of the following components all fabricated in a 3D configuration on a glass or other substrate with thin film transistors: memory, display, processor, energy storage, wireless communications and other analog functions. In essence, nearly all of the core electronic components of an entire cell phone, tablet, computer or television may be fabricated on a single glass or other substrate with thin film transistors as the main switching element in the respective circuitry of each core component. Of course, a cover glass for the display may be required, but the essential circuitry where the transistors reside are all fabricated in 3D layers above a single base glass or other substrate. The display technology may be either OLED, LED, QLED (quantum dot LED), LCD or MEMs.

Ultra Wide I/O+Optical Interconnect

The ultra-wide TFT-based I/O circuitry is described in U.S. application Ser. No. 14/580,240. For high speed applications, optical interconnects—in lieu of metal wire interconnects—may be employed in combination with ultra-wide TFT-based I/O circuitry for interconnecting chips and devices on or off board. Depending on the number and feature size of metal interconnects, the capacitance delays of such interconnects may adversely impact desired speed of the system. This delay may be omitted by utilization of optical interconnects.

Ultra Wide I/O+RF/Wireless Interconnect

Rather than wire or optical interconnects, one may also implement wireless (RF) interconnects for communications with other chips. Broadcast and receive circuitry would be fabricated on chip with TFTs. There are many different ways that RF signaling can be implemented. Each takes an amount of circuitry. As the number of I/O channels increase, the amount of circuitry increases. When the amount of I/O circuitry becomes too big, it is no longer practical in the conventional design of semiconductors with crystalline silicon. With a dedicated layer or two of TFTs the circuitry can be practical even with a very large number of I/O channels. Further, the design and test of that TFT layer can be accomplished and potentially more easily reused. One method is to utilize a scheme where a carrier frequency can contain a data stream, much like AM or FM radio. Another scheme would be that the TFTs may implement a Fast Fourier Transform (FFT) to extract the amplitude of each frequency bin in a large number of bins or other methods may be employed to extract the data from the RF signals. The distance to broadcast would be small for a small system, or larger for a big, supercomputer like system. The advantage of employing wireless interconnect is that all I/O pins except those for power and ground may be eliminated. Further, the advantage of employing TFTs for the wireless interconnect is that the circuitry may be fabricated on a layer other than memory layers thereby not using precious die space. TFTs are low cost; hence this provides an ultra low cost of interconnect between integrated circuits. Because the TFTs don't take up extra die space or extra substrate surface space, a dedicated circuit can be created to performing an FFT in a parallel fashion which increases the amount of circuitry but dramatically increases the speed of the FFT and ease of operation—in particular from a software standpoint. For commercialization into products, a standard would likely have to be developed to interpret the signals including frequencies for memory, processors, addressing and the like. The hardware enables a wide variety of standards to be considered and novel solid state drives and related storage server systems may be implemented offering unique flexibility in design and operation with wireless interconnects between processors and memory chips.

Ultra Wide I/O Application

Figure 29A:
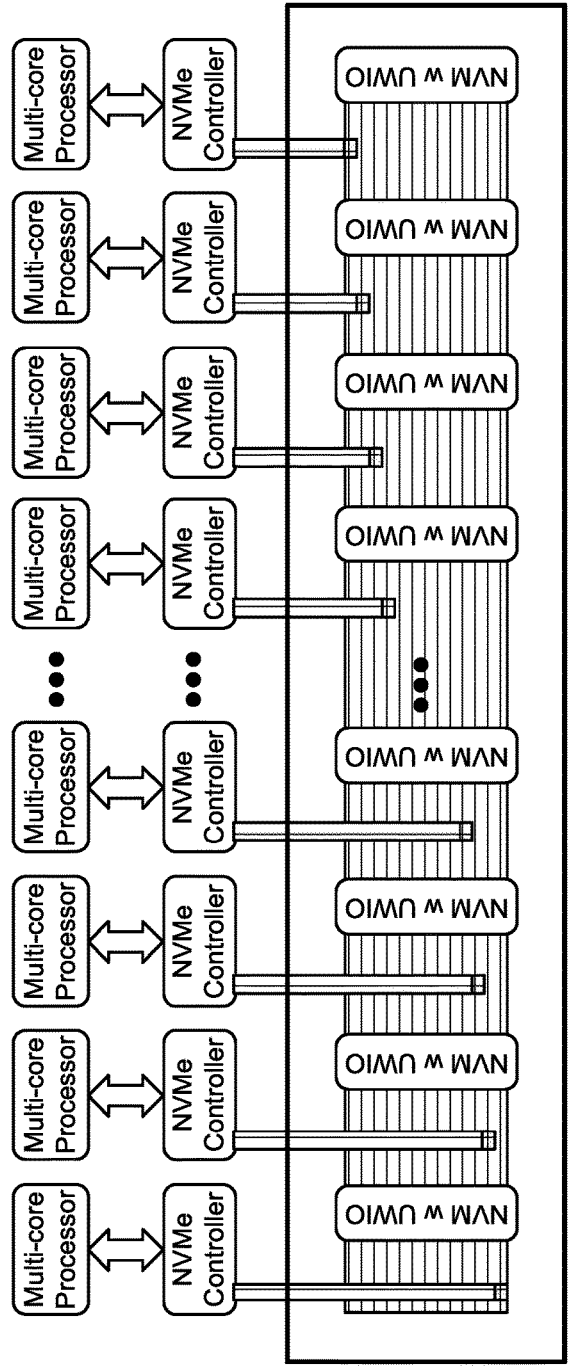
FIG. 29a to FIG. 29c—Illustrations of one possible adoption of ultra-wide I/O.
Figure 29B:
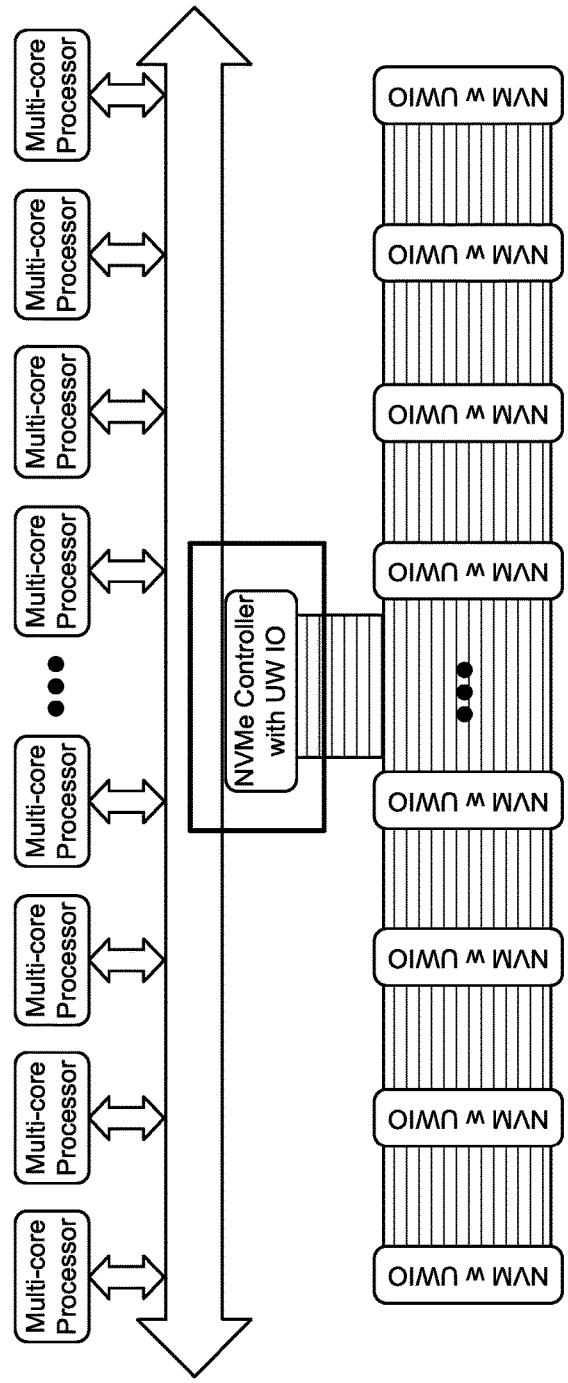
Figure 29C:
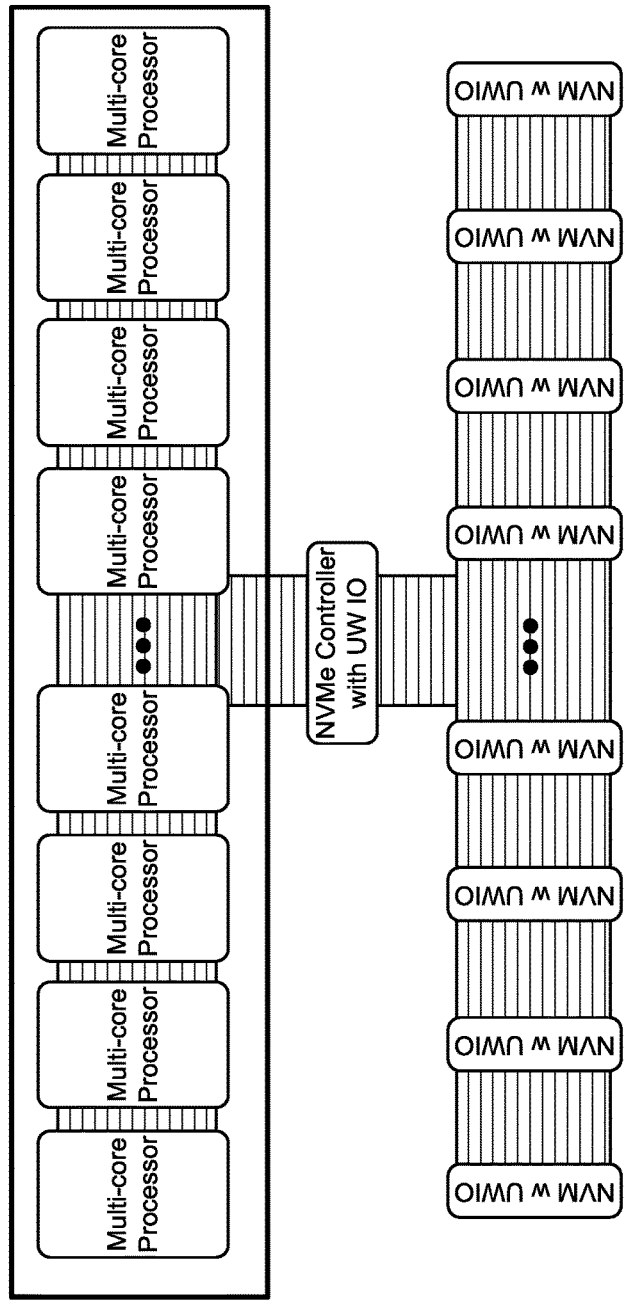
Figure 30A:
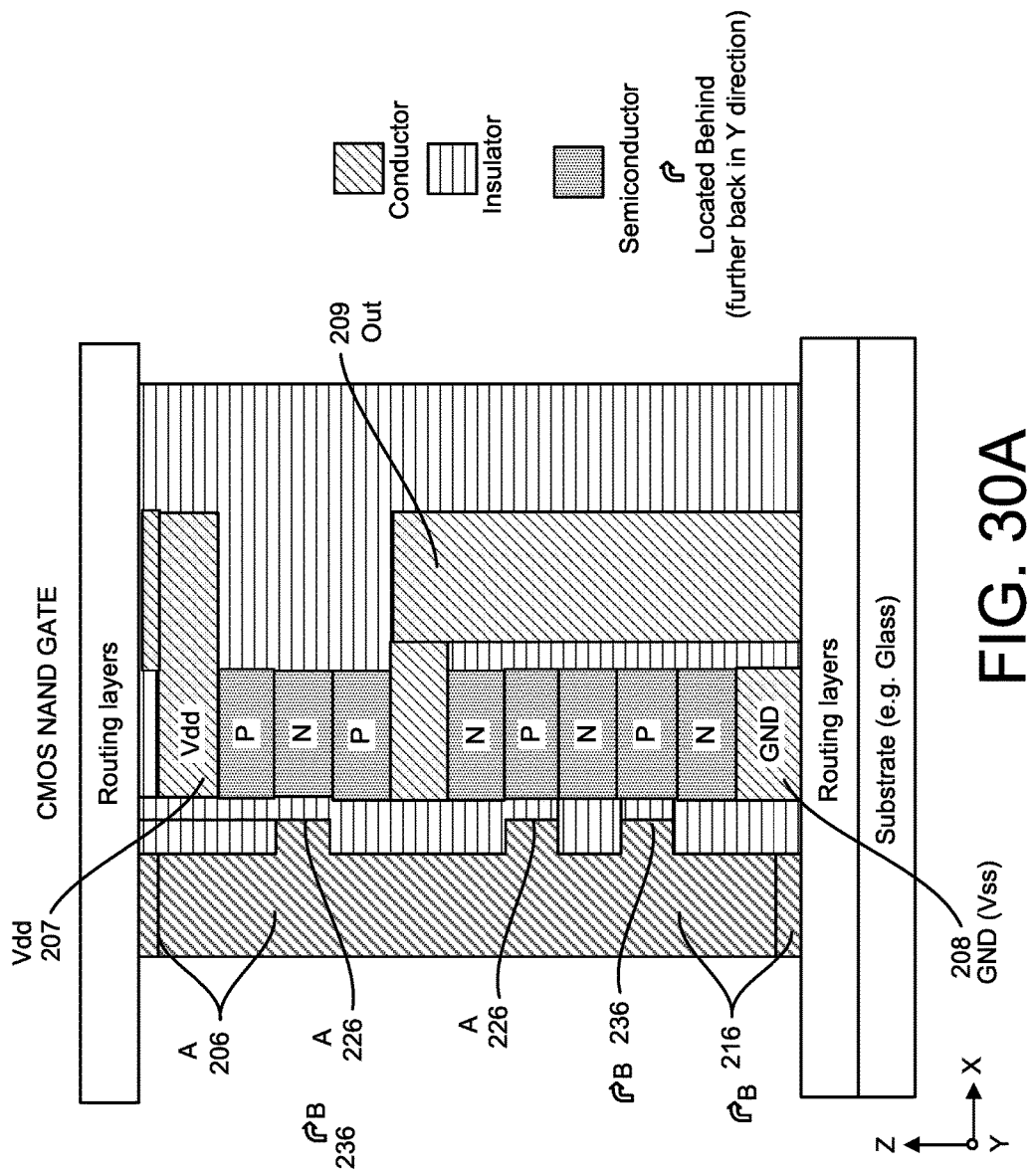
FIG. 30a and FIG. 30b—Side cross section illustrations of a VLG (CMOS NAND Gate type).
Figure 30B:
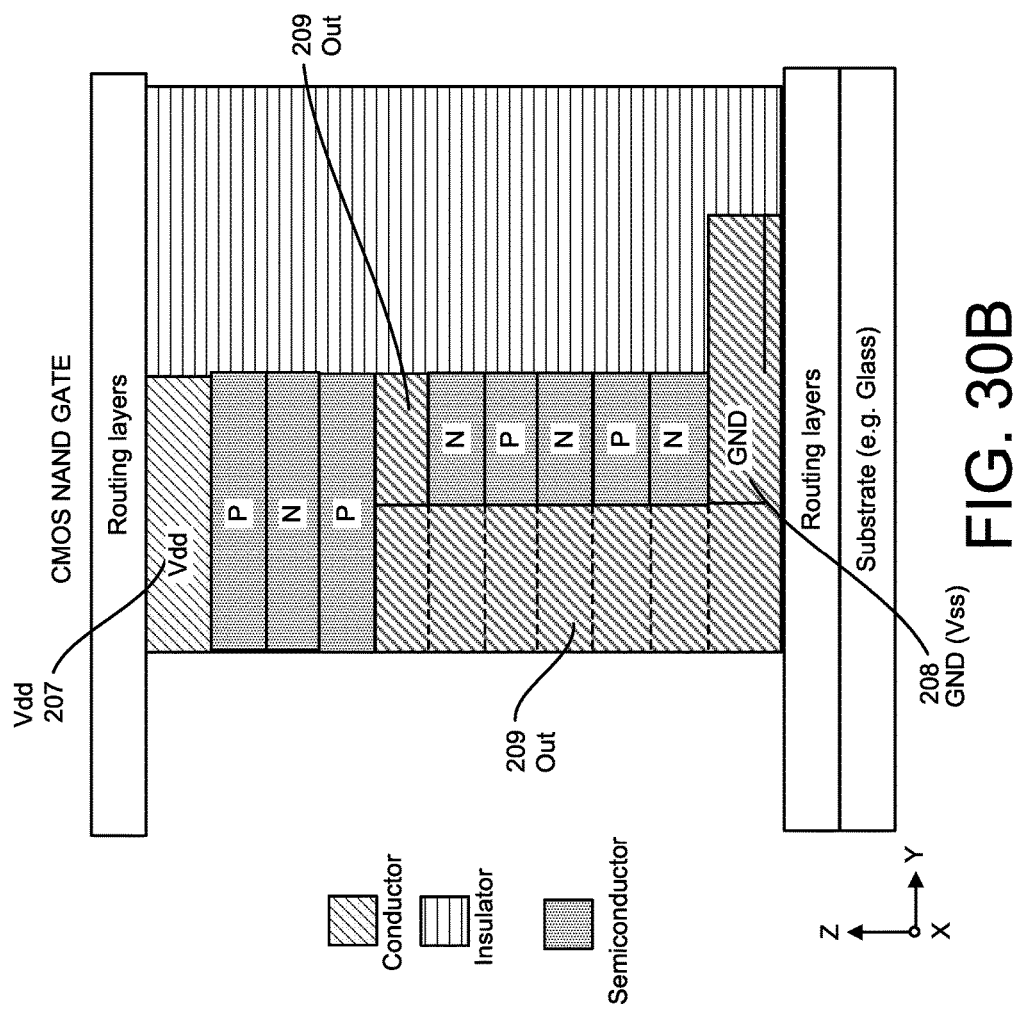
Figure 30E:
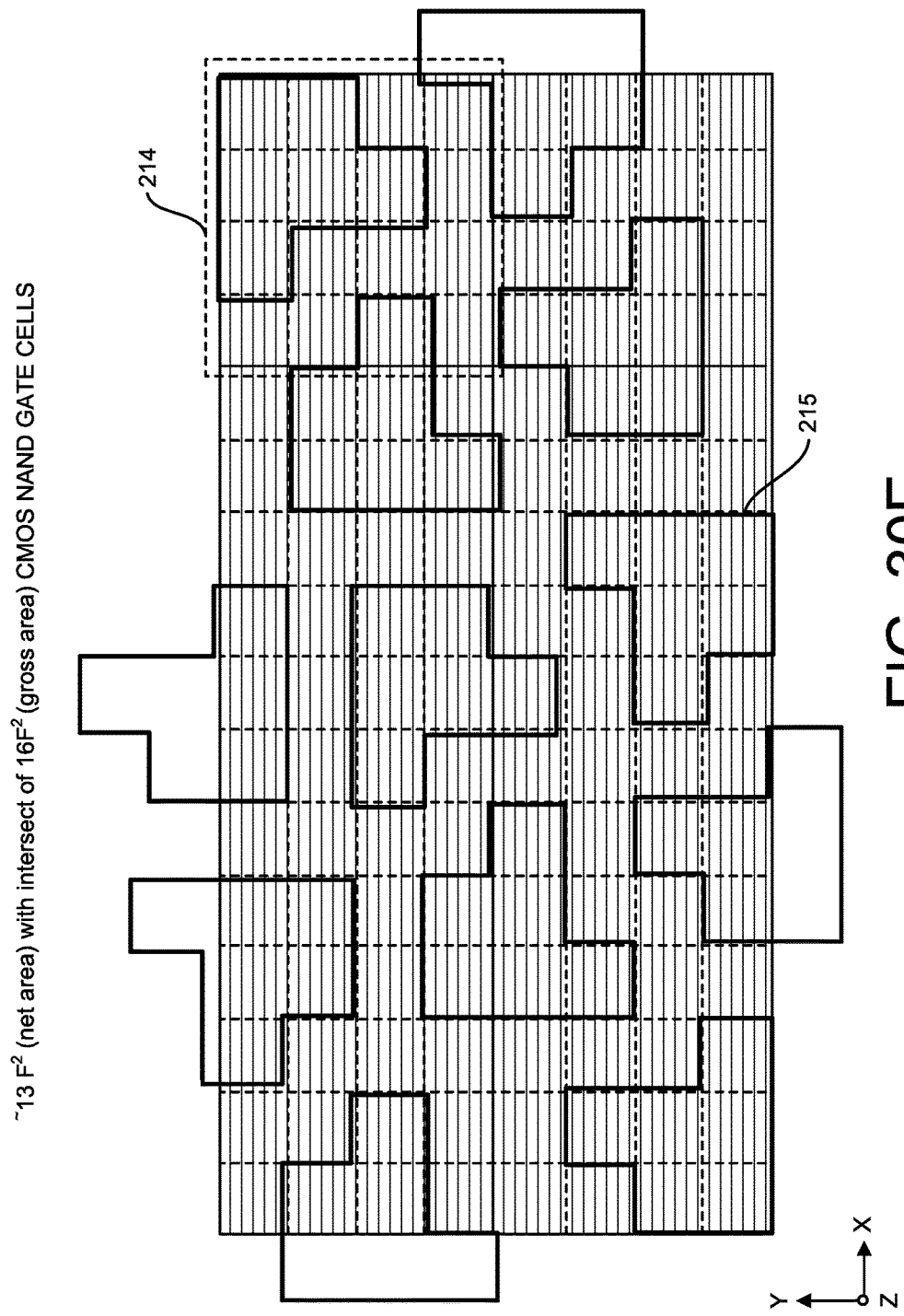
Figure 31A:
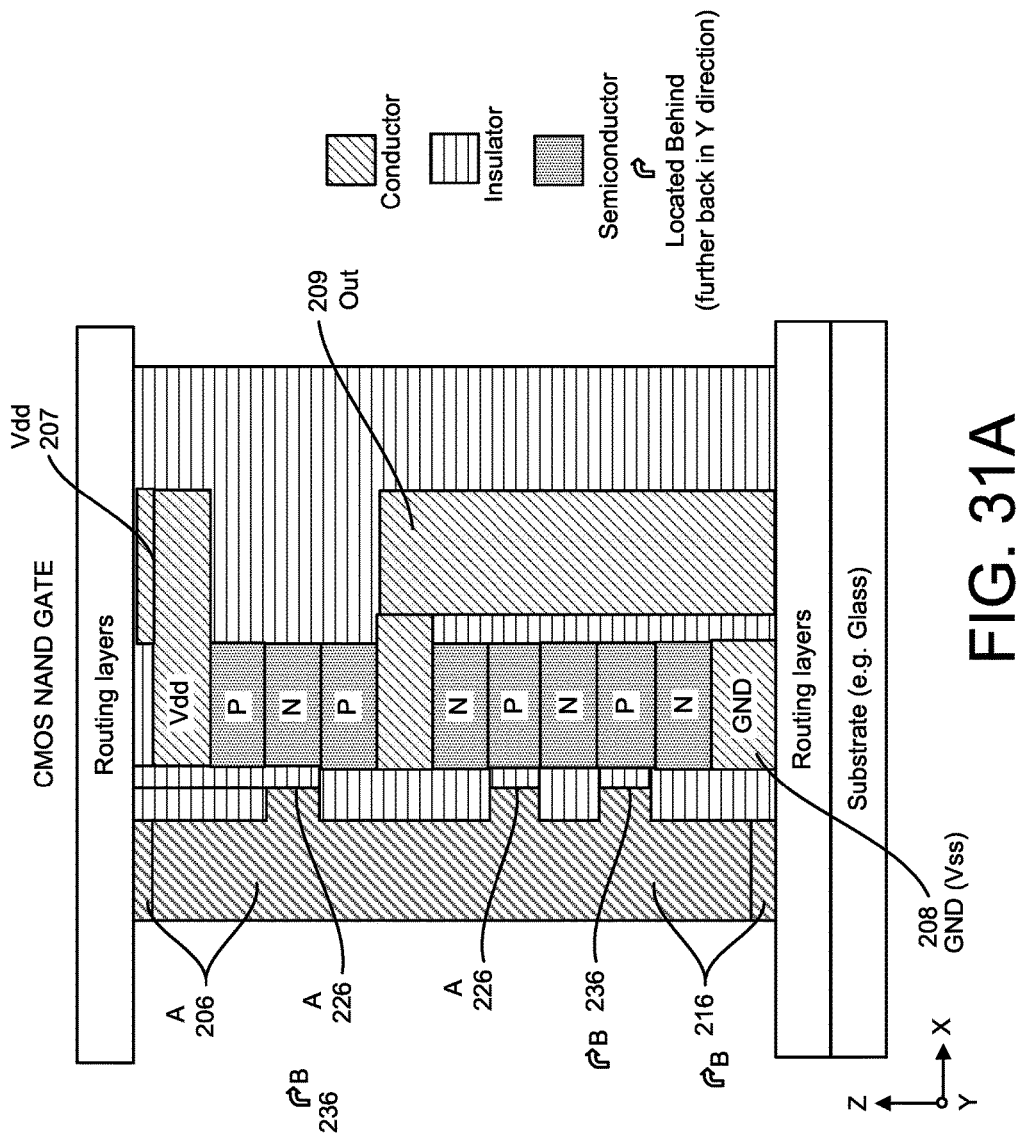
FIG. 31a and FIG. 31b—Side cross section illustrations of a VLG (CMOS NAND Gate type).
Figure 31B:
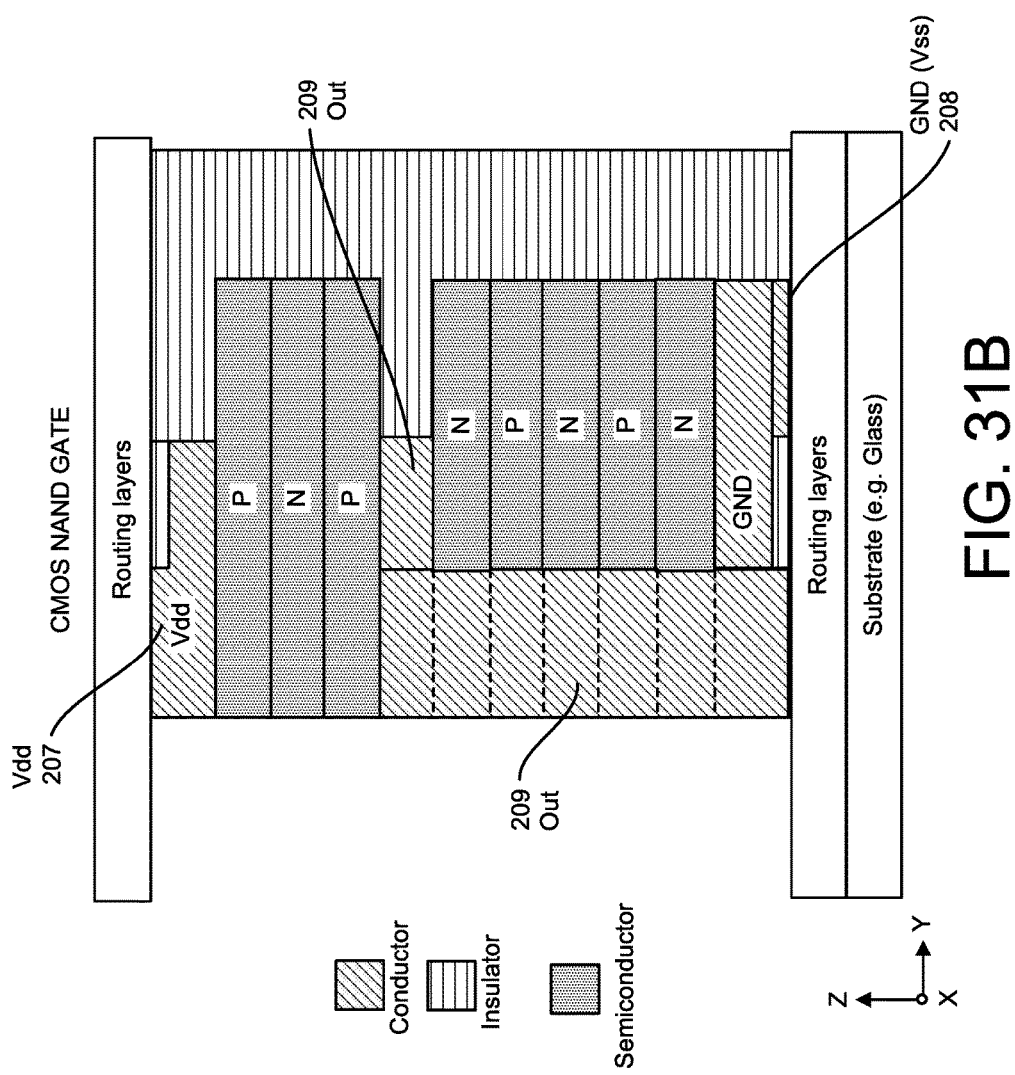
Figure 31E:
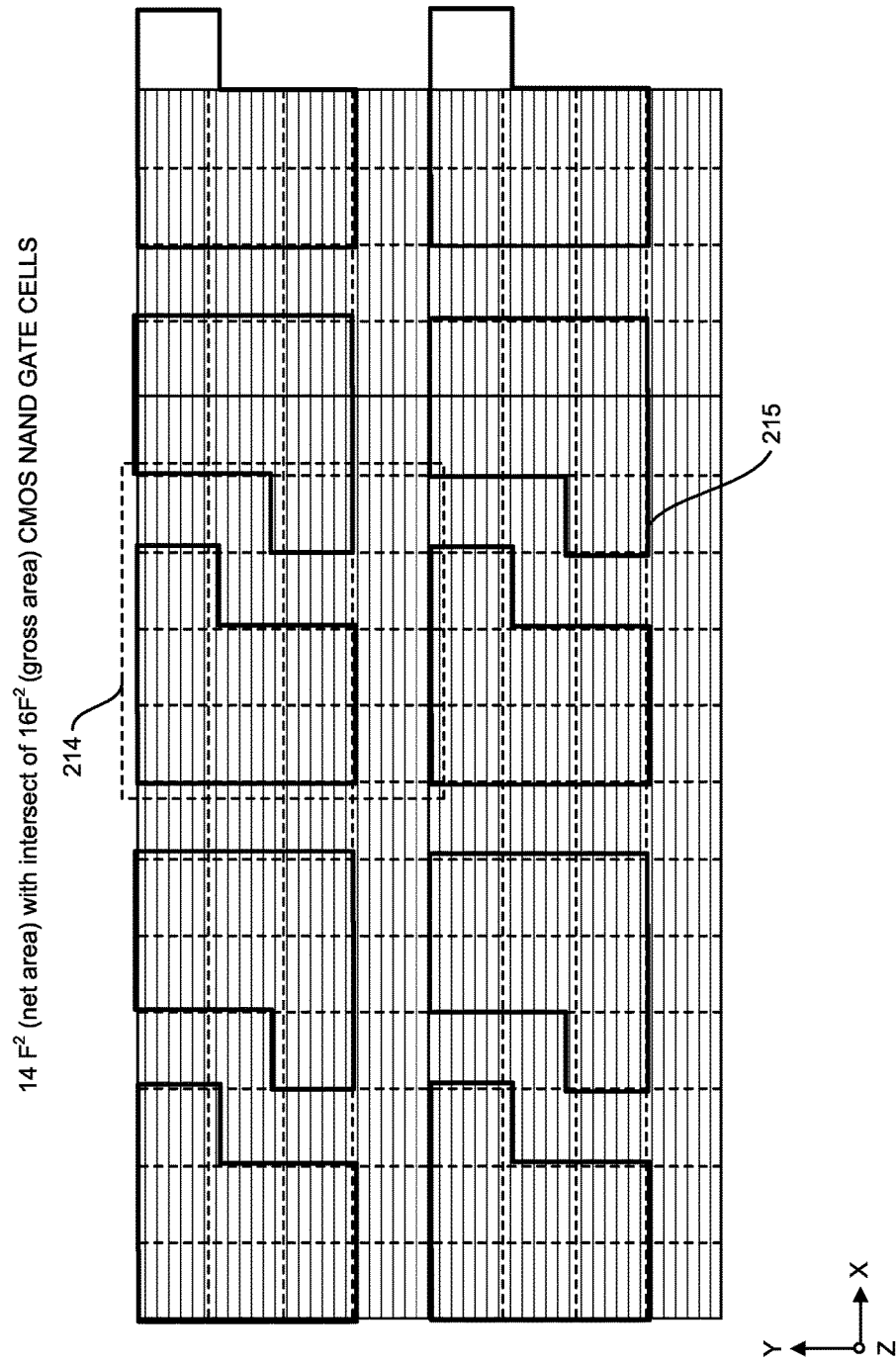
Figures 32A, 32B:
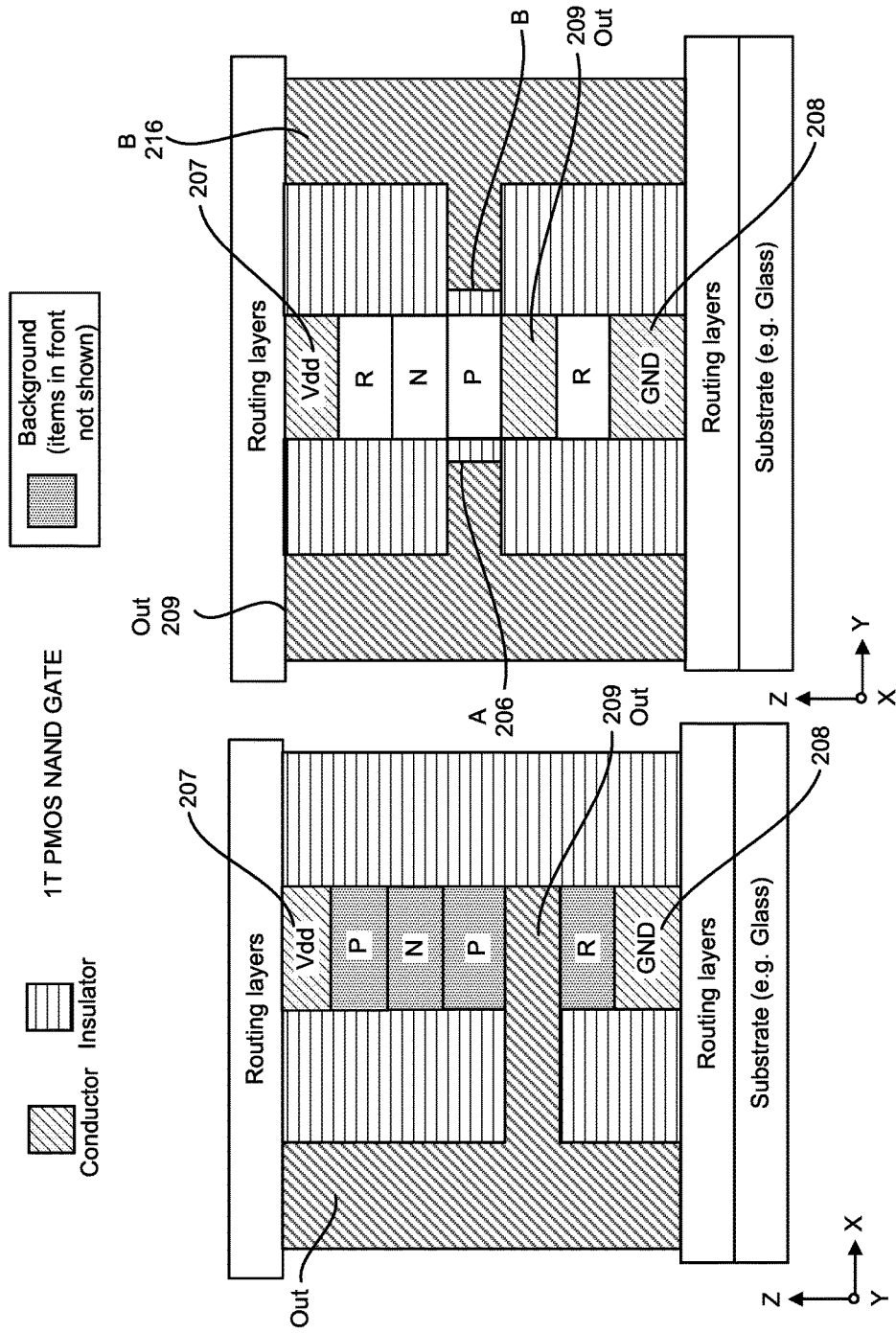
FIG. 32a and FIG. 32b—Side cross section illustrations of a VLG (1T PMOS NAND Gate type).
Figure 32E:
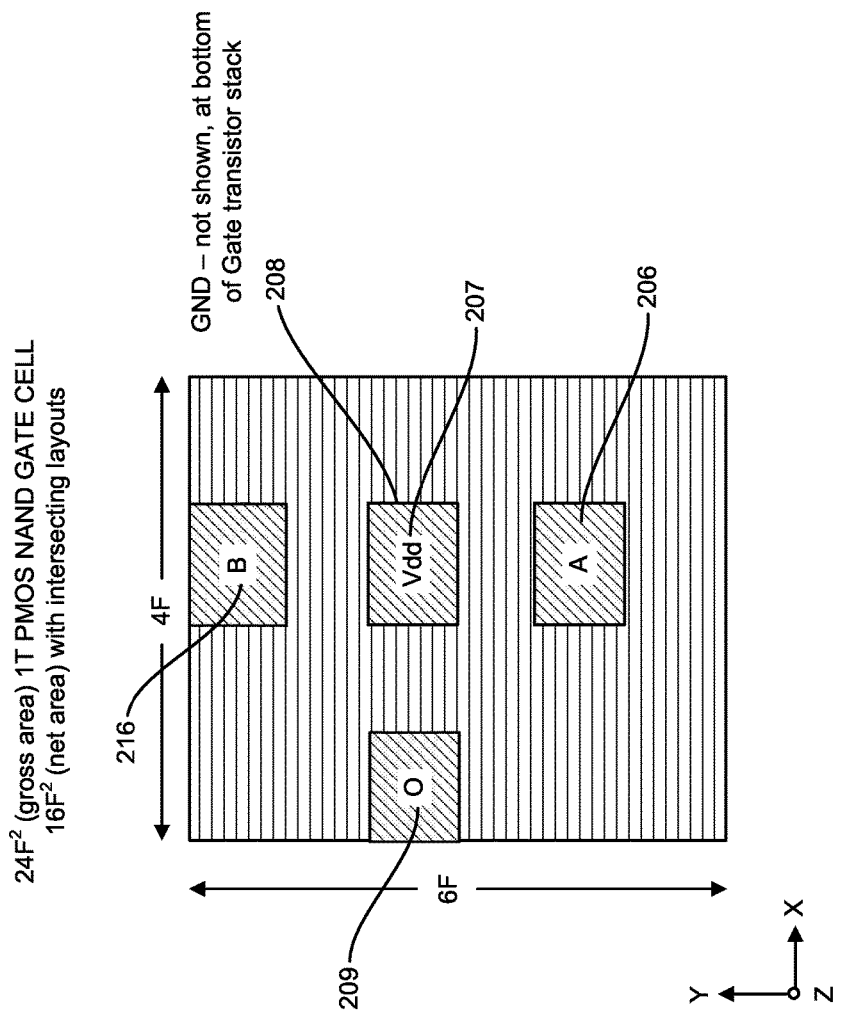
Figures 33C, 33D:
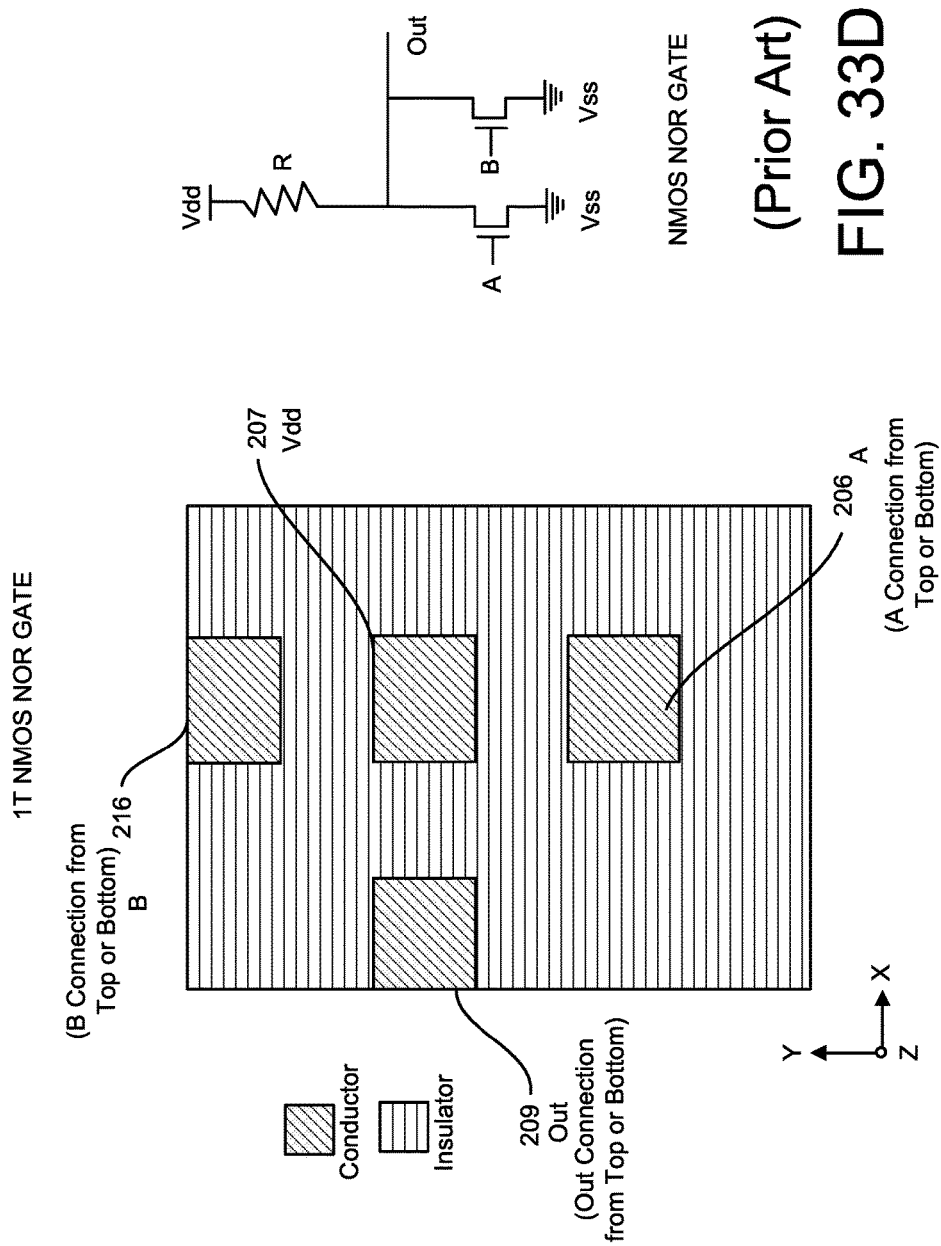
Figure 33E:
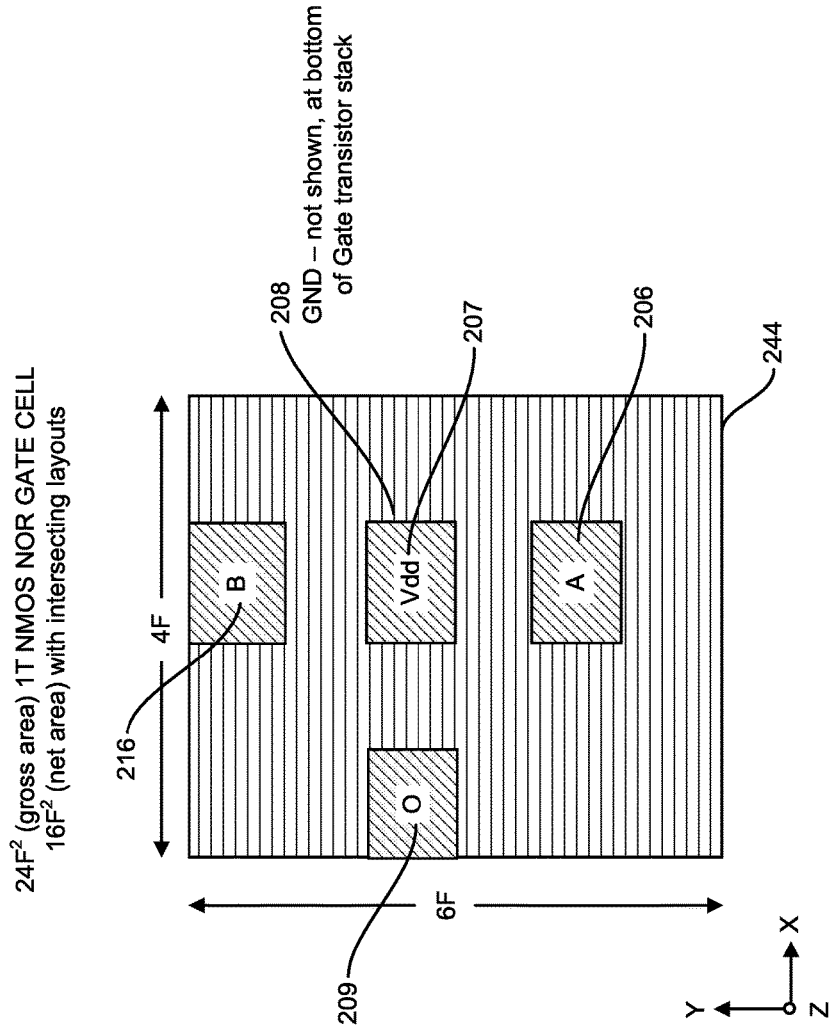

Applications for ultra-wide I/O are discussed in U.S. application Ser. No. 14/580,240 including placement of I/O circuitry on the same devices as the core circuitry or on an external substrate such as glass for subsequent attachment to the core circuitry of either a memory or logic device. One application of ultra-wide I/O includes providing for the capability of several processors and/or controllers to directly access a single large memory—which may be comprised on one chip or several memory chips all connected to such processor and/or controller chips. The emerging NVM Express (NVMe) standard for example may be modified to adopt ultra-wide I/O to a single large memory accessible by many processors. This would allow for much larger bandwidth between the memory and processors for data storage applications for example. FIG. 29a to FIG. 29c illustrate one example of how Ultra-Wide I/O may be adopted over time.

Wireless Power

Another aspect of the various embodiments described herein is to eliminate the power and ground pins by utilizing wireless power. The power is connected to the structure (e.g., PCB, or other substrate) upon which the chip is placed on for close proximity. An inductor may be placed on the bottom of the chip to accept the power. If a magnet is placed on the structure (board) and the chip, one could literally throw the chips and board in the container, shake and they will all automatically be placed to accept power and work with no wiring (except for the wiring to the board to provide power).

Combining wireless interconnect and wireless power as described above enables total removal of all I/O pins. This also offers unique advantages for users of integrated circuits. For example, an individual may add memory to his or her computer by simply 'dropping' more chips in a specified area of the computer. i.e., no physical connection by wires needed.

Removing most of the wiring from the system via wireless communications (RF) and wireless power offers significant cost reduction opportunities. The manufacturing assembly process need not employ precise placement equipment but rather simple equipment to ensure chips falls into place. With BIST, a glance at the indicators will confirm if all the chips are working. This will help reduce the cost of product verification and testing. For complex and critical use application systems such as defense, space and medical, the BIST enables the chip to be tested at any point during the manufacturing assembly process and hence can therefore provide greater assurance that the chip is correctly working.

Manufacturing

There are numerous methods by which products incorporating one or more of the embodiments described herein may be produced by utilizing existing TFT fabs and existing semiconductor fabs as illustrated in FIGS. 46A through 46H of U.S. application Ser. No. 14/580,240. One method to enable products to be produced with existing infrastructure and minimal additional capital expenditures would be for TFT fabs to produce the requisite TFTs on a large glass substrate, then scribe into 200 or 300 mm circular substrates for subsequent processing at a conventional semiconductor foundry for the memory array layer(s). Scribing into 200× 200 mm or 300×300 mm square substrates for further processing would be preferable over circular substrates, in order to improve efficiency of materials and TFT processing. That would entail tool design changes, but would be the next logical step for a manufacturer to consider in reducing costs. Long term the entire memory device should be produced in an integrated fab that processes large glass substrates which range in size of 1.5 meter×1.8 meter (Generation 6 glass for flat panel displays) up to 2.1 meter×2.4 meter (Generation 8 glass for flat panel displays) and larger (e.g., ~3 meter×~3 meter for Generation 10 and 10.5 glass).

There have been many manufacturing problems in fabricating 3D flash memories which include the very thin tall vertical structures that minimize expensive lithography steps however in turn have created challenges in deposition, etch and metrology. Recent structures of 3D flash memory has included 32 cells in a vertical NAND string for example, with manufacturers planning for up to 64 cells in one string. With the low cost TFTs, vertical NAND devices need not be built with 32 cells in a string. Rather, say 4, 8 or 16 layers would be sufficient thereby avoiding the manufacturing challenges of deposition, etch and metrology currently experienced by flash memory manufacturers today.

In addition, 3D flash may be constructed from layers of planar NAND which are more lateral lithography intensive—yet cost effective—as promoted by Andrew Walker (U.S. Pat. Nos. 7,339,821, 7,638,836, 7,777,268 and 7,777, 269 and A Rigorous 3-D NAND Flash Cost Analysis, Andrew J. Walker, IEEE Transactions on Semiconductor Manufacturing, Vol. 26, No. 4, November 2013—Digital Object Identifier 10.1109/TSM.2013.2283274, 0894-6507 _c 2013 IEEE). This 3D technique of layering planar NAND flash also avoids the many manufacturing challenges of the vertical channel NAND devices employing tall NAND strings of 32 or 64 cells.

The embodiments disclosed herein are broadly applied to 3D integrated circuits and in particular 3D circuits incorporating 2D memory devices or 3D memory devices. 2D memory devices include one memory layer including memory cells; normally the conductive bit lines and word lines are in the x-axis and y-axis direction for connection to common memory cells. 3D memory devices include a plurality of memory layers including memory cells and may include one or more conductive lines (bit, word or gate lines) connected to common memory cells in the vertical (z-axis) direction. It should be noted here that the routing of certain x-axis and y-axis conductive lines to the TFTs necessarily are routed with vias in the z-axis direction in order to wrap above or below the memory cells where the TFTs are located. Such routing of lines in the z-axis direction shall not take away or depart from the definitions of such lines as x-axis or y-axis conductive lines as the main distinction is the direction of the conductive line when connected through common memory cells in a matrix or array. Further, those skilled in the art recognize that bit and word lines may be interchangeable in the descriptions herein and may be routed either in the x-axis, y-axis or z-axis. Memory technologies that may be employed with one or more of the embodiments disclosed herein include but are not limited to single or multiple bit flash memory (NAND or NOR), either floating gate or charge trap type, resistive RAM (RRAM), magnetic RAM (MRAM) both current and voltage controlled, phase change memory (PCM), ferroelectric RAM (FeRAM), carbon nanotube RAM (NRAM), anti-fuse memories and those listed in U.S. application Ser. No. 14/580,240. Most 3D memory devices described in the prior art are of the NAND flash type with vertical gate or vertical channel structures. Within this specification, we introduce the term volumetric memory arrays: 1) volumetric NAND flash memory array (including the vertical gate or vertical channel structures described herein), 2) volumetric crosspoint memory array and 2) volumetric 1T1R memory array. 3D memory devices may be comprised of these volumetric memory arrays. A volumetric crosspoint memory array is defined as a 3D memory array which has a plurality of memory layers (in the z-axis, the same direction of material deposition) with bit and word lines routed in a combination of x-axis, y-axis or z-axis directions to enable intersection of the bit and word lines with the memory cells between such intersections. Other select device elements such as a diode, an amorphous metal thin film non-linear resistor (AMNR), such as described in U.S. Pat. No. 9,099,230 or chalcogenide material (e.g., ovonic threshold switch)—such as described in U.S. Patent Application publication, 2015/0074326, Mar. 12, 2015—Castro—may be located within these intersections as well. AMNR devices may also be employed as a select device in a floating gate or charge trap volumetric NAND flash memory array. In a 2D crosspoint memory array, the cell area (top view die area) is $4Fm^2$. In a volumetric crosspoint memory array, the cell area may also be $4Fm^2$. A volumetric 1T1R memory array is defined as a 3D memory array which has a plurality of memory layers (in the z-axis, the same direction of material deposition) with bit and word lines routed in a combination of x-axis, y-axis or z-axis directions to enable intersection of the bit and word lines to address at each intersection a memory cell with one transistor. Furthermore, some embodiments are not limited to memory arrays of the crosspoint architecture and further are not limited to nonvolatile memory types. Some embodiments may be applied, to one skilled in the art, to a wide range of memory technologies which are constructed in a matrix array addressable by word and bit lines and in certain memory types—such as flash—by gate lines and other source and drain select lines. Some embodiments also may be applied to those skilled in the art to other arrays—not just memory—such as image sensors and displays whereby the TFTs are substantially positioned above or below the photosensitive sensor cells or display pixel cells and may be fabricated with minimum feature sizes substantially larger than the minimum feature size of the cells (image sensor cells or display pixel cells).

Embodiments of the present disclosure will be explained below with reference to the accompanying drawings. Note that in the following explanation the same reference numerals denote constituent elements having almost the same functions and arrangements, and a repetitive explanation will be made only when necessary.

Note also that each embodiment to be presented below merely discloses a device or method for embodying the technical idea of the present disclosure. Therefore, the technical idea of the present disclosure does not limit the materials, structures, arrangements, and the like of constituent parts to those described below. The technical idea of the present disclosure can be variously changed within the scope of the appended claims.

Various embodiments disclosed herein may be applied to all types of vertical memories with x-axis, y-axis and z-axis conductive lines.

For a given memory array, it is most efficient to design an array of equal number (M) of bit and word lines. Hence, the descriptions of the embodiments herein assume arrays of M×M size. This however is not a restriction on the embodiments disclosed herein which may be applied to arrays of any number of non-equal word and bit lines. Furthermore, it should be apparent to one skilled in the art that x-axis and y-axis can and may be interchangeable and certain descriptions should not be limited to just the x-axis or y-axis when such terms are used in describing the 3D memory arrays.

First Embodiment

Figure 16A:
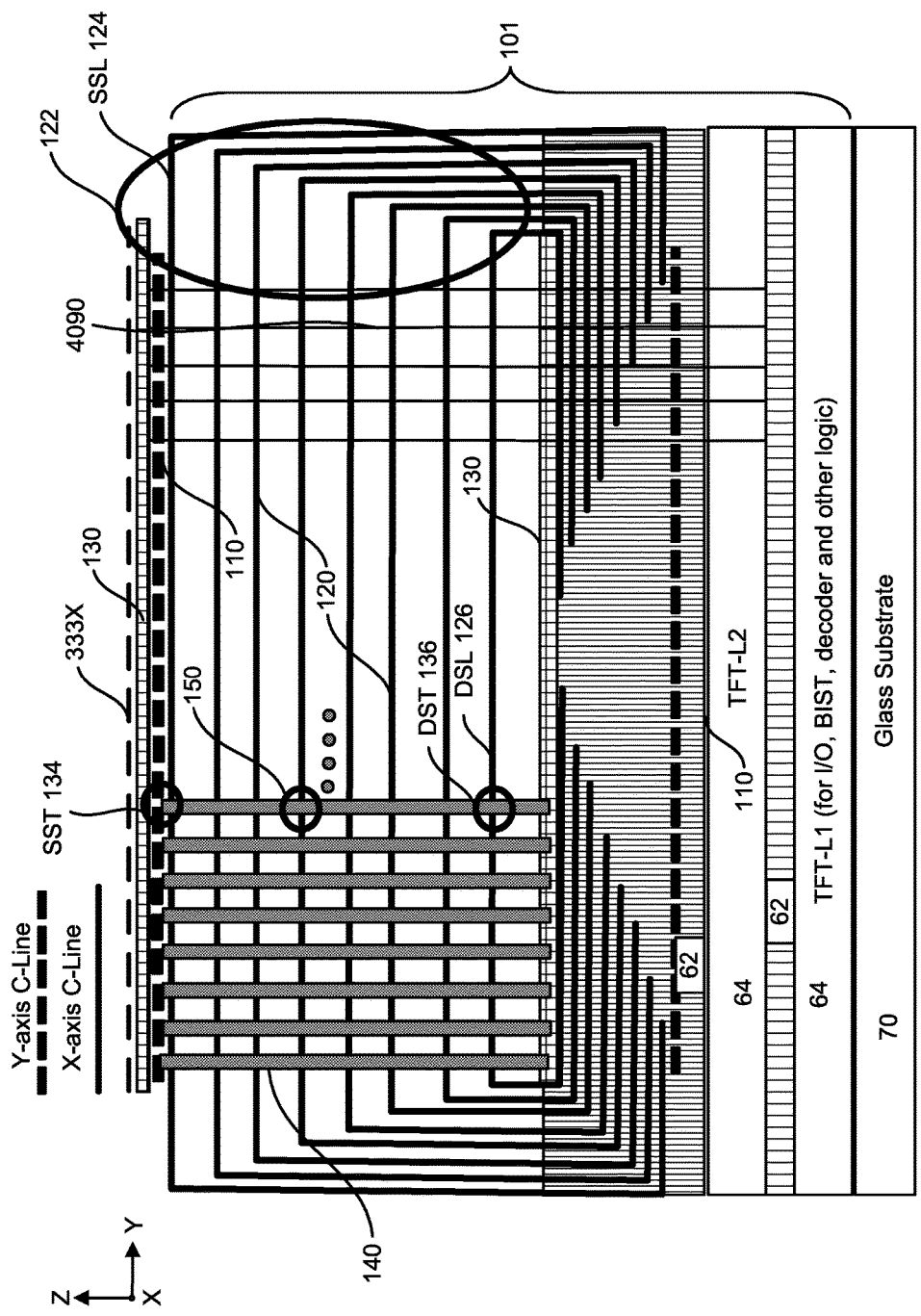
FIG. 16a is a cross section side view (front) of a vertical channel NAND flash type 3D memory device.
Figure 16B:
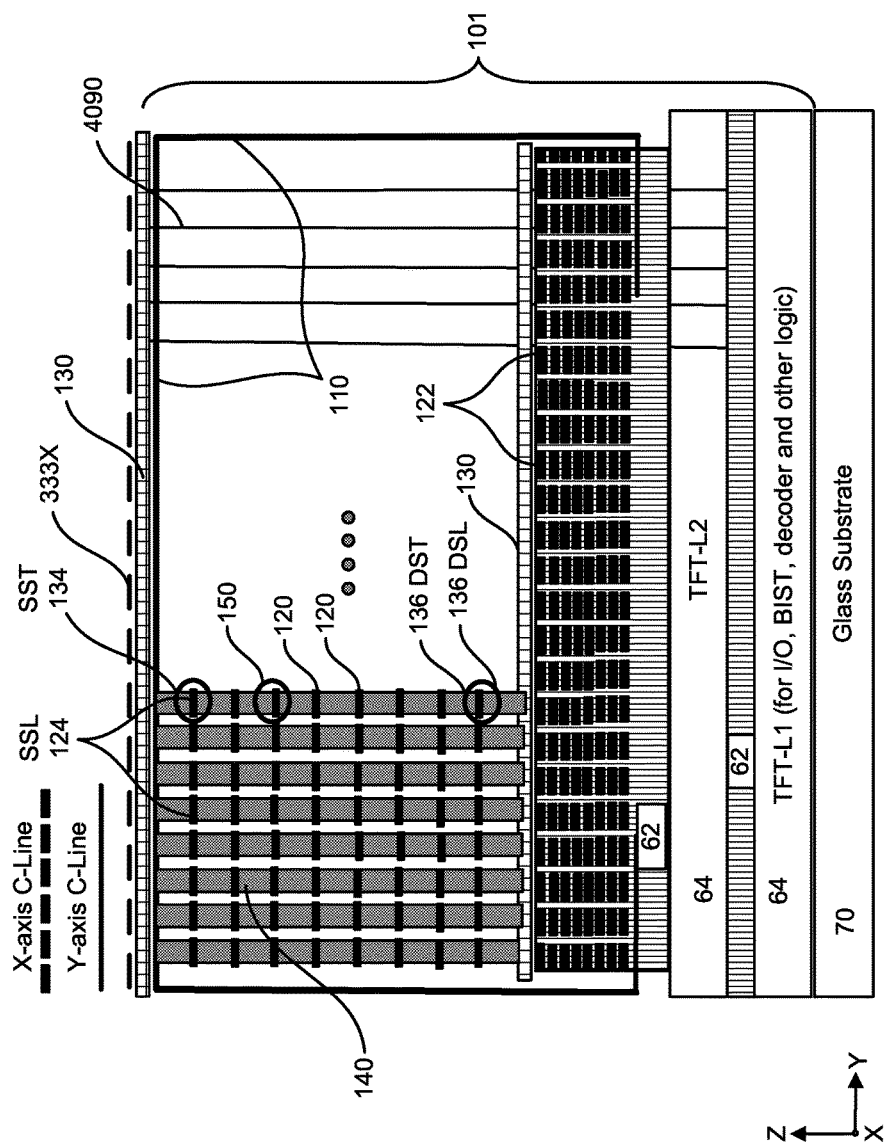
FIG. 16b is a cross section side view (right) of a vertical channel NAND flash type 3D memory device.

FIG. 16a and FIG. 16b illustrates a 3D memory device as applied to a vertical channel NAND flash memory device 101 whereby the channel conductive line is in the z-axis direction such as the TCAT and BiCS technologies promoted by Samsung and Toshiba respectively. In FIG. 16a, TFTs 64 are fabricated on an insulative (e.g., glass) substrate 70. These TFTs may perform the functions of I/O, BIST, decoder logic, driving and other logic. The TFTs may be one or more layers and need not be the first layer on the substrate as shown in FIG. 16a. Vertical channel conductive lines 140 (z-axis conductive lines) connect to the memory cells in the vertical NAND string (details of memory cells in NAND string NS not shown) and connect on top to bit lines 110 (y-axis conductive lines). Word lines 120 (x-axis conductive lines) are connected to the memory cells in common in the x-direction. The intersection of word lines 120 and vertical channel conductive lines 140 are memory cell regions 150 where the memory transistor and charge storage layers (details not shown) are located. Other x-axis conductive lines may include source select lines SSL, drain select lines DSL (or ground select lines GSL) and common source lines CSL. A source select transistor 134 (details not shown) is located at the intersection of source select lines 124 and bit lines 110 near the top of a memory string; a drain select transistor 136 (details not shown) is located at the bottom of the memory string at the intersection of drain select lines 134 and vertical channel conductive lines 140. All x-axis conductive lines 122 (word lines 120, SSL, DSL, CSL) and y-axis conductive lines (bit lines 110) are routed such that TFTs may connect to them and be substantially positioned above or below the memory cells. The source select transistors 124, drain selector transistors 136, and transistor which is located at the memory cell region 150 are all TFTs fabricated with low thermal budgets and enabling a plurality of memory arrays to be fabricated in the Z-axis direction. A ground plane 130 may be positioned above the TFT layers 64 such that the vertical channels 140 may all be connected in common to the ground plane. This same ground plane 130 can be utilized to provide a heat source and sink to the memory cells for control of thermal annealing to extend the lifetime of the memory. More than one ground plane 130 may be employed.

Second Embodiment

Some embodiments may also apply to vertical gate (VG-NAND) devices as promoted by Samsung whereby the gate (word) conductive lines are in the vertical (z-axis direction) and the channel conductive lines are either in the x-axis or y-axis direction. The ground plane connection therefore may be made at the periphery edge where the channel conductors terminate. The channel conductors and gate (word) conductors are all driven with TFTs which are substantially positioned above or below the memory cells. Appropriate routing of the conductive lines is made to accomplish this.

Third Embodiment

Some embodiments may also apply to dual gate TFT SONOS 3D flash memory devices as promoted by Andrew Walker, noted above. In this embodiment the channel conductive lines (bit lines) and dual gate conductive lines (word lines) are all in the x-axis or y-axis when connected to common memory cells. All conductive lines are driven with TFTs which are substantially positioned above or below the memory cells. Appropriate routing of the conductive lines is made to accomplish this.

The above embodiments 1-3 are only 3 of many different constructions of flash memory devices. As noted earlier, similar constructions can be applied to RRAM, PCRAM, MRAM, NRAM, FeRAM and other memory technologies. Furthermore, 2D planar constructions of memory devices may also be applied to the embodiments disclosed herein.

Fourth Embodiment

Figure 20A:
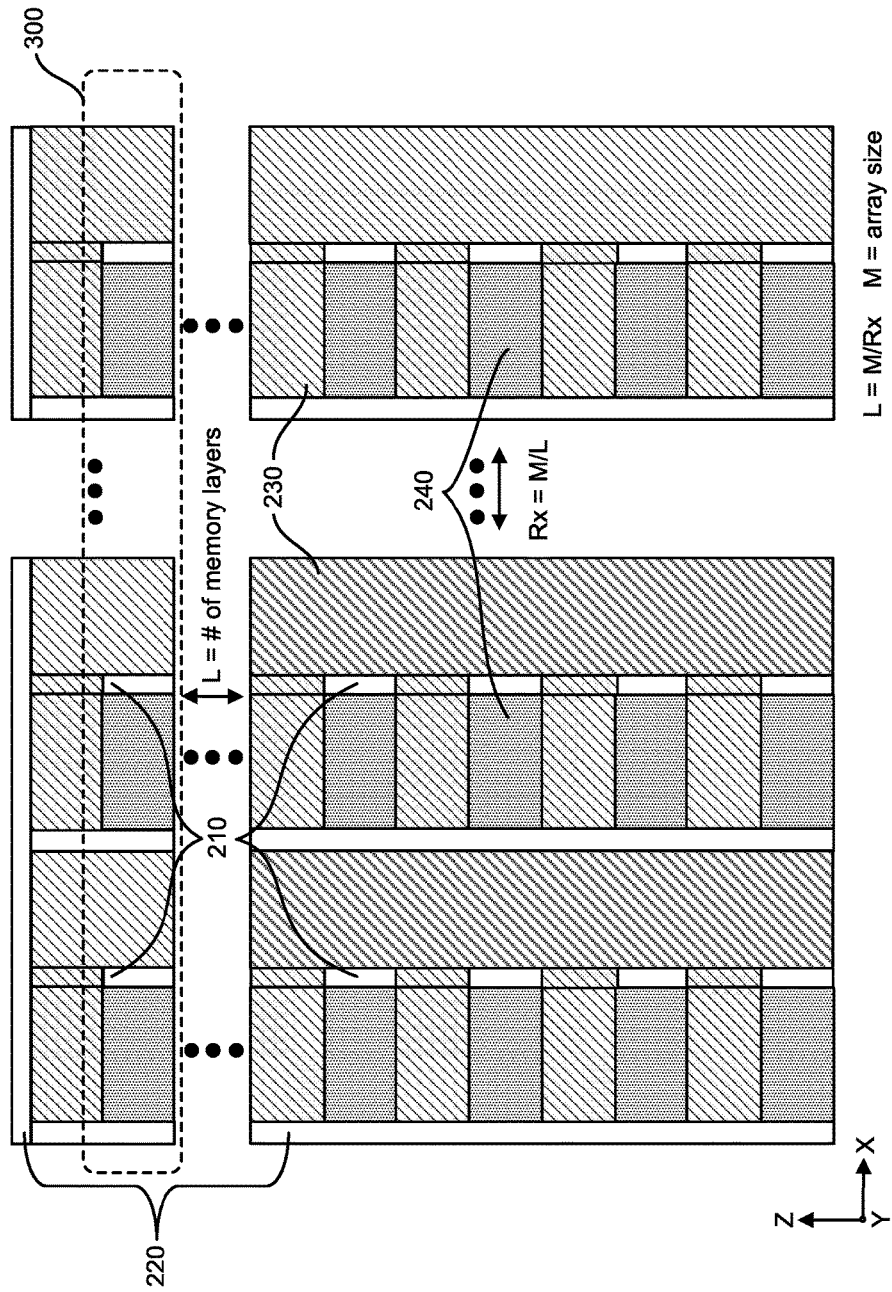
FIG. 20a is a cross section side view (front) of a 3D volumetric crosspoint memory array.
Figure 20C:
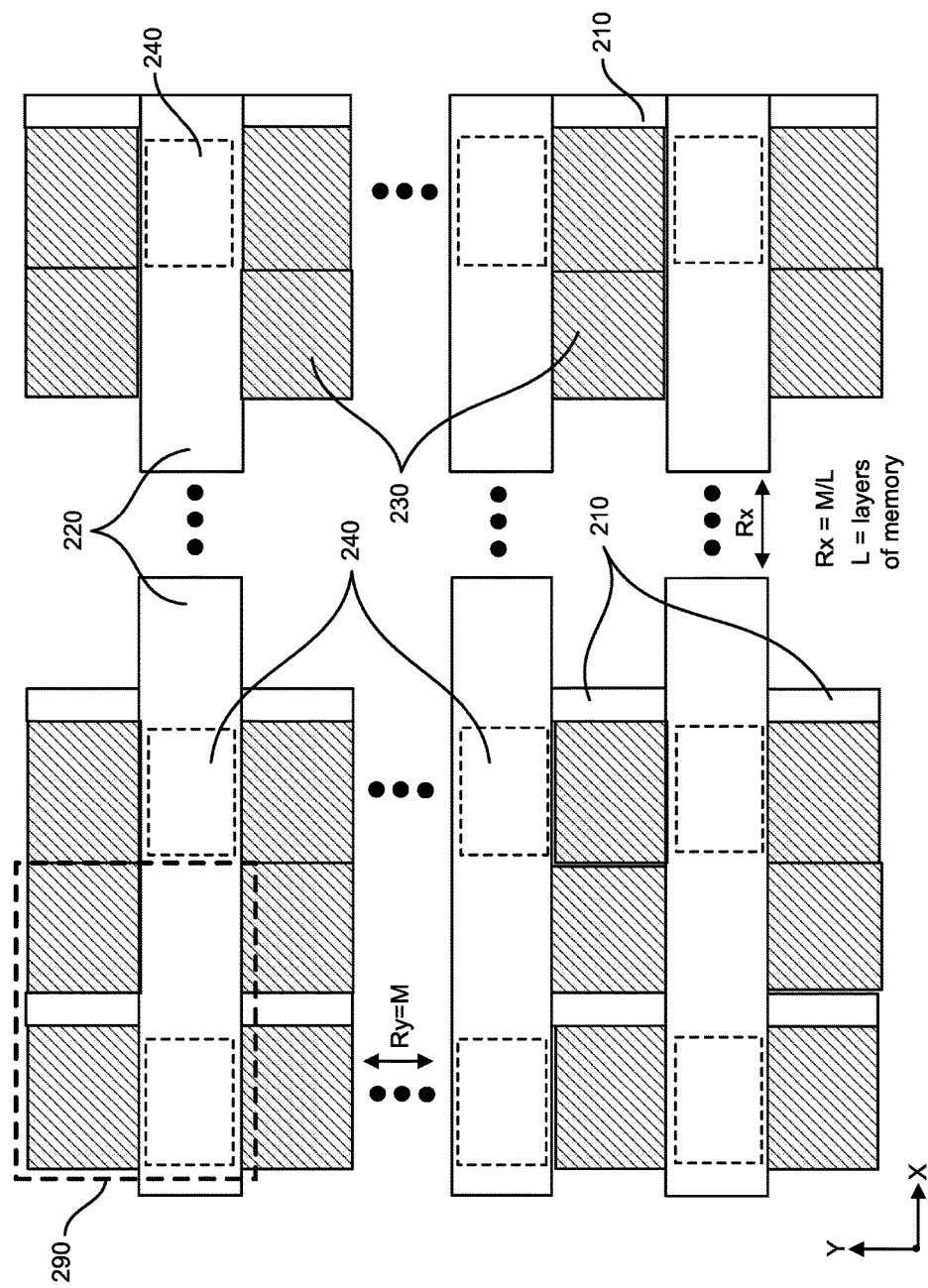
FIG. 20c is a cross section top view of a 3D volumetric crosspoint memory array.
Figure 20D:
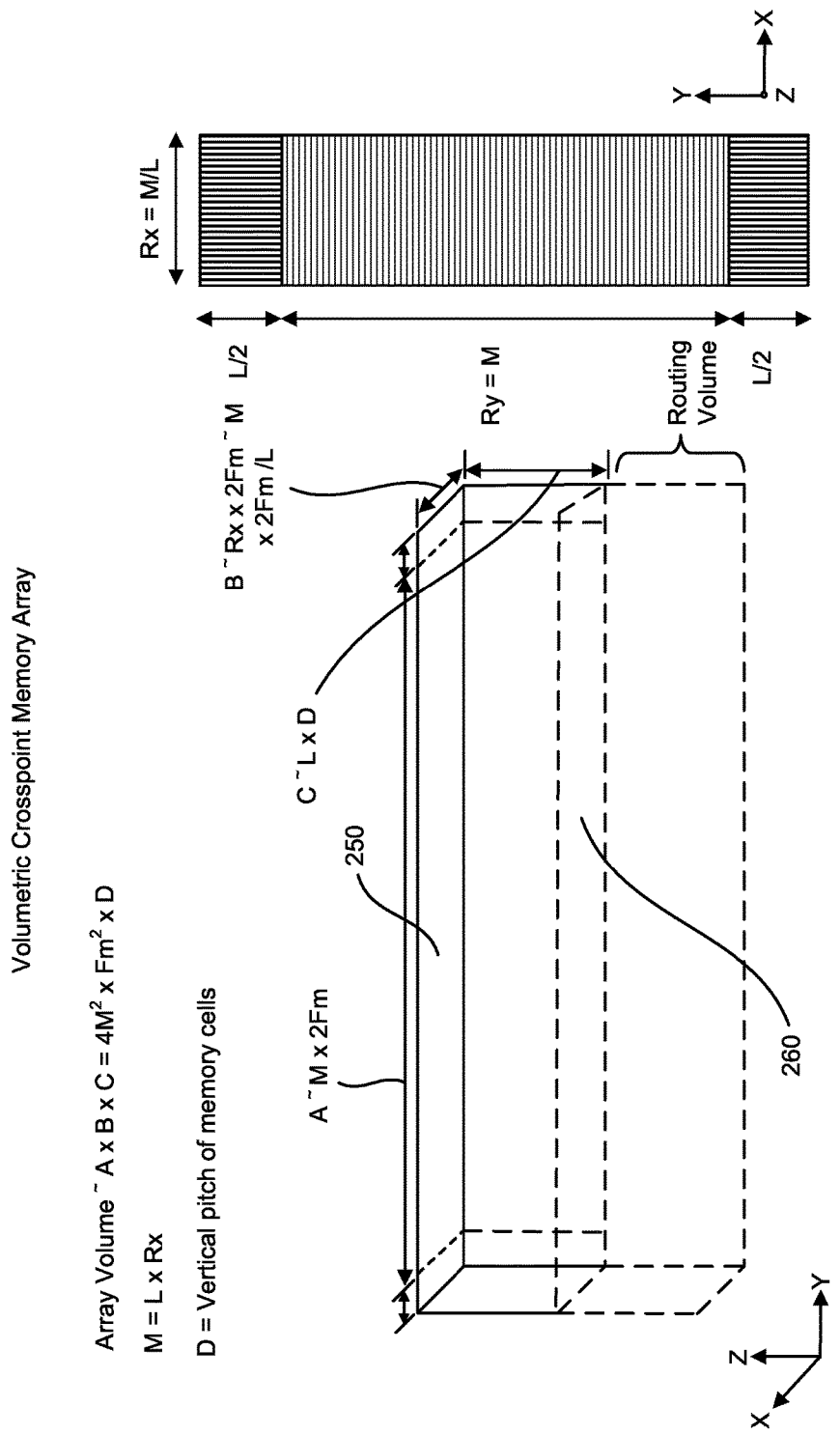
FIG. 20d is an illustration to describe the volumetric dimensions of a 3D volumetric crosspoint memory array.

FIG. 20a-FIG. 20d describes a 3D memory array of the volumetric crosspoint memory array type. A plurality of memory layers (300) are arranged in the z-axis direction. The memory cells (240) are located at the intersection (crosspoint) of the bit lines (210) and word lines (220). The bit lines (210) may be routed below the memory array as shown in FIG. 20b. Alternatively, they may be routed to the top of the memory array. And furthermore, a portion of the bit lines (210) may be routed above the memory array and a portion may be routed below the memory array. The latter method would minimize the periphery area required on the sides of the memory array for routing the bit lines. Word lines (220) may be routed to the top of the memory array as indicated in FIG. 20a or alternatively below the memory array. Thin film transistor (TFT) based circuity (e.g., decoder logic, sense circuits, addressing circuits, selection elements, etc.) for the memory array would be located above and/or below the memory array. Each bit line (210) and word line (220) is coupled to at least one thin film transistor; these TFTs are positioned substantially above or below the memory cells of the memory array. FIG. 17 is a top view illustration showing the interconnects of Y-axis (bit lines 210) and X-axis conductive lines (word lines routed above or below the array—220) at various intermediate points to allow for simple connection to an array of large transistors positioned above or below the memory cells. FIG. 20c indicates a memory cell area (290) of 4Fm². FIG. 20d is an illustration to describe the volumetric dimensions of the 3D volumetric crosspoint memory array. The 3D volumetric crosspoint memory array may be part of a 3D integrated circuit with other TFT-based logic fabricated on an insulator type substrate such as glass. Alternatively, the 3D volumetric crosspoint memory array may be an embedded memory residing above the conventional crystalline silicon circuitry of a CPU, GPU, FPGA, PLD, ASIC, ASSP, DSP, microcontroller, microprocessor or other integrated circuit which may reside on a silicon substrate.

Fifth Embodiment

Figure 21A:
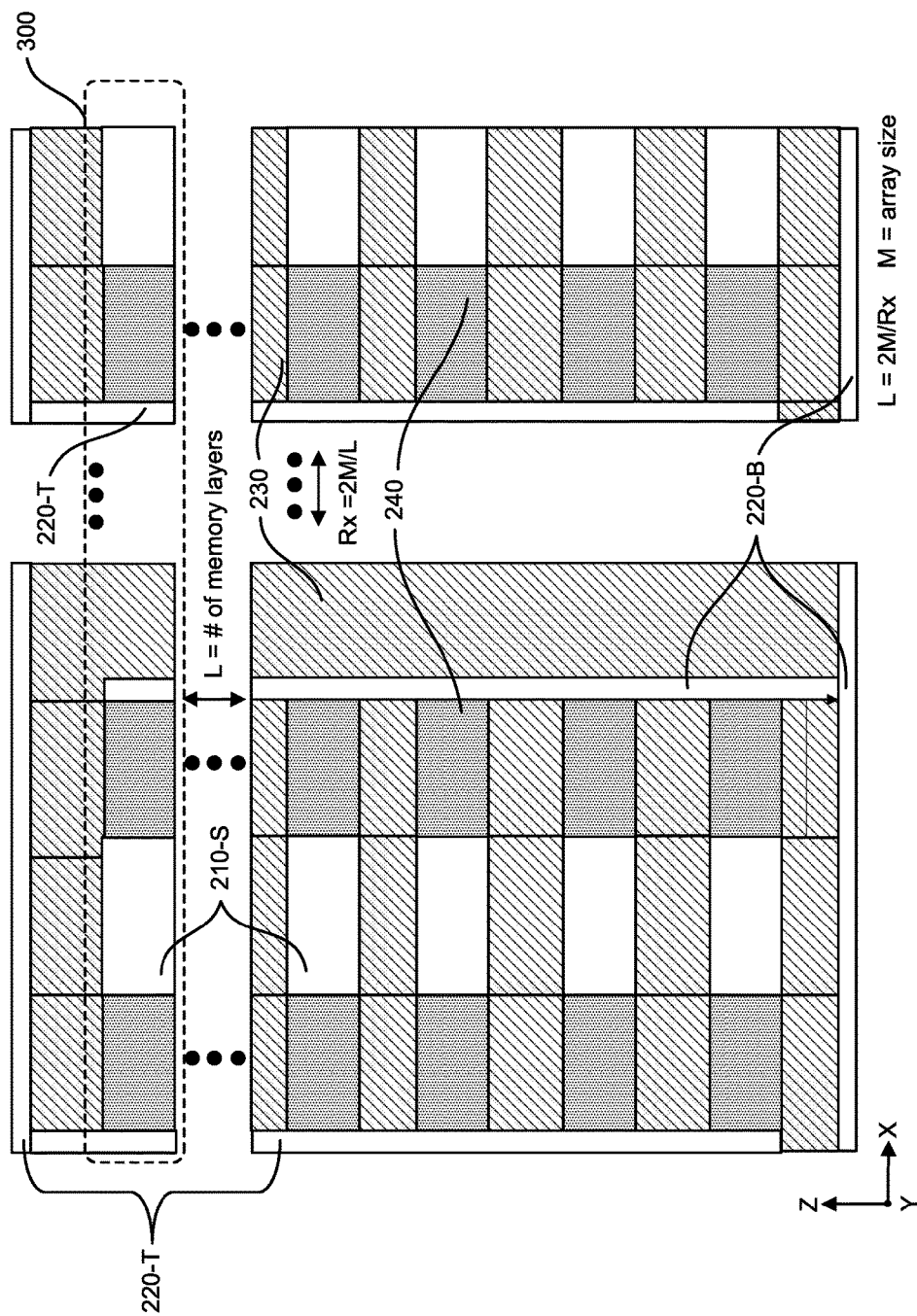
FIG. 21a is a cross section side view (front) of a 3D volumetric crosspoint memory array.
Figure 21B:
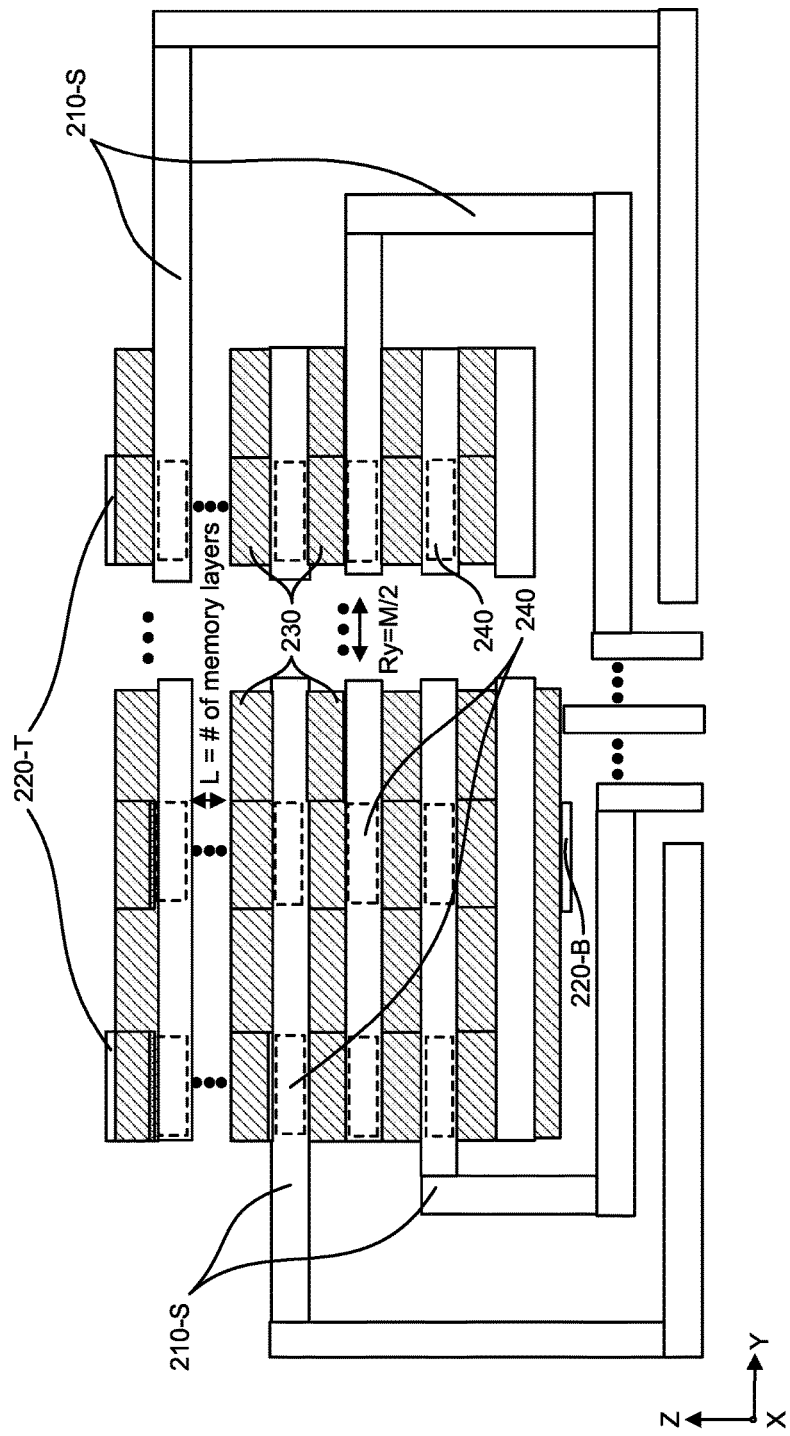
FIG. 21b is a cross section side view (right) of a 3D volumetric crosspoint memory array.
Figure 21C:
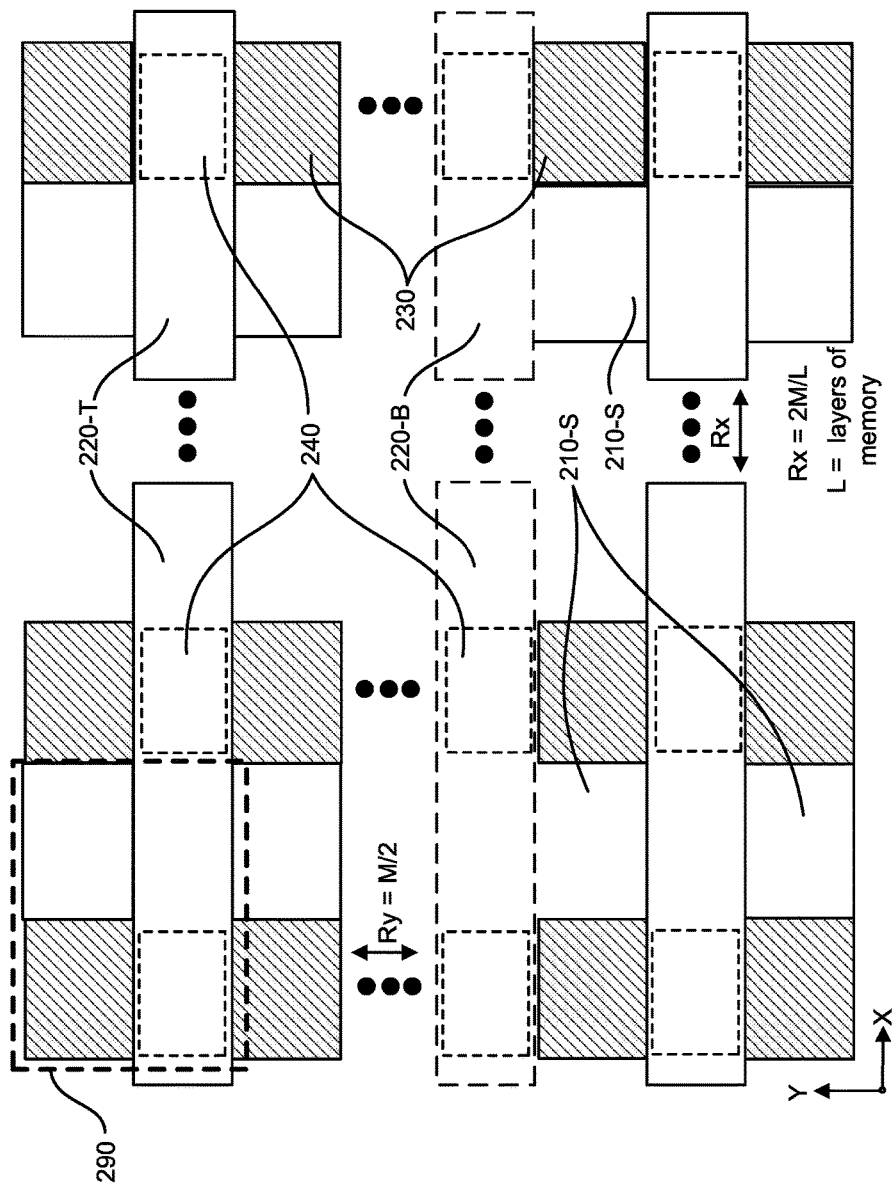
FIG. 21c is a cross section top view of a 3D volumetric crosspoint memory array.
Figure 21D:
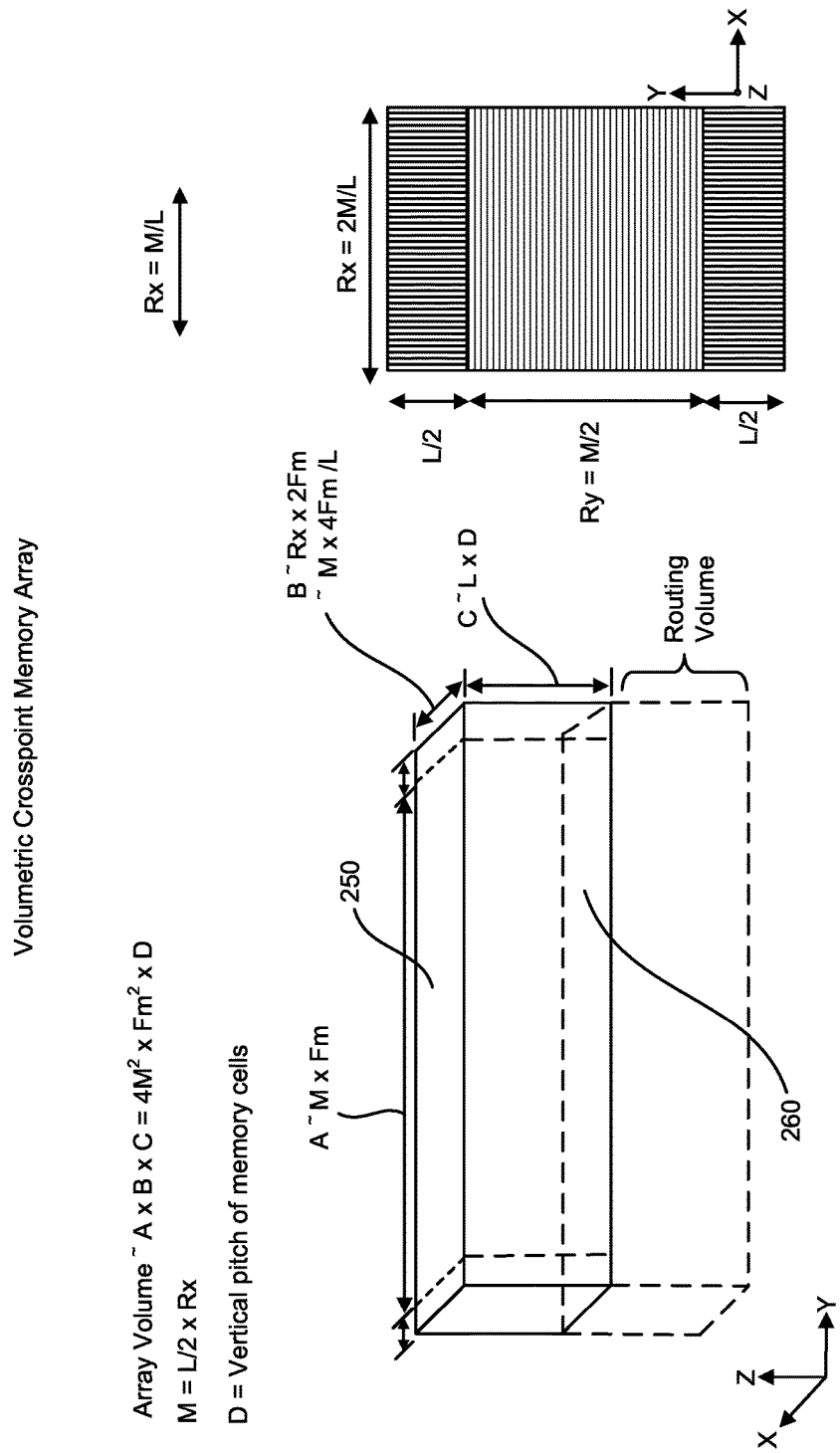
FIG. 21d is an illustration to describe the volumetric dimensions of a 3D volumetric crosspoint memory array.

FIG. 21a-FIG. 21d describes a 3D memory array of the volumetric crosspoint memory array type. A plurality of memory layers (300) are arranged in the z-axis direction. The memory cells (240) are located at the intersection (crosspoint) of the bit lines (210-S) and word lines (220-T and 220-B). Each bit line (210-S) is shared with memory cells (240) connected on opposite sides in the x-axis direction of the bit lite (210-S). The bit lines (210-S) may be routed below the memory array as shown in FIG. 21b. Alternatively, they may be routed to the top of the memory array. And furthermore, a portion of the bit lines (210-S) may be routed above the memory array and a portion may be routed below the memory array. The latter method would minimize the periphery area required on the sides of the memory array for routing the bit lines. A portion of the word lines (220-T) are routed to the top of the memory array and a portion of the word lines (220-B) are routed to the bottom of the memory array. Thin film transistor (TFT) based circuity (e.g., decoder logic, sense circuits, addressing circuits, selection elements, etc.) for the memory array would be located above and below the memory array. Each bit line (210-S) and word line (220T and 220-B) is coupled to at least one thin film transistor; these TFTs are positioned substantially above or below the memory cells of the memory array. FIG. 17 is a top view illustration showing the interconnects of Y-axis (bit lines 210-S) and X-axis conductive lines (word lines routed above 220-T or below 220-B the array) at various intermediate points to allow for simple connection to an array of large transistors positioned above or below the memory cells. FIG. 21c indicates a memory cell area (290) of 4Fm². FIG. 21d is an illustration to describe the volumetric dimensions of the 3D volumetric crosspoint memory array. The 3D volumetric crosspoint memory array may be part of a 3D integrated circuit with other TFT-based logic fabricated on an insulator type substrate such as glass. Alternatively, the 3D volumetric crosspoint memory array may be an embedded memory residing above the conventional crystalline silicon circuitry of a CPU, GPU, FPGA, PLD, ASIC, ASSP, DSP, microcontroller, microprocessor or other integrated circuit which may reside on a silicon substrate.

Sixth Embodiment

Figure 22A:
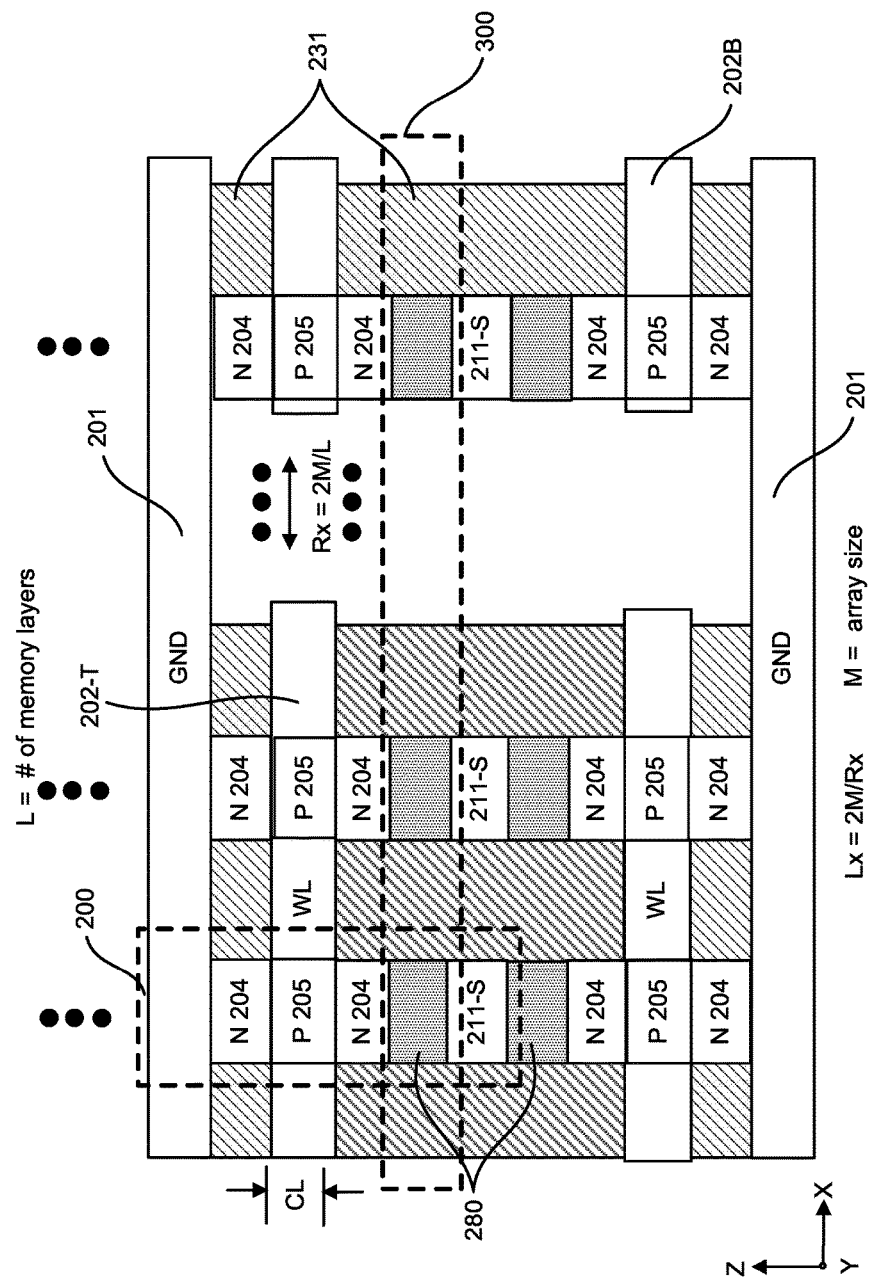
FIG. 22a is a cross section side view (front) of a 3D volumetric 1T1r memory array.
Figure 22B:
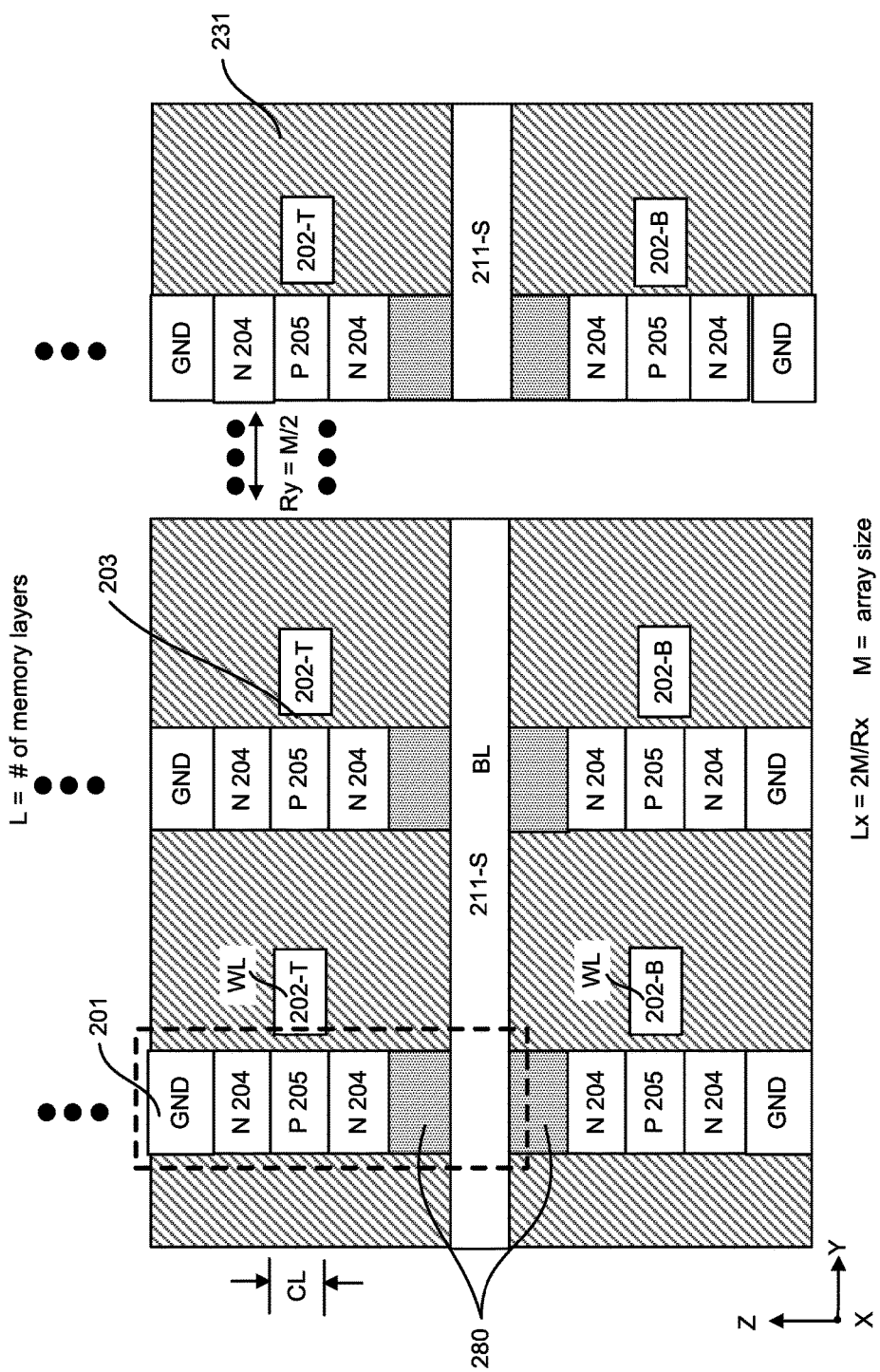
FIG. 22b is a cross section side view (right) of a 3D volumetric 1T1r memory array.
Figure 22C:
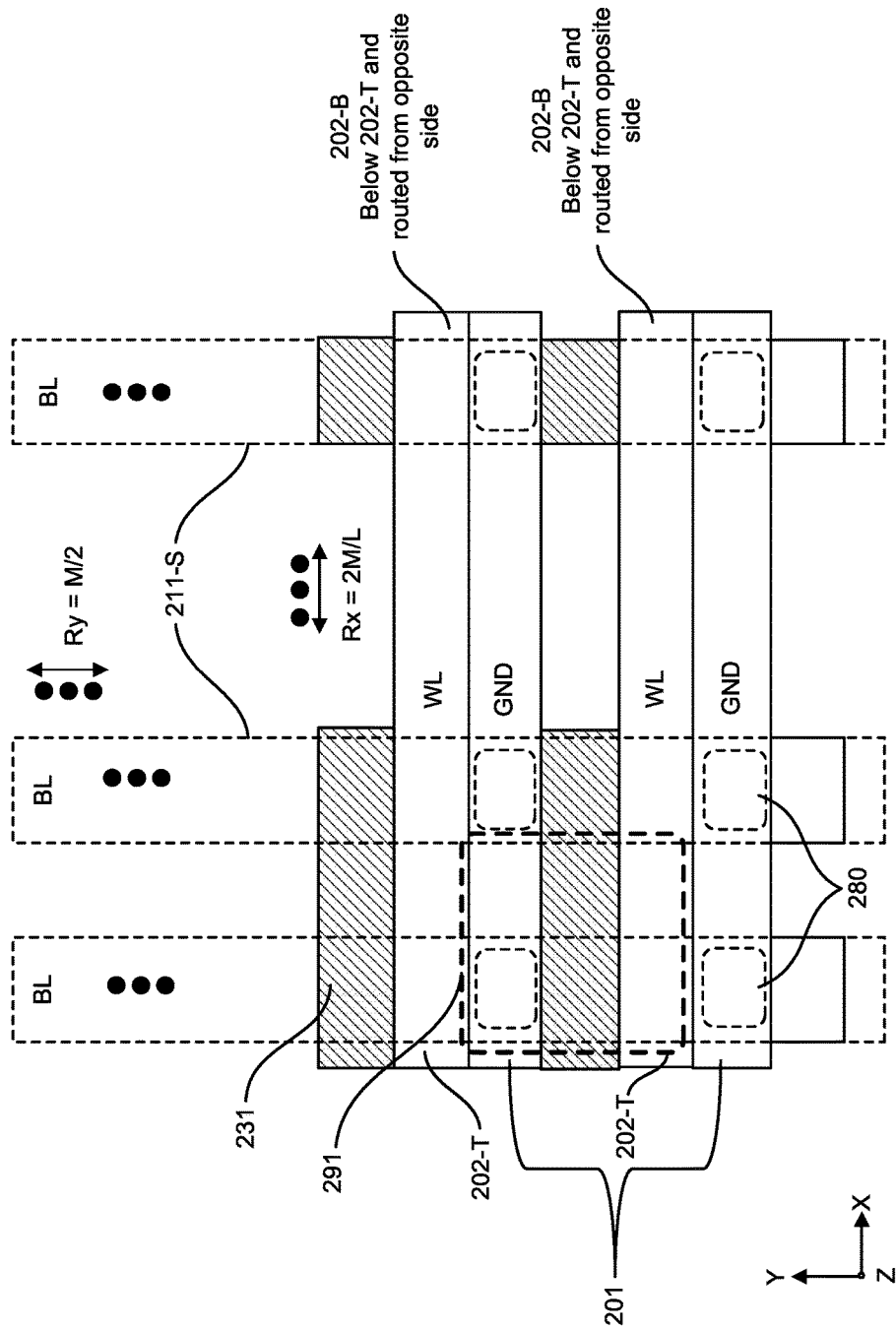
FIG. 22c is a cross section top view of a 3D volumetric 1T1r memory array.
Figure 22D:
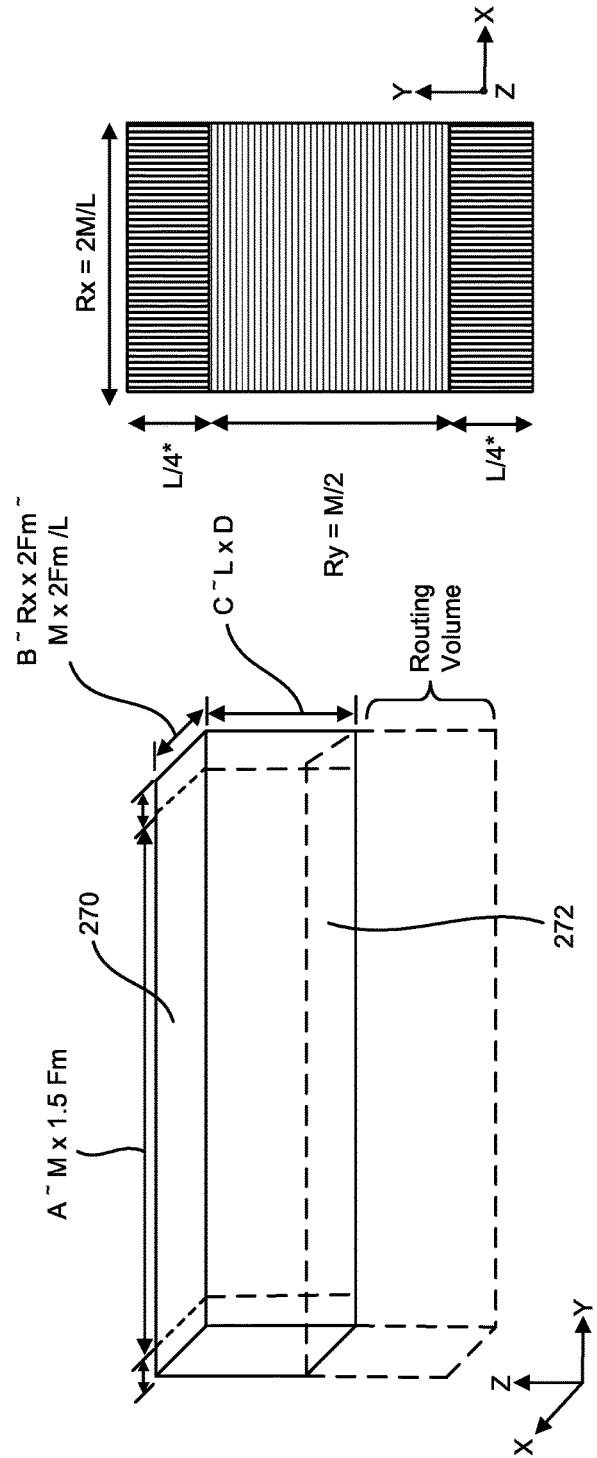
FIG. 22d is an illustration to describe the volumetric dimensions of a 3D volumetric 1T1r memory array.

FIG. 22a-FIG. 22d describes a 3D memory array of the volumetric 1T1R memory array type. A plurality of memory layers (300) are arranged in the z-axis direction. The memory cells (280) are located at the intersection of the bit lines (211-S) and word lines (202-T and 202-B)—addressed at each intersection with one vertical thin film transistor (200)—the complete transistor comprised of a ground electrode (201), n-type semiconductor material (204), p-type semiconductor material (205), memory cell (280), source/bit line electrode (211-S), and gate/word line electrode (202-T or 202-B). Each bit line (211-S) is shared with memory cells (280) connected on opposite sides in the z-axis (top and bottom) of the bit lite (211-S). As noted in U.S. Provisional Application No. 62/252,522 filed Nov. 8, 2015 by the inventors, the vertical TFTs (VTFTs) provide significant benefit in speed due to the small channel length (CL) provided by deposition means—not lithography—and a small insulator (203) thickness at the gate also provided by deposition means—not lithography. The bit lines (211-S) may be routed below the memory array; alternatively, they may be routed to the top of the memory array. And furthermore, a portion of the bit lines (211-S) may be routed above the memory array and a portion may be routed below the memory array. The latter method would minimize the periphery area required on the sides of the memory array for routing the bit lines. A portion of the word lines (202-T) are routed to the top of the memory array and a portion of the word lines (202-B) are routed to the bottom of the memory array. Thin film transistor (TFT) based circuity (e.g., decoder logic, sense circuits, addressing circuits, selection elements, etc.) for the memory array would be located above and below the memory array. Each bit line (211-S) and word line (202T and 202-B) is coupled to at least one thin film transistor; these TFTs are positioned substantially above or below the memory cells of the memory array. FIG. 17 is a top view illustration showing the interconnects of Y-axis (bit lines 211-S) and X-axis conductive lines (word lines routed above 202-T or below 202-B the array) at various intermediate points to allow for simple connection to an array of large transistors positioned above or below the memory cells. FIG. 22c indicates a memory cell area (291) of 6Fm². FIG. 22d is an illustration to describe the volumetric dimensions of the 3D volumetric 1T1R memory array. The 3D volumetric 1T1R memory array may be part of a 3D integrated circuit with other TFT-based logic fabricated on an insulator type substrate such as glass. Alternatively, the 3D volumetric 1T1R memory array may be an embedded memory residing above the conventional crystalline silicon circuitry of a CPU, GPU, FPGA, PLD, ASIC, ASSP, DSP, microcontroller, microprocessor or other integrated circuit which may reside on a silicon substrate.

Seventh Embodiment

Figure 23A:
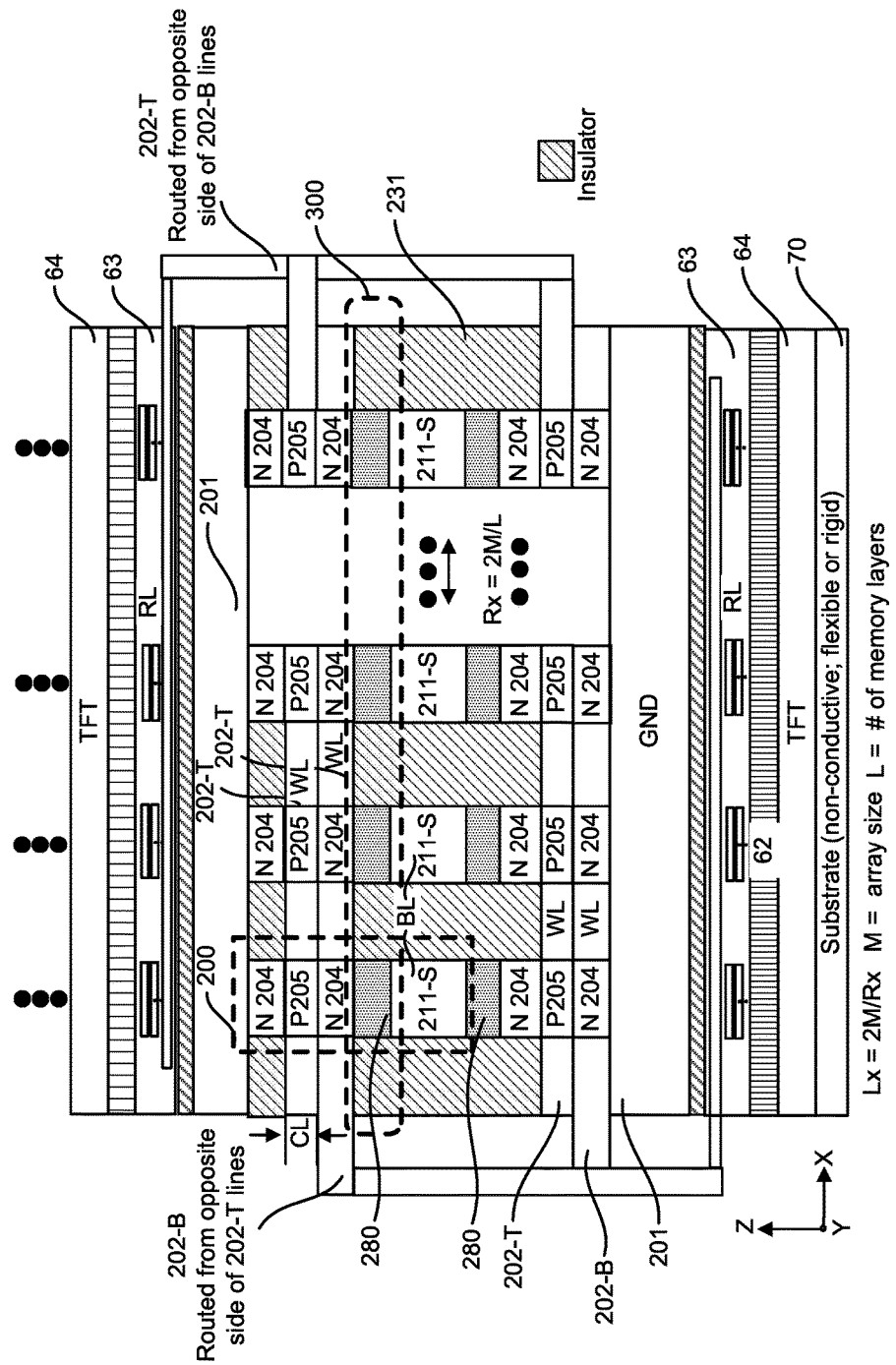
FIG. 23a is a cross section side view (front) of a 3D volumetric 1T1r memory array.
Figure 23B:
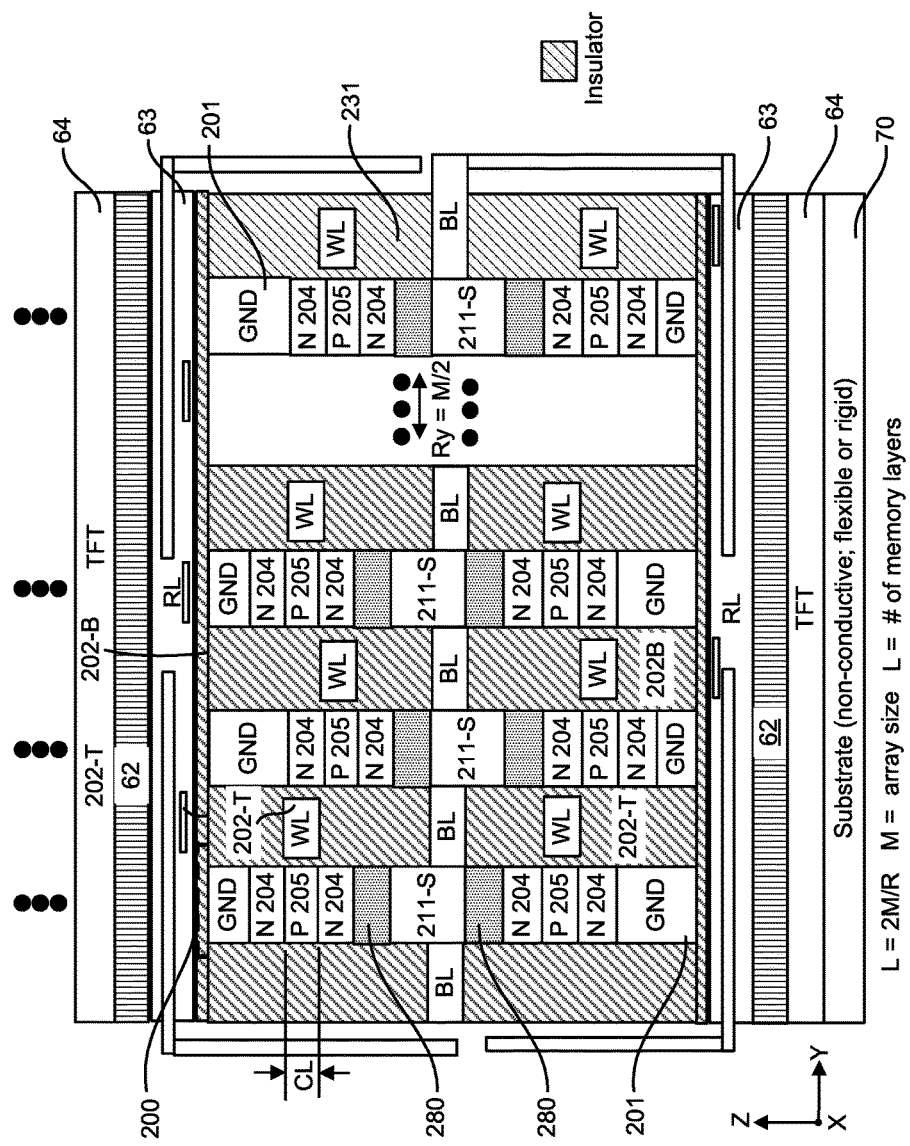
FIG. 23b is a cross section side view (right) of a 3D volumetric 1T1r memory array.

FIG. 23a-FIG. 23d describes a 3D memory array of the volumetric 1T1R memory array type. A plurality of memory layers (300) are arranged in the z-axis direction. The memory cells (280) are located at the intersection of the bit lines (211-S) and word lines (202-T and 202-B)—addressed at each intersection with one vertical thin film transistor (200)—the complete transistor comprised of a ground electrode (201), n-type semiconductor material (204), p-type semiconductor material (205), memory cell (280), source/bit line electrode (211-S), and gate/word line electrode (202-T or 202-B). Each bit line (211-S) is shared with memory cells (280) connected on opposite sides in the z-axis (top and bottom) of the bit lite (211-S). As noted in U.S. Provisional Application No. 62/252,522 filed Nov. 8, 2015 by the inventors, the vertical TFTs (VTFTs) provide significant benefit in speed due to the small channel length (CL) provided by deposition means—not lithography—and a small insulator (203) thickness at the gate also provided by deposition means—not lithography. The bit lines (211-S) may be routed below the memory array; alternatively, they may be routed to the top of the memory array. And furthermore, a portion of the bit lines (211-S) may be routed above the memory array and a portion may be routed below the memory array. The latter method would minimize the periphery area required on the sides of the memory array for routing the bit lines. A portion of the word lines (202-T) are routed to the top of the memory array and a portion of the word lines (202-B) are routed to the bottom of the memory array. Thin film transistor (TFT) based circuity (e.g., decoder logic, sense circuits, addressing circuits, selection elements, etc.) for the memory array would be located above and below the memory array. Each bit line (211-S) and word line (202T and 202-B) is coupled to at least one thin film transistor; these TFTs are positioned substantially above or below the memory cells of the memory array. FIG. 17 is a top view illustration showing the interconnects of Y-axis (bit lines 211-S) and X-axis conductive lines (word lines routed above 202-T or below 202-B the array) at various intermediate points to allow for simple connection to an array of large transistors positioned above or below the memory cells. The side view right in FIG. 23b illustrates the offset of the alternating material stacks for the memory and transistors thereby enabling the word lines (WL) to effectively act as the gate electrode for the VTFT (200) at the p-type semiconductor layer (205) without adversely affecting the adjacent material stack whereby the same word line (WL) acting as the gate electrode at the p-type semiconductor layer (205) is also in close proximity to the n-type semiconductor layer (204) of the adjacent material stack. FIG. 22c indicates a memory cell area (291) of $4Fm^2$. This small area is achievable due to the offset material stack mentioned in alternating material stacks. FIG. 22d is an illustration to describe the volumetric dimensions of the 3D volumetric 1T1R memory array. FIGS. 23e and 23f are illustrations of the routing of bit and word lines to both above and below the memory array for interconnect to TFTs. A combination of routing layers (63) and vias or interconnect layers (62) are employed for interconnection of the bit and word lines to the TFT layer(s) (64), which may be located above and/or below the volumetric memory array. The 3D volumetric 1T1R memory array may be part of a 3D integrated circuit with other TFT-based logic fabricated on an insulator type substrate such as glass. Alternatively, the 3D volumetric 1T1R memory array may be an embedded memory residing above the conventional crystalline silicon circuitry of a CPU, GPU, FPGA, PLD, ASIC, ASSP, DSP, microcontroller, microprocessor or other integrated circuit which may reside on a silicon substrate.

Figure 23C:
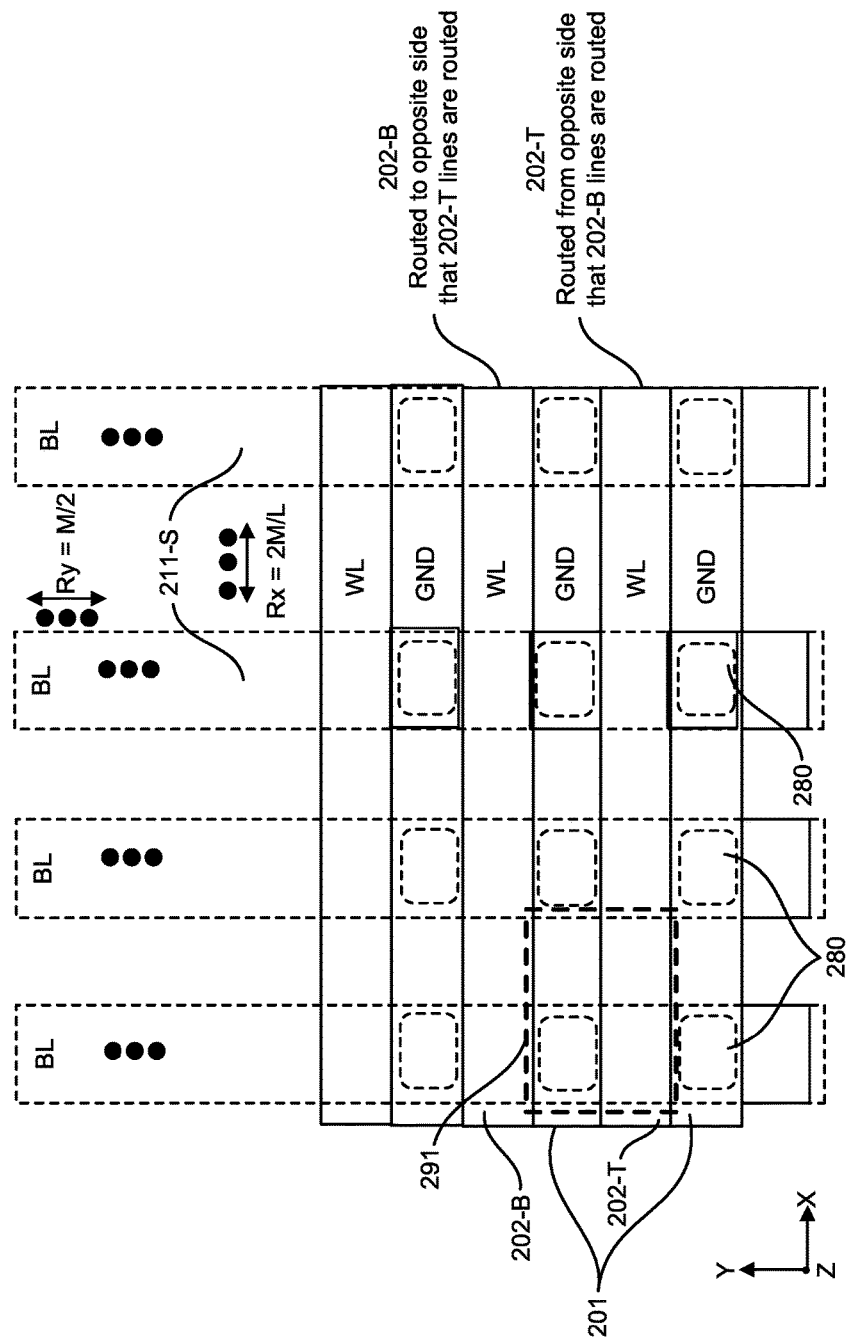
FIG. 23c is a cross section top view of a 3D volumetric 1T1r memory array.
Figure 23D:
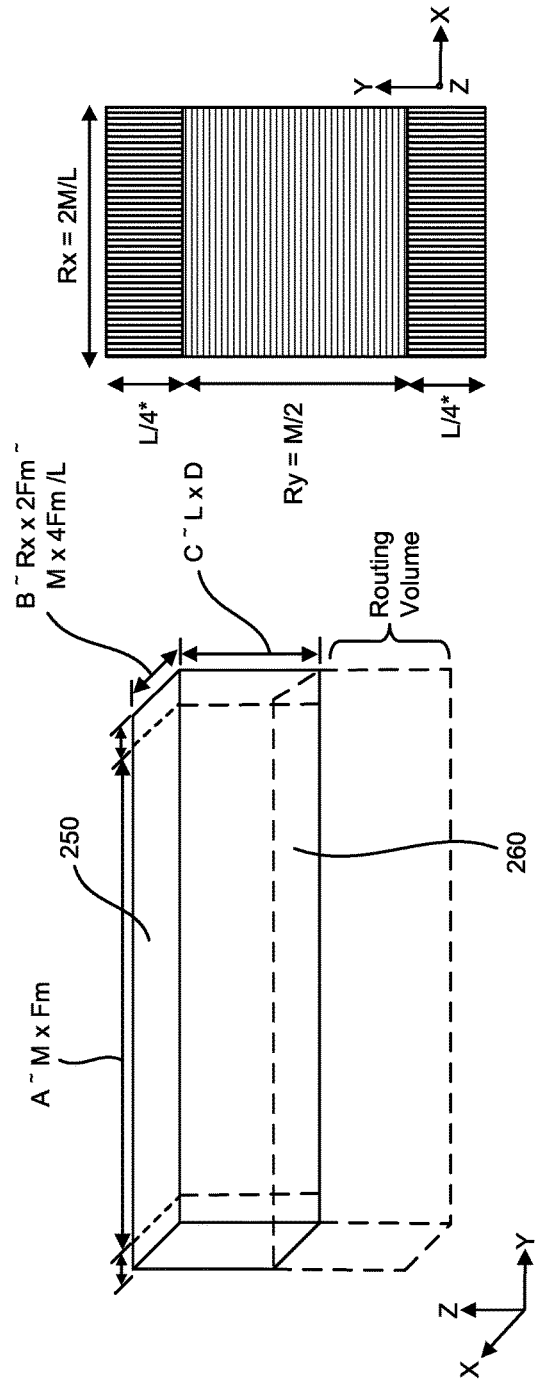
FIG. 23d is an illustration to describe the volumetric dimensions of a 3D volumetric 1T1r memory array.
Figure 23E:
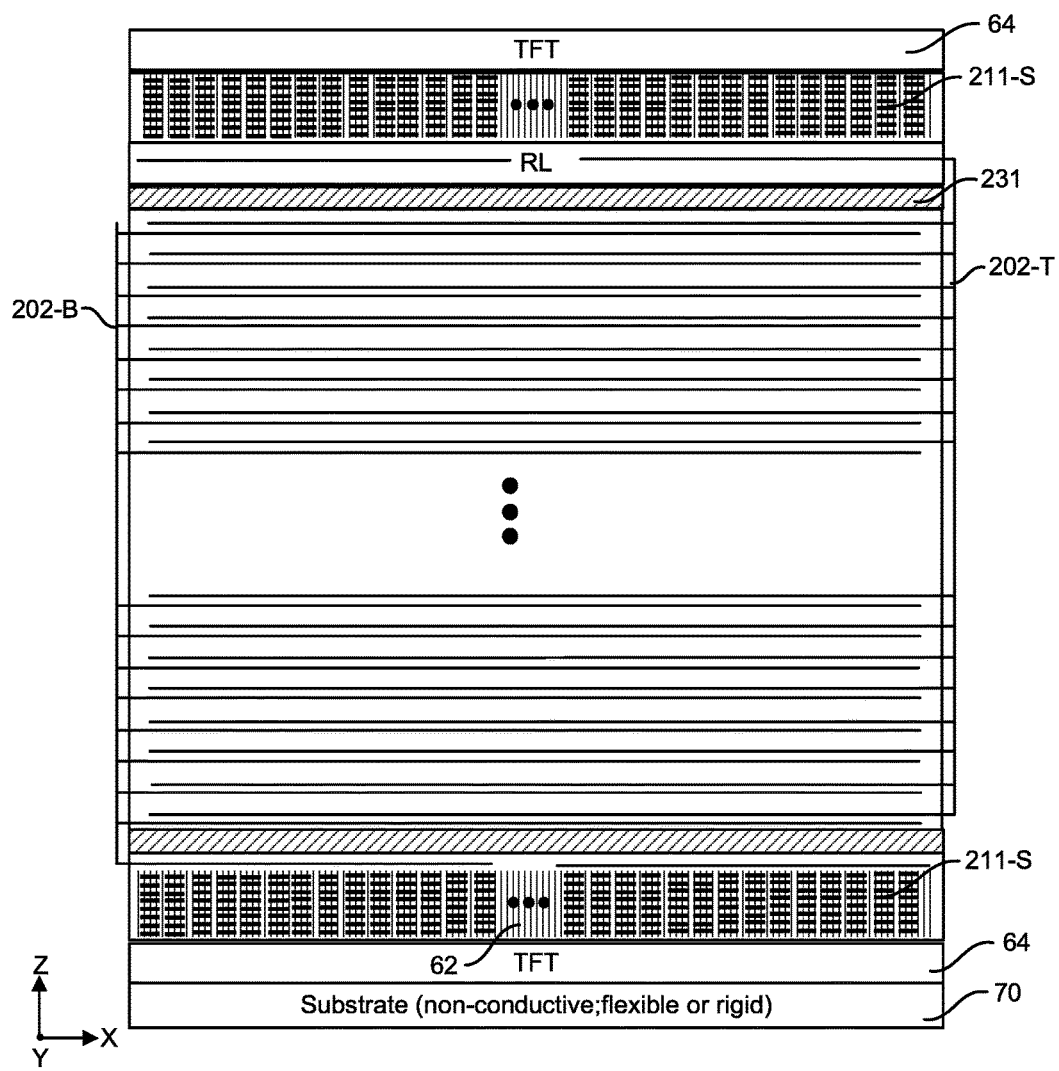
FIG. 23e is an illustration of the cross section side view (front) of a 3D volumetric memory array showing the routing of bit and word lines above and below the memory array for interconnection to TFTs.
Figure 23F:
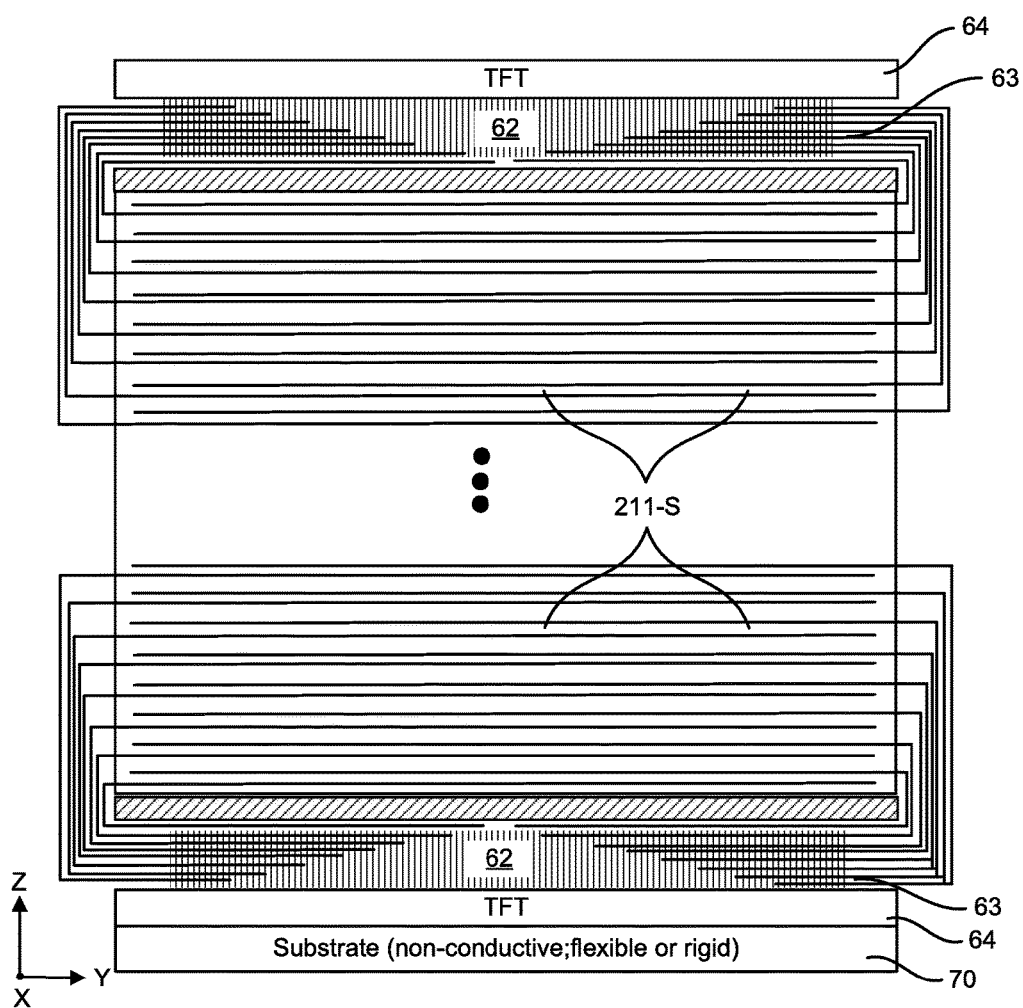
FIG. 23f is an illustration of the cross section side view (right) of a 3D volumetric memory array showing the routing of bit and word lines above and below the memory array for interconnection to TFTs.

In FIGS. 23a-c, a memory device is depicted in front view, side view, and top view, respectively. The memory device is formed on insulative substrate 70. First non-monocrystalline active device layer 64 is deposited on top of insulative substrate 70. First non-monocrystalline active device layer 64 can include a plurality of active devices. Active devices can include transistors, thyristors, diodes, optoelectronic devices, etc. For example, first non-monocrystalline active device layer 64 might be processed as decoder logic, sense circuitry, and/or drivers for the memory device. In some embodiments, first non-monocrystalline active device layer 64 might be processed as a processor, for example. A first insulative layer is deposited upon first non-monocrystalline active device layer 64.

A three-dimensional volumetric memory array is disposed on top of the first insulative layer. The term "three-dimensional volumetric memory array," here refers to memory arrays that have storage elements distributed along three independent directions, which span a three dimensional space. For example, storage elements that are distributed along three perpendicular spatial directions will be referred to as a three-dimensional volumetric memory array. The three-dimensional volumetric memory array is electrically connected to first non-monocrystalline active device layer 64 via a plurality of vias 62.

A second insulative layer is deposited upon the three-dimensional volumetric memory array. Second non-monocrystalline active device layer 64 is disposed on the second insulative layer. Second non-monocrystalline active device layer 64 can include a plurality of active devices. Second non-monocrystalline active device layer 64 is electrically connected to first three-dimensional volumetric memory array via a plurality of vias 62.

Various embodiments may have one or more additional non-monocrystalline active device layers, and/or one or more additional three-dimensional volumetric memory arrays. In some embodiments, one or more additional non-monocrystalline active device layer may be disposed below the three-dimensional volumetric memory array. In some embodiments, one or more additional non-monocrystalline active device layer may be disposed above the three-dimensional volumetric memory array. In some embodiments, additional non-monocrystalline active device layers may be disposed both above and below the three-dimensional active device layers.

Non-monocrystalline active device layer(s) can be disposed and processed with a modest thermal budget. Using such a modest thermal budget permits the additional processing steps to create these additional non-monocrystalline active device layers(s) without causing significant changes to all processed structures that have been manufactured before the additional processing steps. Various types of non-monocrystalline active devices incur various thermal budgets. Those types that have lower thermal budgets can permit a greater number of such non-monocrystalline active device layers. These various types of non-monocrystalline active device layers have various tolerances to subsequent thermal exposures as well.

Thus non-monocrystalline active device layers that are processed early (e.g., toward the bottom of the memory device) can be allotted a relatively greater thermal budget, but can have a relatively greater thermal tolerance as well. The thermal budget available to non-monocrystalline active device layers, which are disposed above the three-dimensional volumetric memory array can be less than the thermal tolerance of each of the layers and/or structures therebelow. Thus, non-monocrystalline active device layers that are processed late (e.g., toward the top of the memory device) can be allotted a relatively lesser thermal budget, but can have a relatively lesser thermal tolerance as well.

Eighth Embodiment

Figure 24A:
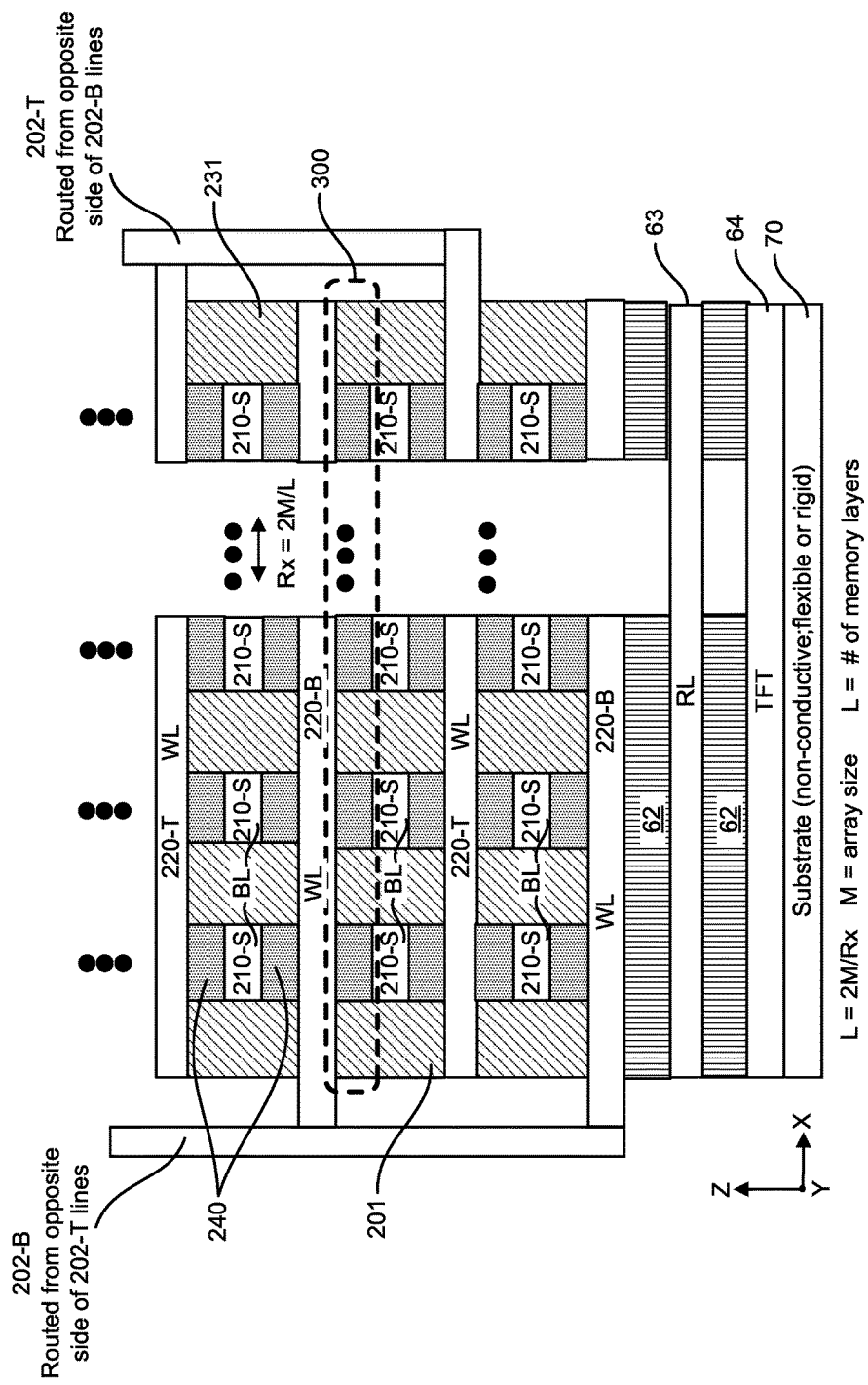
FIG. 24a is a cross section side view (front) of a 3D volumetric crosspoint memory array.
Figure 24B:
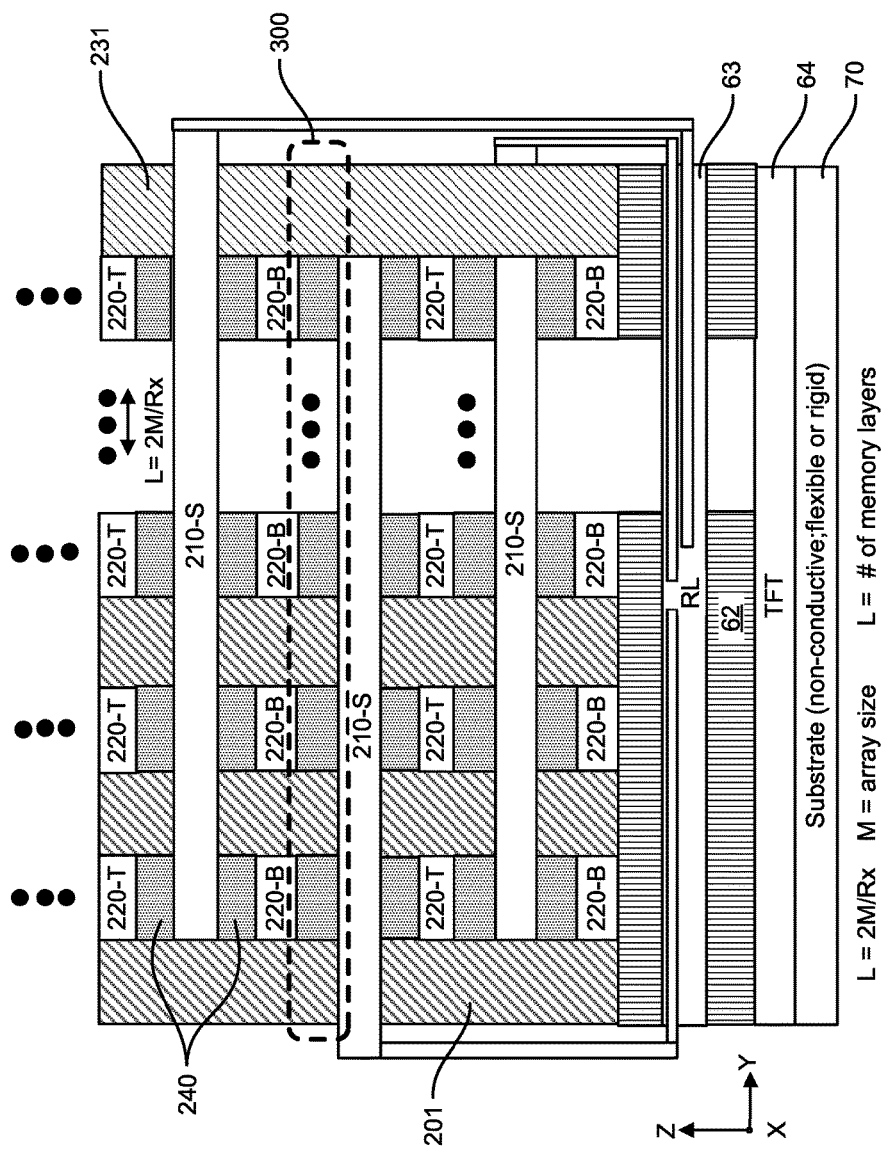
FIG. 24b is a cross section side view (right) of a 3D volumetric crosspoint memory array.
Figure 24C:
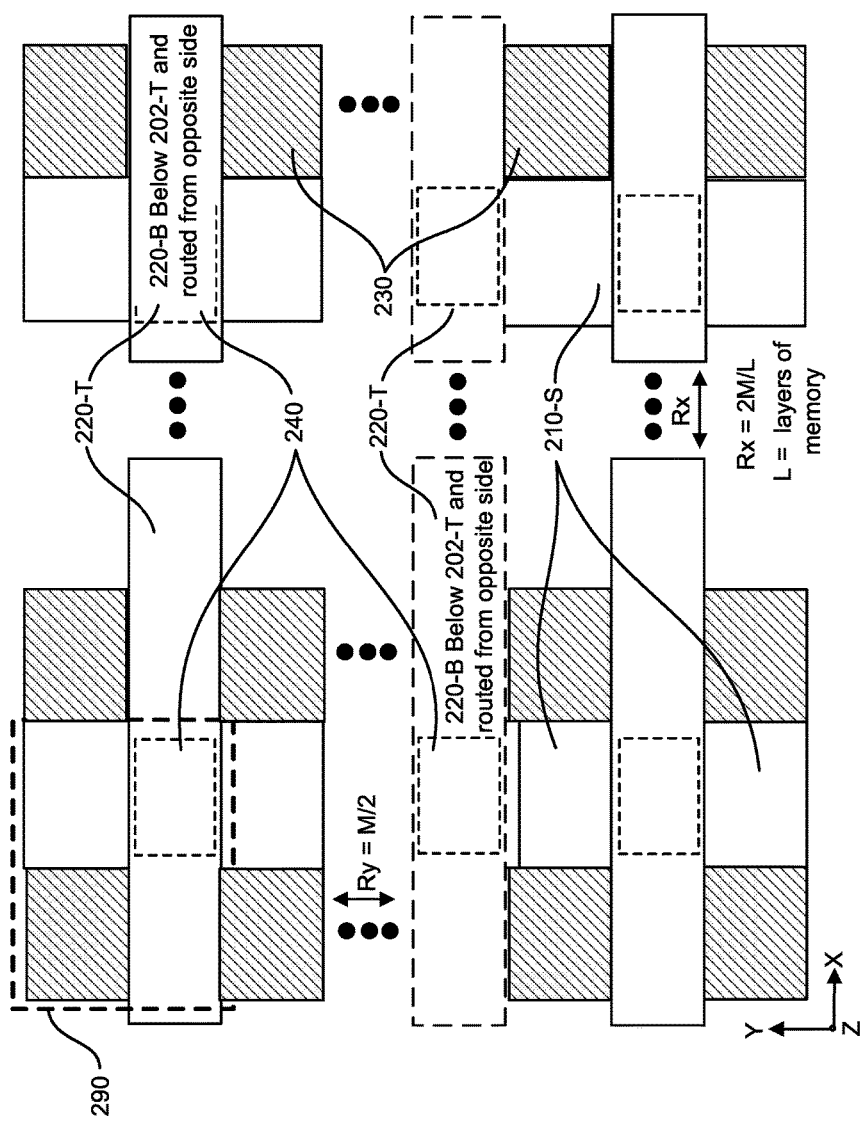
FIG. 24c is a cross section top view of a 3D volumetric crosspoint memory array.
Figure 24D:
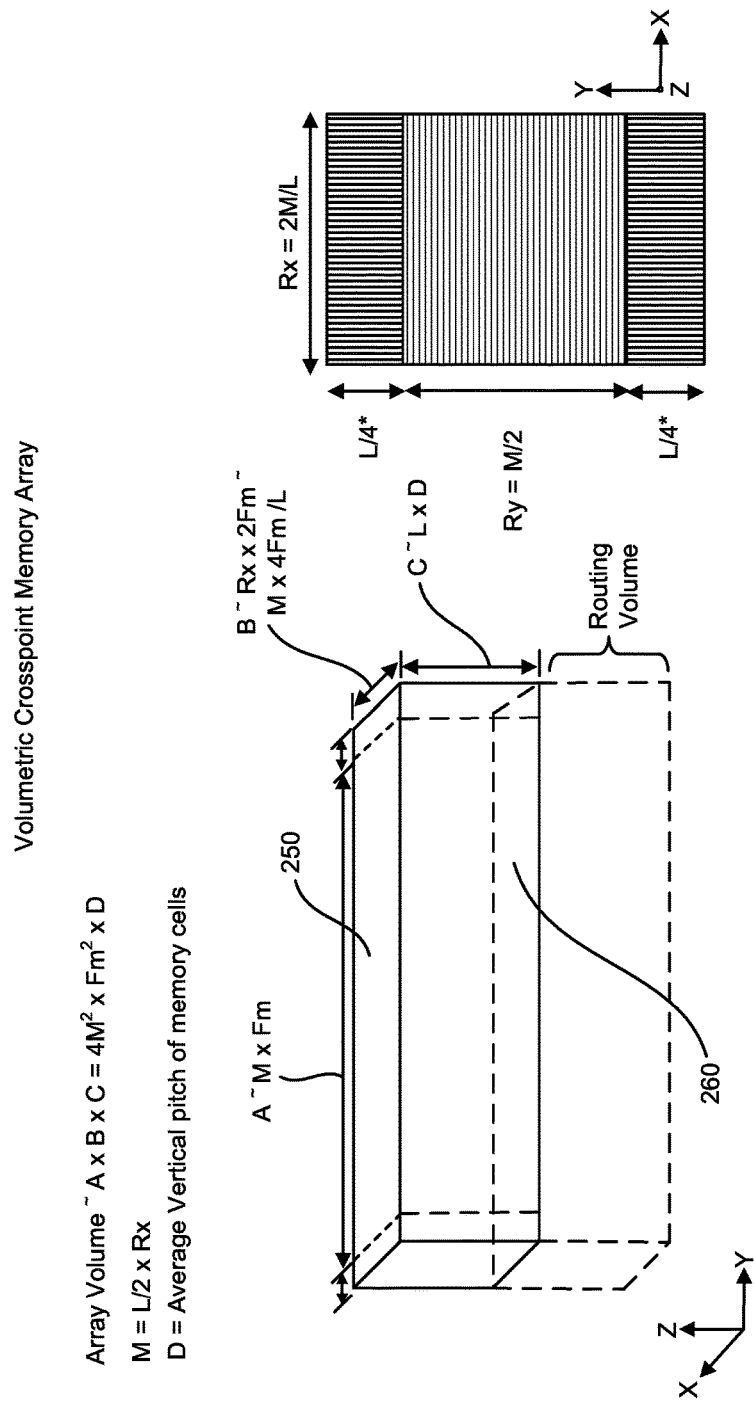
FIG. 24d is an illustration to describe the volumetric dimensions of a 3D volumetric crosspoint memory array.

FIG. 24a-FIG. 24d describes a 3D memory array of the volumetric crosspoint memory array type. A plurality of memory layers (300) are arranged in the z-axis direction. The memory cells (240) are located at the intersection (crosspoint) of the bit lines (210-S) and word lines (220-T and 220-B). Each bit line (210-S) is shared with memory cells (240) connected on opposite sides in the z-axis direction (above and below) of the bit lite (210-S). This sharing of a bit line by two memory cells (above and below the bit line) reduces the number of bit lines to route to the top or bottom of the memory array and thereby reduces masking costs and process steps, compared to other architectures whereby every memory layer has distinct bit line and not shared with another memory layer. Fewer bit lines to route also means less periphery area required for such routing. The bit lines (210-S) may be routed below the memory array as shown in FIG. 24b. Alternatively, they may be routed to the top of the memory array. And furthermore, a portion of the bit lines (210-S) may be routed above the memory array and a portion may be routed below the memory array. The latter method would further minimize the periphery area required on the sides of the memory array for routing the bit lines. A portion of the word lines (220-T) are routed to the top of the memory array and a portion of the word lines (220-B) are routed to the bottom of the memory array. Thin film transistor (TFT) based circuity (e.g., decoder logic, sense circuits, addressing circuits, selection elements, etc.) for the memory array would be located above and below the memory array. Each bit line (210-S) and word line (220T and 220-B) is coupled to at least one thin film transistor; these TFTs are positioned substantially above or below the memory cells of the memory array. FIG. 17 is a top view illustration showing the interconnects of Y-axis (bit lines 210-S) and X-axis conductive lines (word lines routed above 220-T or below 220-B the array) at various intermediate points to allow for simple connection to an array of large transistors positioned above or below the memory cells. FIG. 24c indicates a memory cell area (290) of 4Fm². FIG. 24d is an illustration to describe the volumetric dimensions of the 3D volumetric crosspoint memory array. The 3D volumetric crosspoint memory array may be part of a 3D integrated circuit with other TFT-based logic fabricated on an insulator type substrate such as glass. Alternatively, the 3D volumetric crosspoint memory array may be an embedded memory residing above the conventional crystalline silicon circuitry of a CPU, GPU, FPGA, PLD, ASIC, ASSP, DSP, microcontroller, microprocessor or other integrated circuit which may reside on a silicon substrate.

Ninth Embodiment

Figure 25:
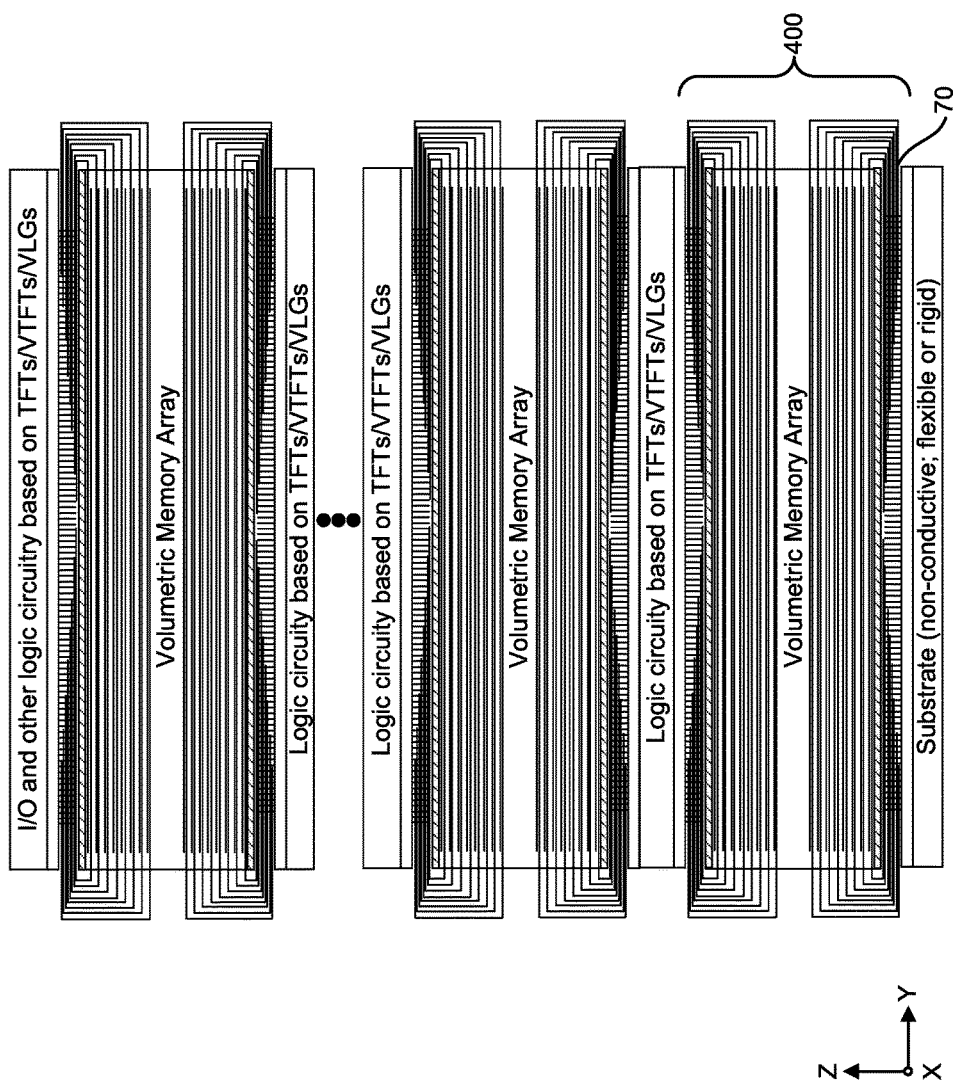
FIG. 25 is an illustration showing a plurality of volumetric memory array devices and logic circuitry stacked in the z-axis direction with I/O and other TFT-based circuitry on the top layer.
Figure 26A:
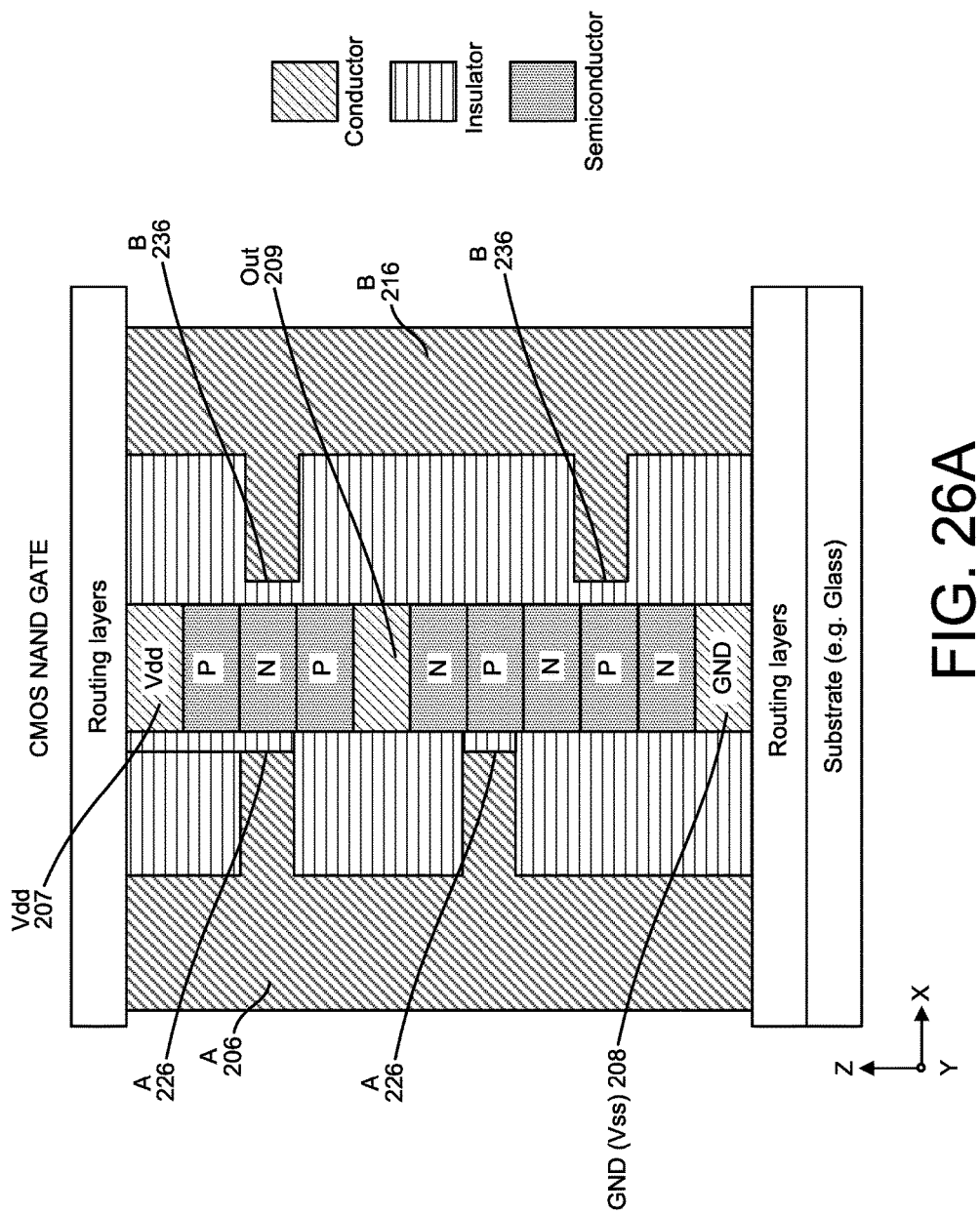
FIG. 26a and FIG. 26b—Side cross section illustrations of a VLG (CMOS NAND Gate type).
Figure 26B:
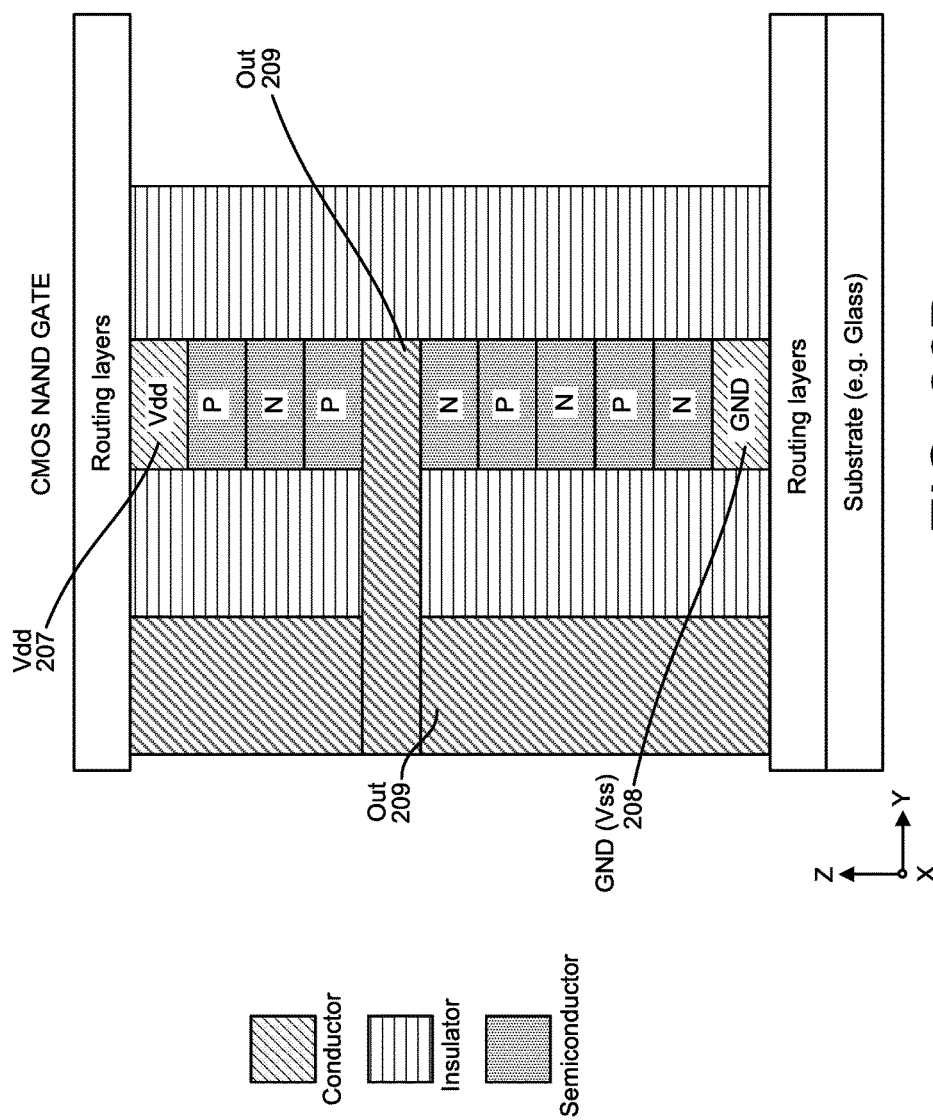
Figures 26C, 26D:
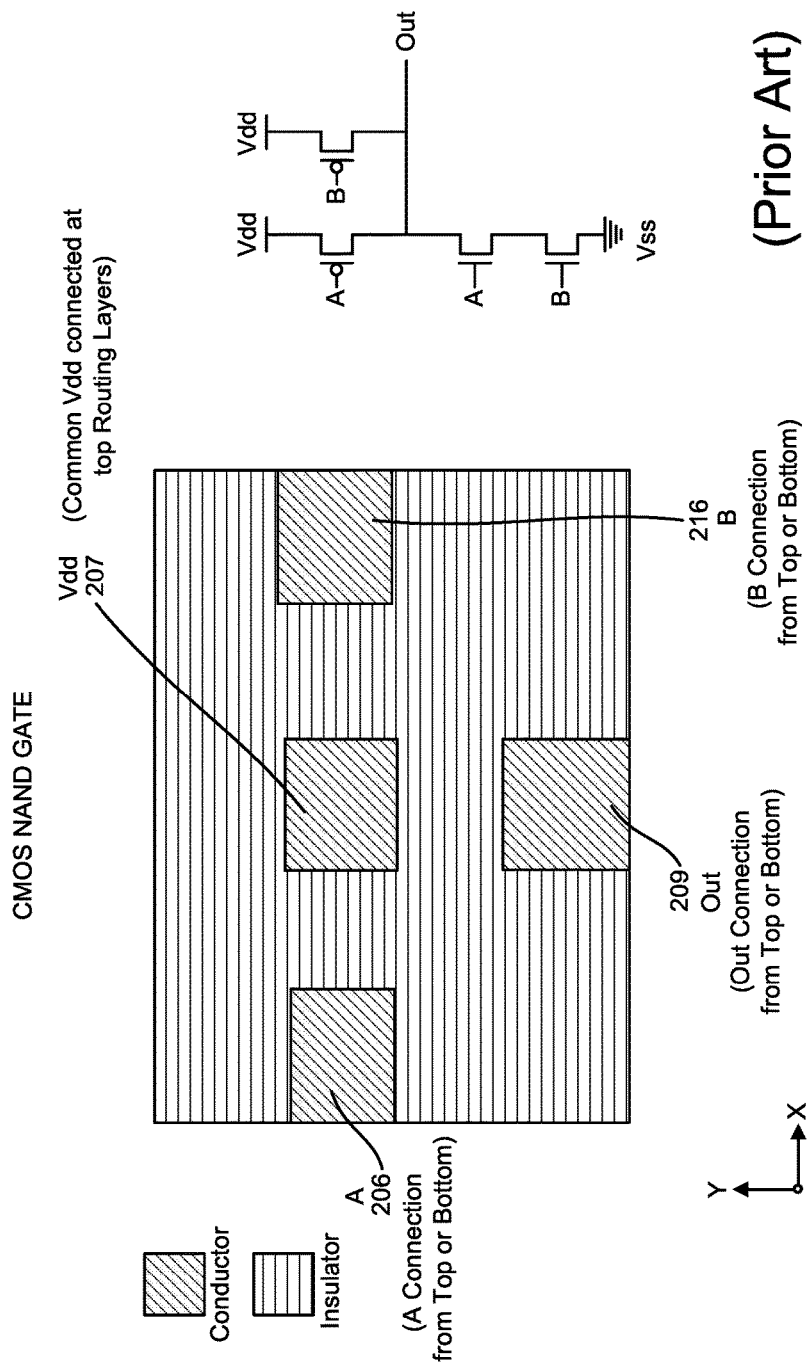
Figure 26E:
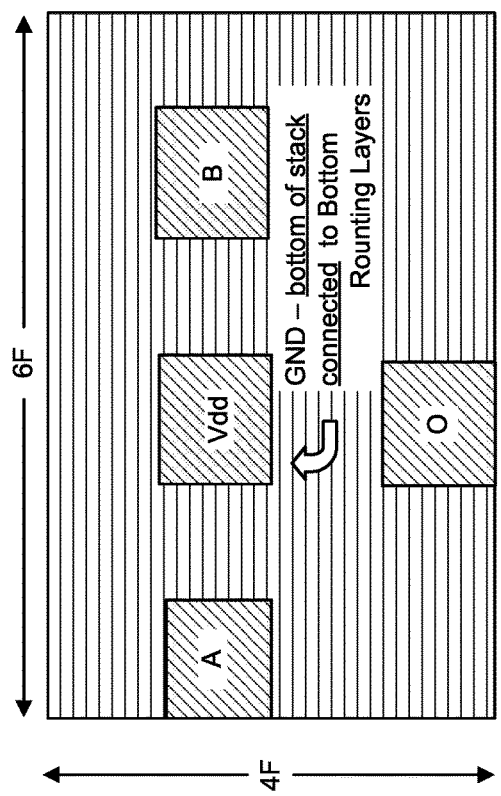

FIG. 25 is an illustration showing a plurality of volumetric memory array devices stacked in the z-axis direction with I/O and other TFT-based circuitry on the top layer. For example, a volumetric memory array device (400)—including either the crosspoint type or 1T1R type memory array—may have sixteen memory layers (300). By stacking 8 such memory array devices, a 3D integrated circuit of 128 total number of memory layers may be fabricated with minimal die area needed for periphery circuitry. The intermediate layers of TFTs (64) and the routing of bit and word lines to both the top and bottom of the memory arrays allows for very little space (die area) required for periphery circuitry. Since the top layer of the die may be used for I/O, a large number of I/O may be placed without die area penalty and provides for ultra-fast bandwidth as noted in the U.S. application Ser. No. 14/580,240, filed Dec. 23, 2014, which is incorporated in its entirety herein by reference. The plurality of 3D volumetric memory array devices may be part of a 3D integrated circuit with other TFT-based logic fabricated on an insulator type substrate such as glass. Alternatively, the plurality of 3D volumetric memory array devices may be an embedded memory residing above the conventional crystalline silicon circuitry of a CPU, GPU, FPGA, PLD, ASIC, ASSP, DSP, microcontroller, microprocessor or other integrated circuit which may reside on a silicon substrate.

Efficient Routing of Bit and Word Lines for TFT Placement and Maximum Die Area for Memory Area, Minimum Die Area for Periphery Circuitry, and Minimum Die Area for I/O Circuitry For each of the embodiments, the principles of the various embodiments are such that the word and bit lines are efficiently routed above, below or both above and below the memory array in order to enable positioning of the TFTs substantially above or below the memory cells. FIGS. 23e and 23f may apply to describing the routing of bit and word lines for all of the embodiments. It is most efficient (min area for periphery) to route bit and/or word lines to both above and below the memory array, but the various embodiments are not restricted as such and the invention should not be limited in scope to the routing of such bit and word lines for interconnect to TFTs above and/or below the memory array. Further, TFT-based I/O circuitry may be placed on the top layer such that no die area need be taken from the area utilized for memory arrays. This is described in U.S. application Ser. No. 14/580,240, filed Dec. 23, 2014, which is incorporated in its entirety herein by reference. Conductive bit and word lines may be copper, aluminum or other metal electrodes; since the TFTs which are subsequently fabricated may be fabricated at low BEOL temperatures (<450 C.), the electrodes are not restricted to high temperature electrodes such as Tungsten as is the necessary case in the 3D conventional NAND devices fabricated today with conventional crystalline and polycrystalline silicon transistors which are fabricated at process temperatures in excess of 1000 C.

Table I below provides estimates of the periphery area required for routing of the bit lines and word lines for the five embodiments referred to in FIGS. 20d, 21d, 22d, 23d and 24d—the fourth through eighth embodiments respectively. As indicated in the tables shown, for a volumetric memory array in size M=256 or larger and up to 16 memory layers in the array, the peripheral area (PA) is under 10% when bit lines and word lines are routed to both above and below the memory array. For M=1,024, up to 32 memory layers in a volumetric array, less than 6% die area would be required for the routing of bit and word lines above and/or below the memory array. Volumetric memory array devices may be monolithically stacked (i.e. fabricated) in the z-axis direction as indicated in FIG. 25. This stacking method allows then to stack for example 4 volumetric memory array devices with say 32 memory layers (array size, M=1,024), for a total of 128 layers of memory in a 3D integrated circuit device, with periphery area of under 6% required for routing of the bit and word lines. TFT-based logic circuitry may also be located between the volumetric memory array devices. Preferably the logic circuitry is comprised of Vertical Logic Gates such as described in FIG. 26a to FIG. 26h, FIG. 27a to FIG. 27g, FIG. 28a to FIG. 28f, FIG. 30a to FIG. 30e, FIG. 31a to FIG. 31e, FIG. 32a to FIG. 32e, FIG. 33a to FIG. 33e, FIG. 34a to FIG. 34c, FIG. 35a to FIG. 35e, and FIG. 36. The logic circuitry may be comprised of one or several layers of vertical logic gates. Preferably, the adjacent layer of vertical logic gates above or below another layer of vertical logic gates would be oriented such that the two Vdd connections would be facing each other or the two Ground connections would be facing each other. This approach would minimize the routing requirements of Vdd and Ground.

Figure 1:
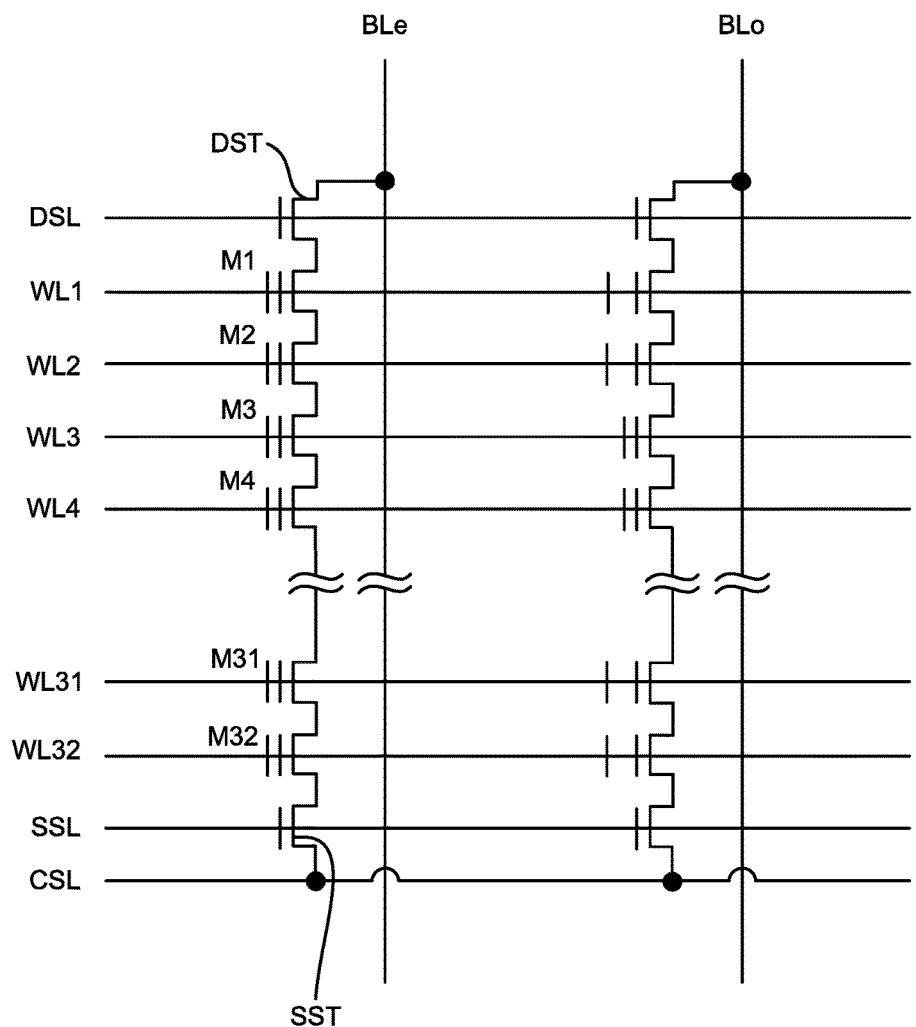
FIG. 1 is an electrical schematic diagram of a NAND flash memory according to a prior art.
Figure 2:
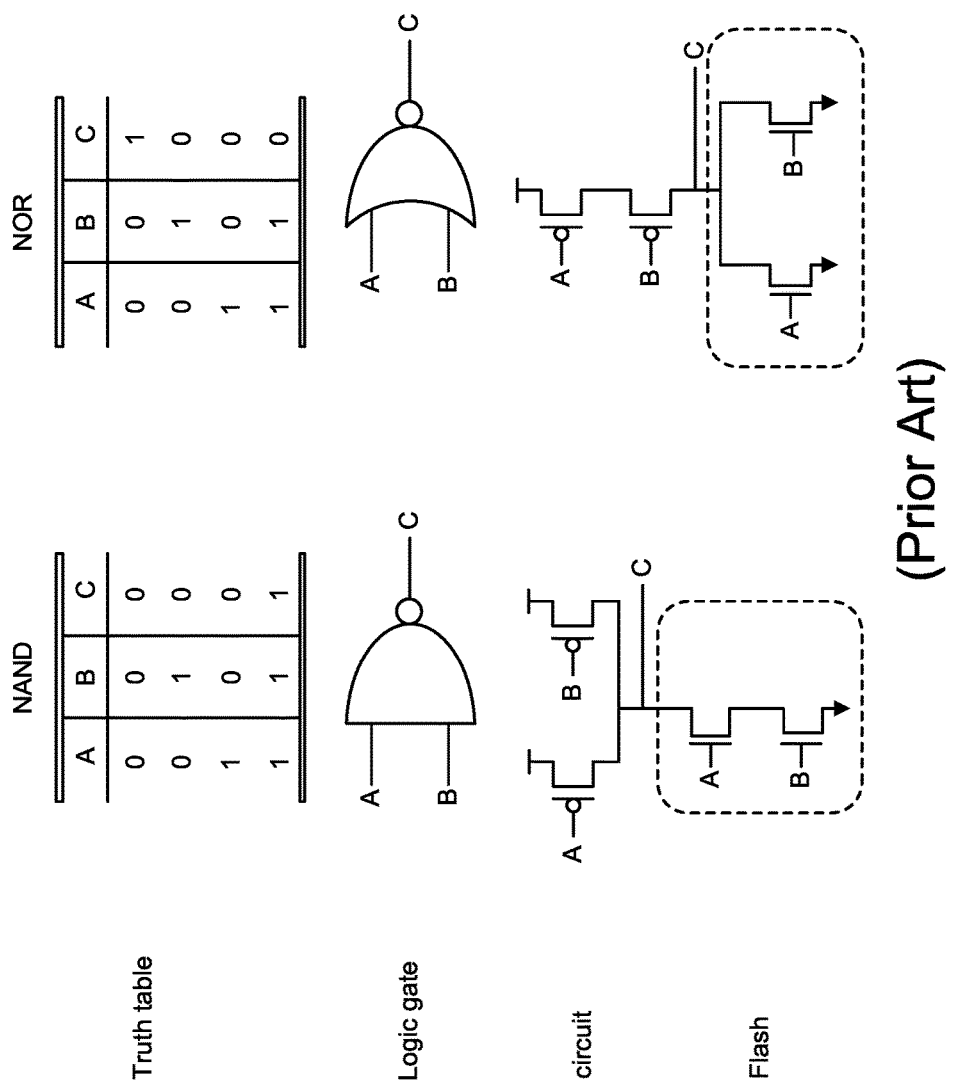
FIG. 2 is a summary comparison of NAND and NOR flash memory according to the prior art.
Figure 3:
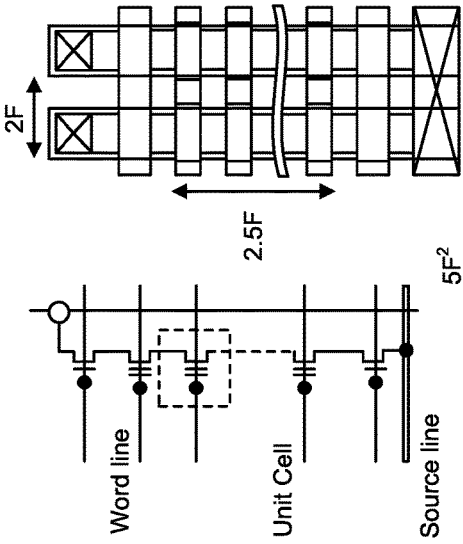
FIG. 3 is a summary comparison of NAND and NOR flash memory according to the prior art.
Figure 4:
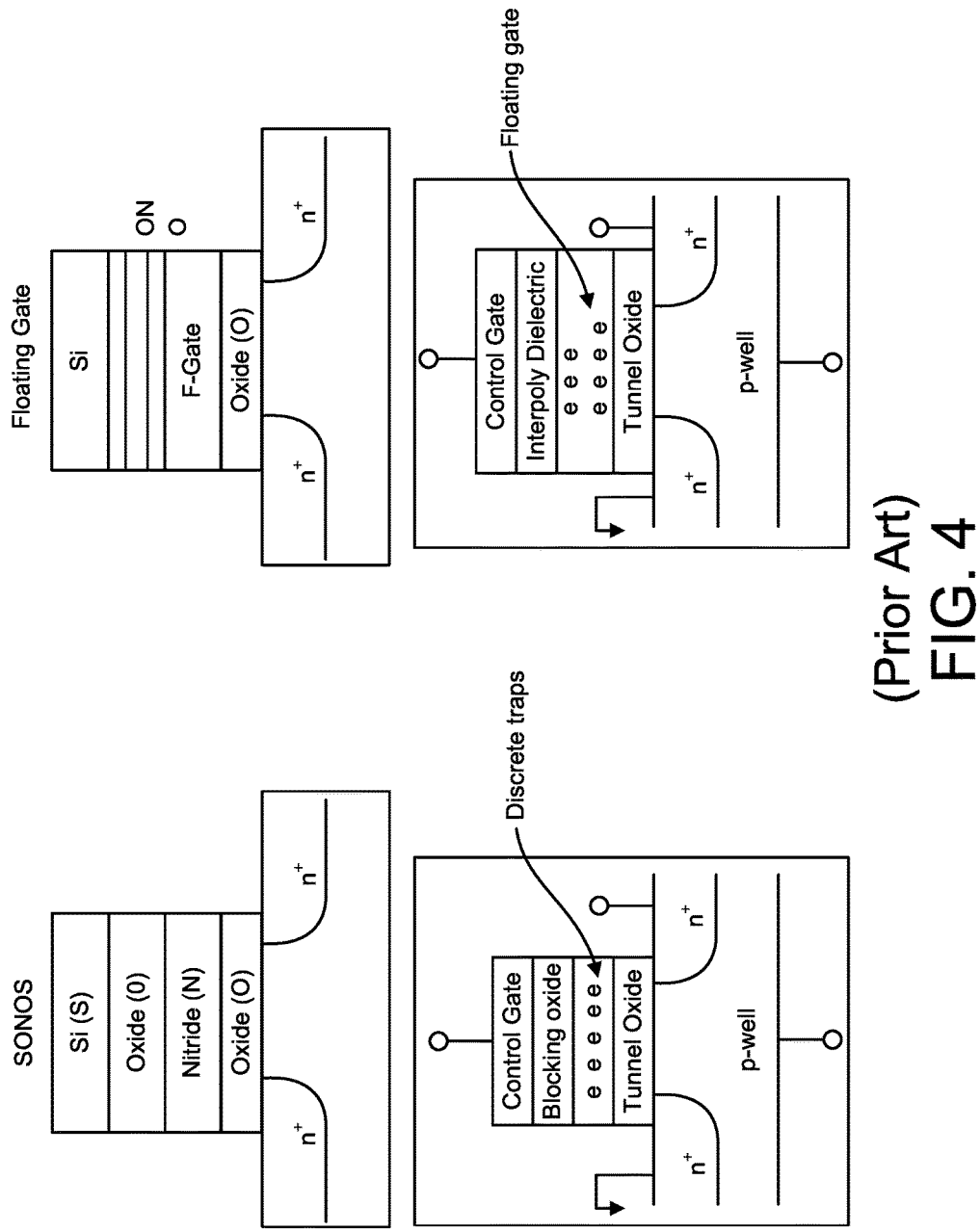
FIG. 4 is a summary comparison of charge trap and floating gate flash memory cells according to the prior art.
Figure 5:
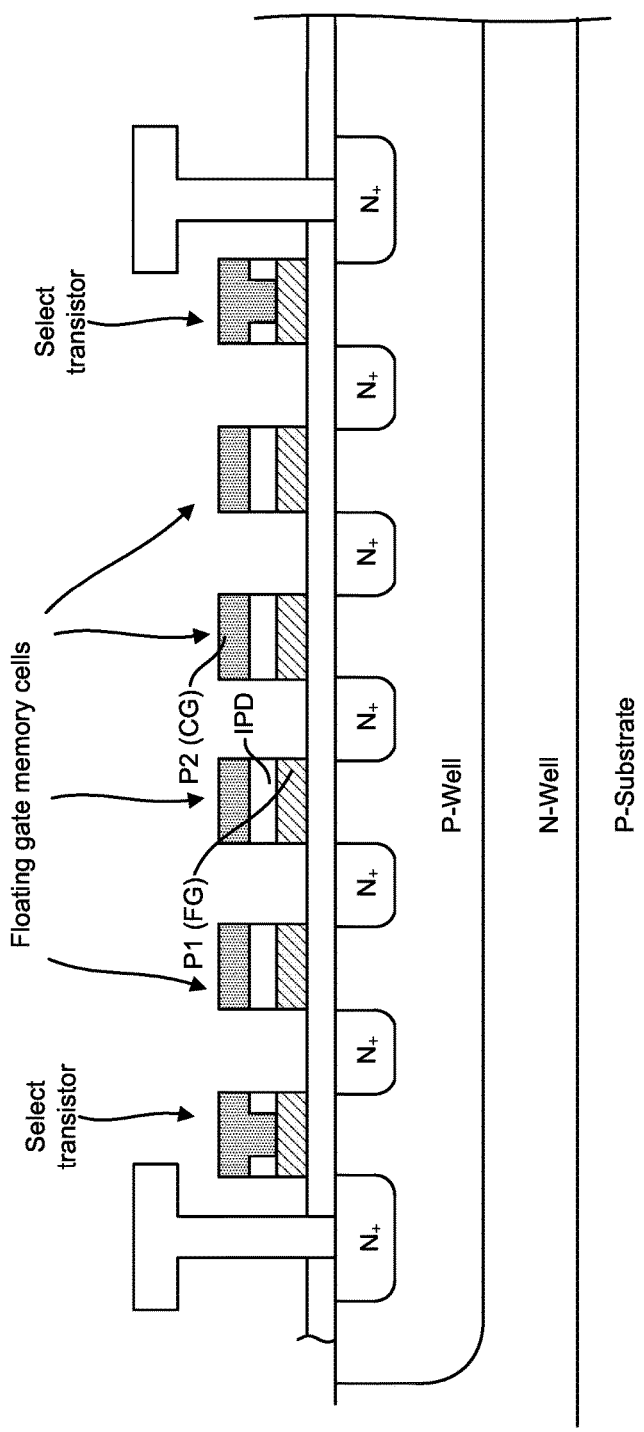
FIG. 5 is an illustration of a 2D or planar constructed NAND flash memory according to a prior art.
Figure 7:
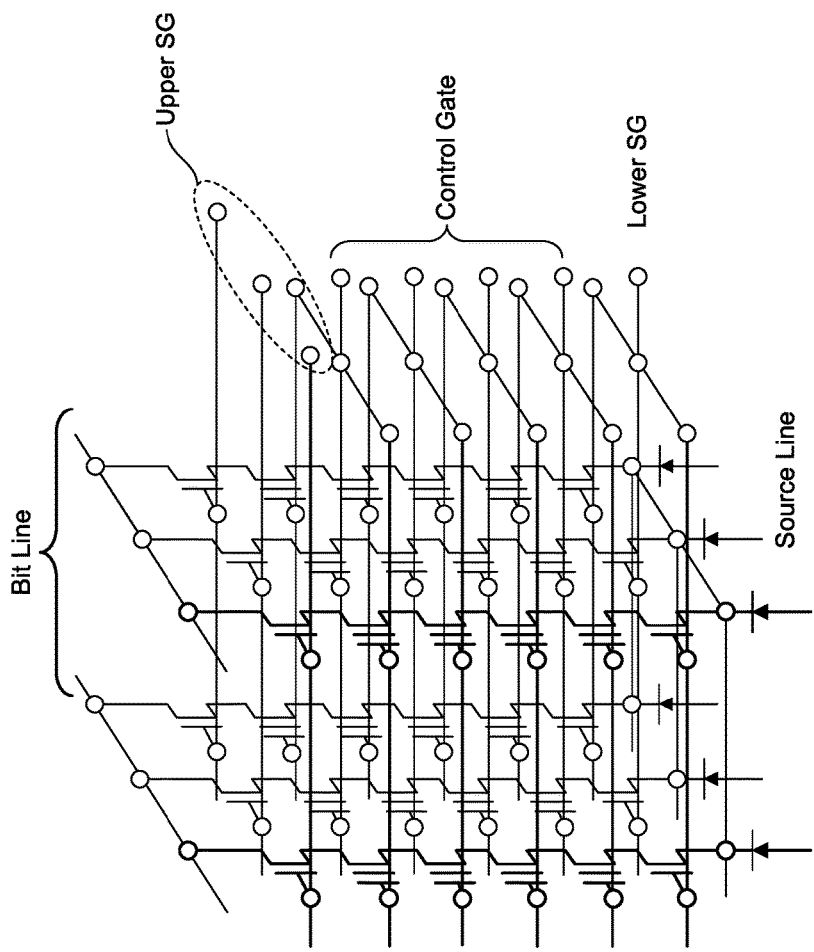
FIG. 7 is an electrical schematic diagram of Toshiba's BiCS 3D NAND flash memory according to a prior art.
Figure 8:
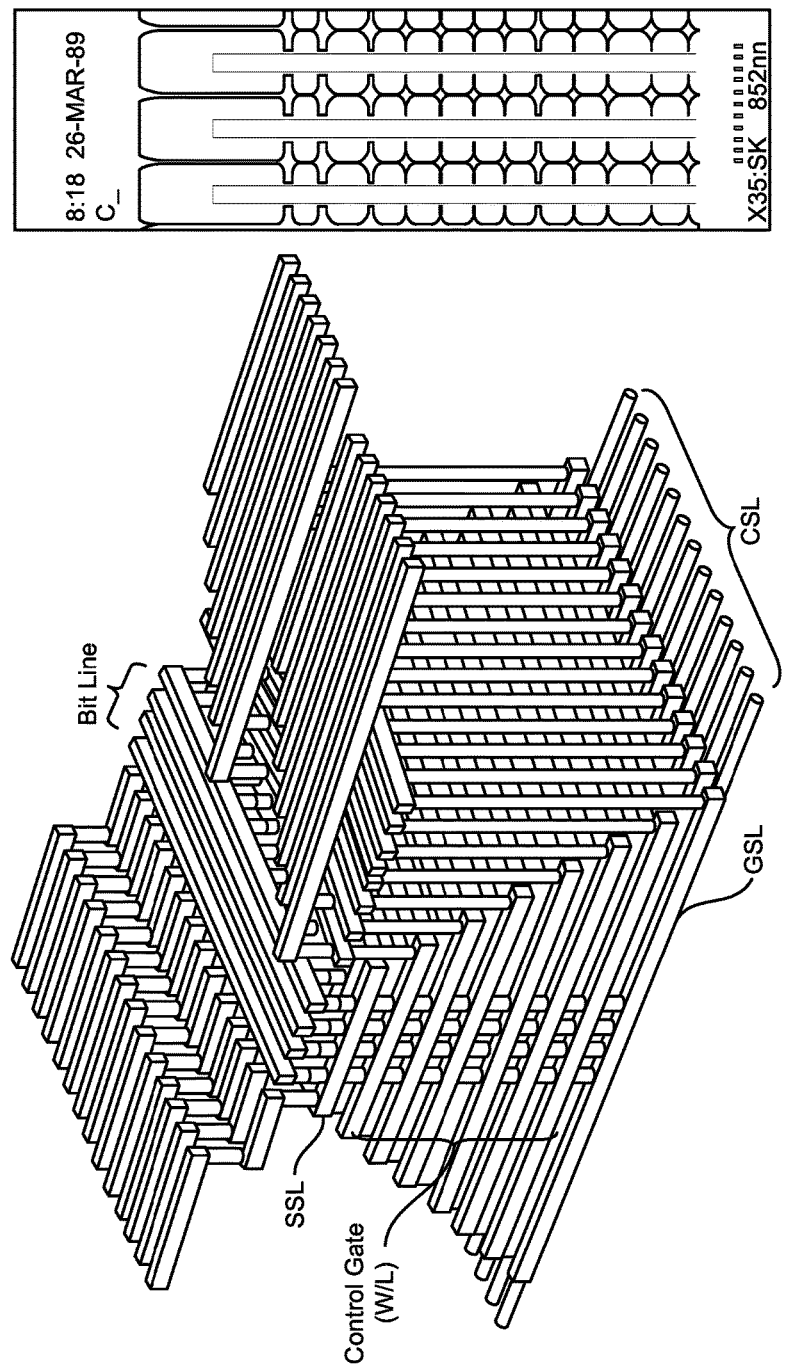
FIG. 8 is an illustration showing construction of Samsung's Terabit Cell Array Transistor (TCAT) 3D NAND flash memory according to a prior art.
Figure 9:
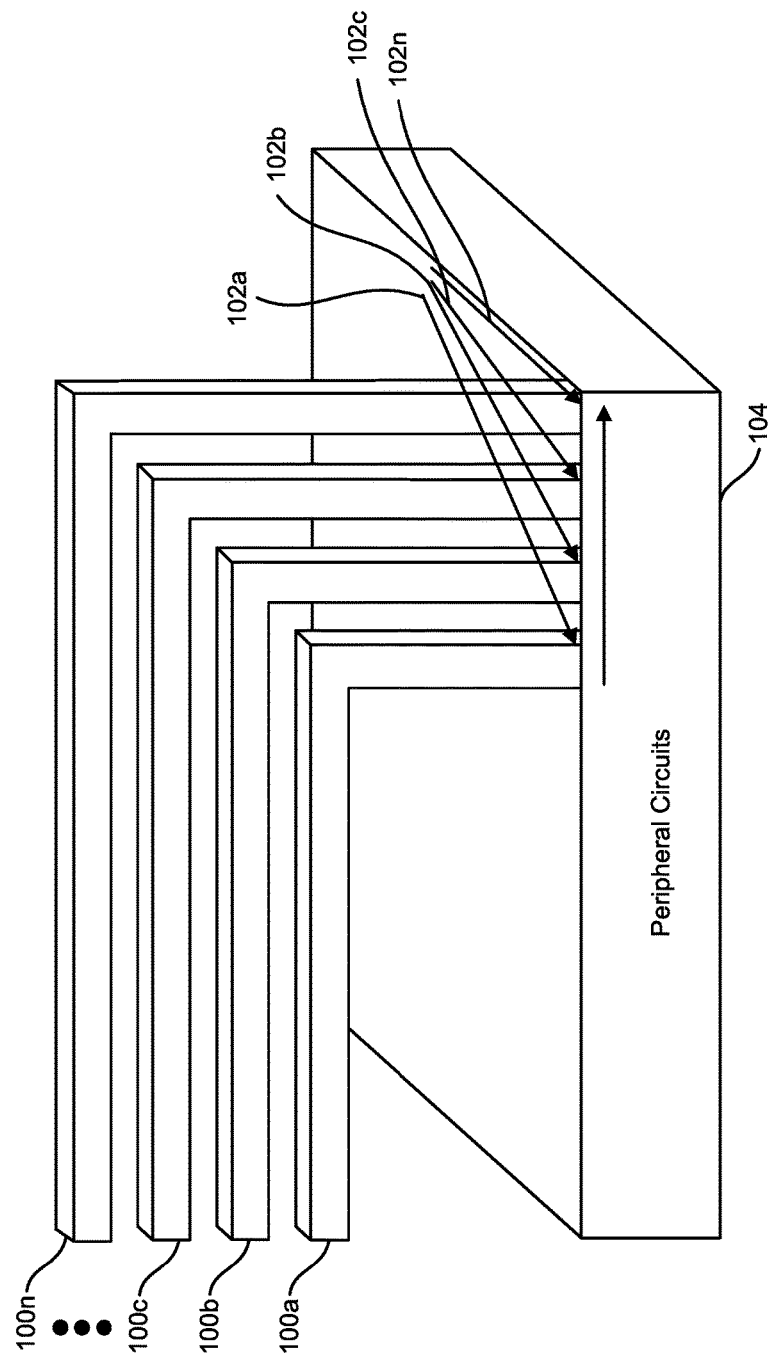
FIG. 9 is an illustration showing the area required for contact holes of the independent word lines and bit lines for a prior art 3D memory structure.
Figure 10:
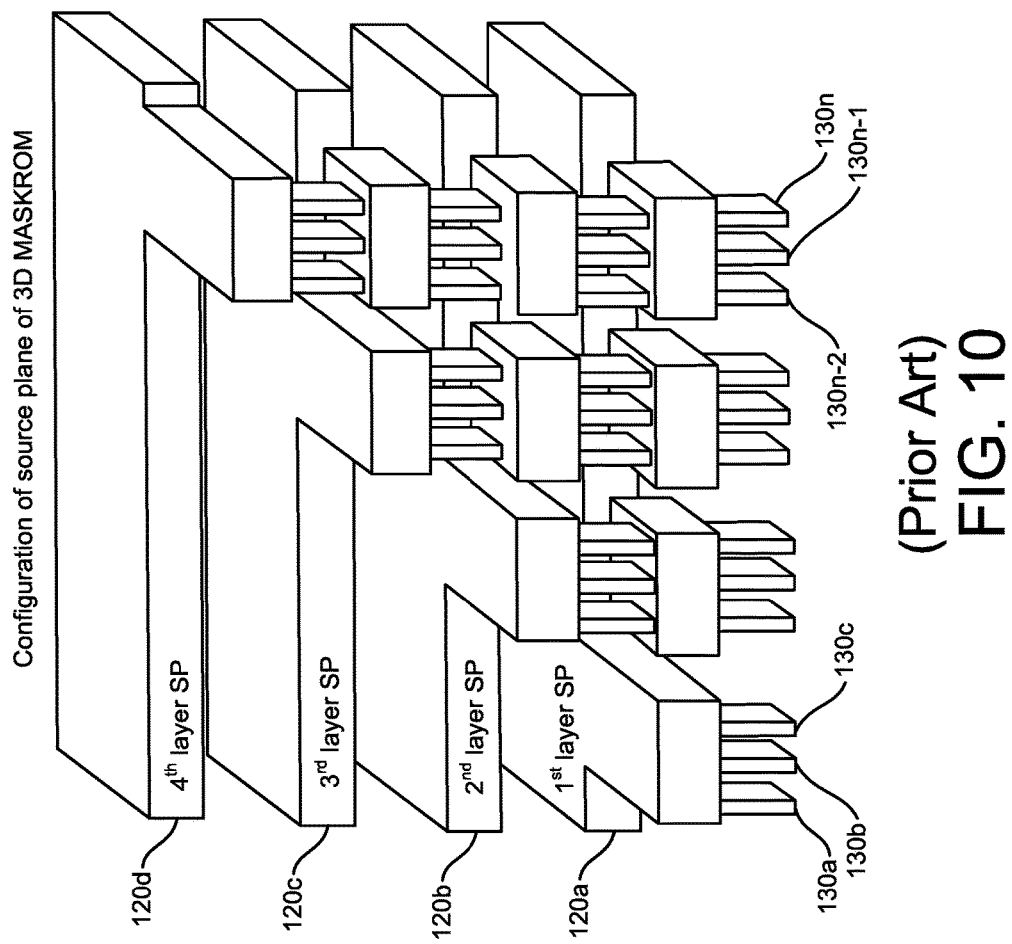
FIG. 10 is an illustration showing the area required for contact holes of the independent word lines and bit lines for a prior art 3D memory structure.
Figure 11:
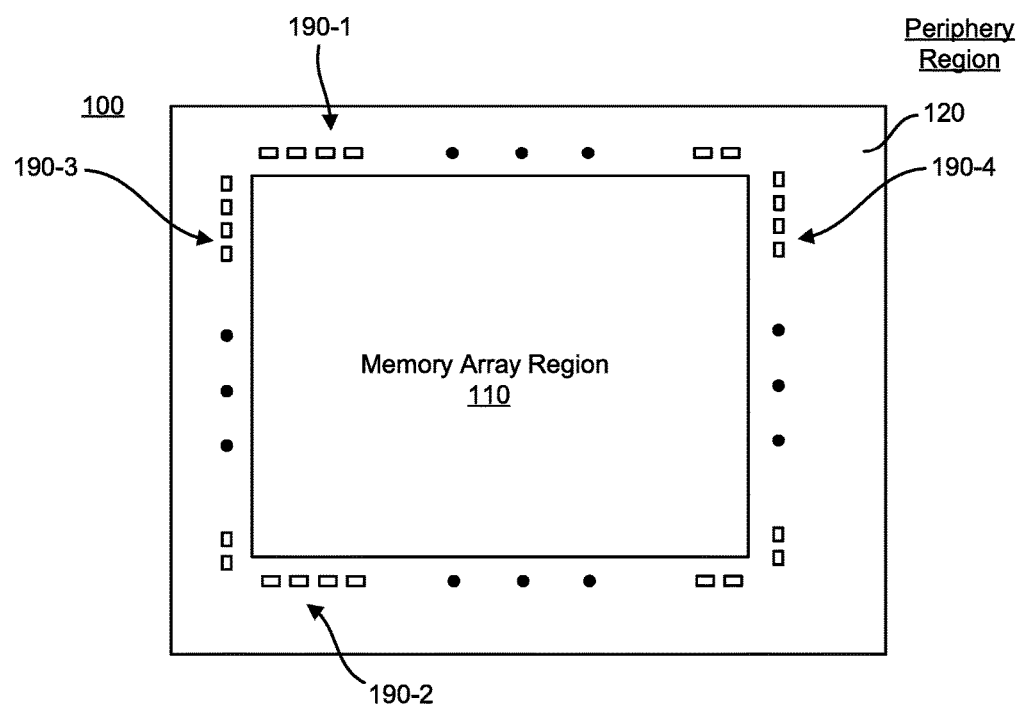
FIG. 11 is an illustration showing the area outside a memory array region for interconnect structures according to a prior art.
Figure 12:
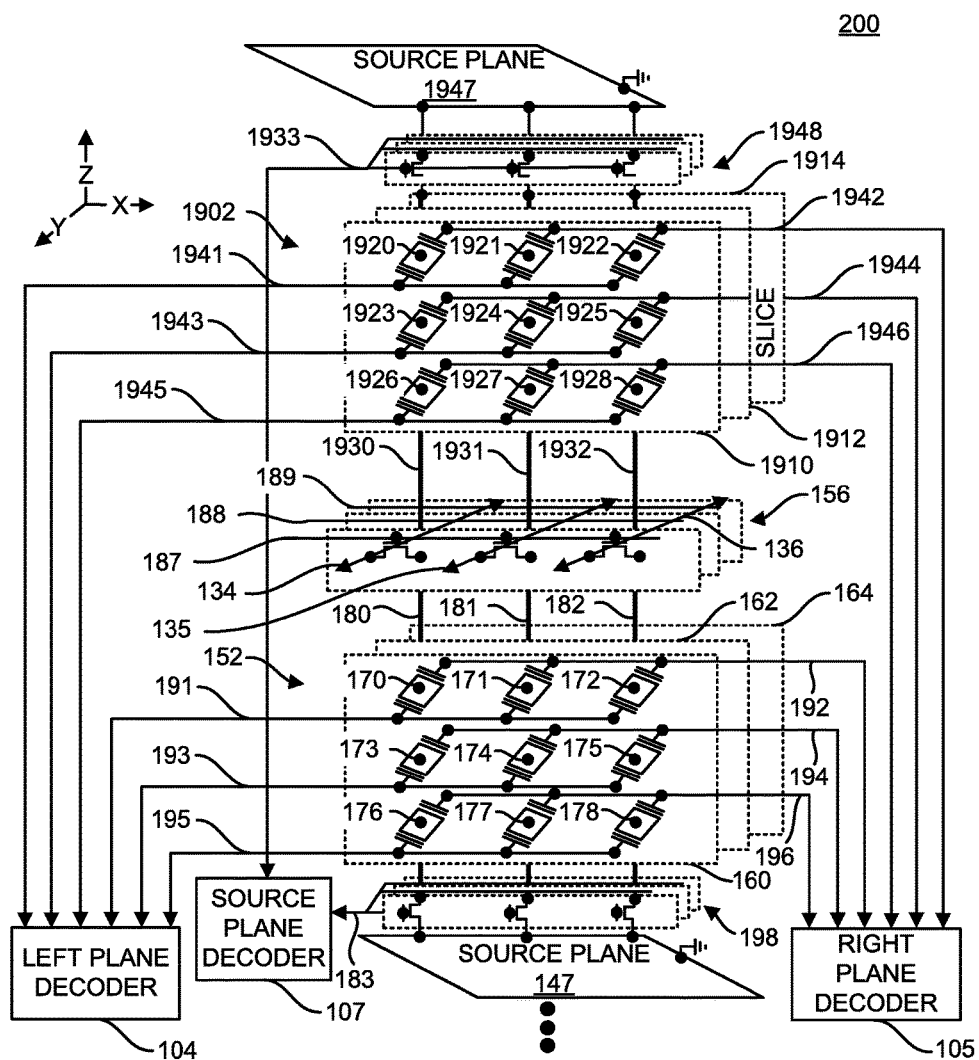
FIG. 12 is a diagram illustrating routing of decoder logic to an area outside of the memory array region according to a prior art 3D NAND flash memory structure.
Figure 14A:
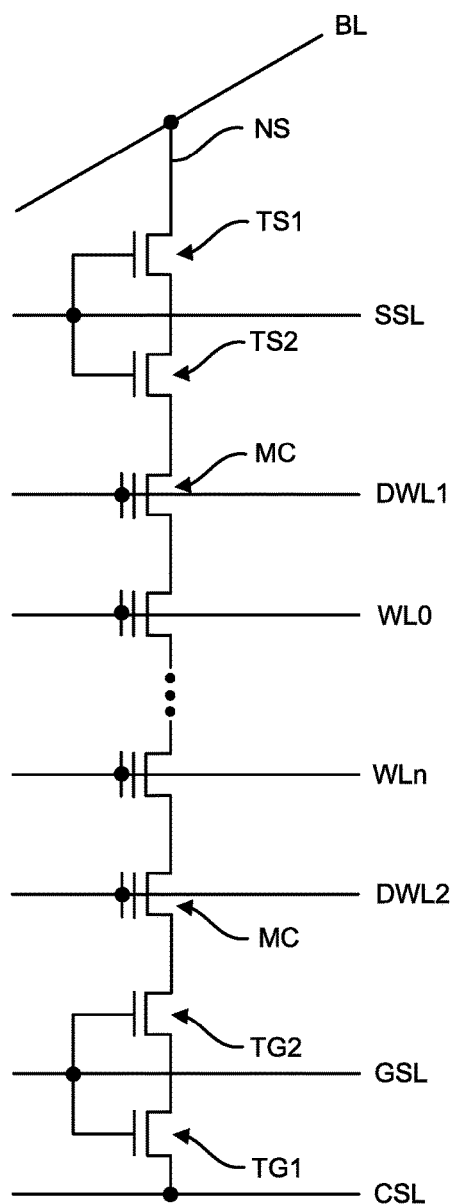
FIGS. 14a and 14b are electrical schematics illustrating the connections of various conductive lines in a 3D NAND flash memory device of a prior art.
Figure 14B:
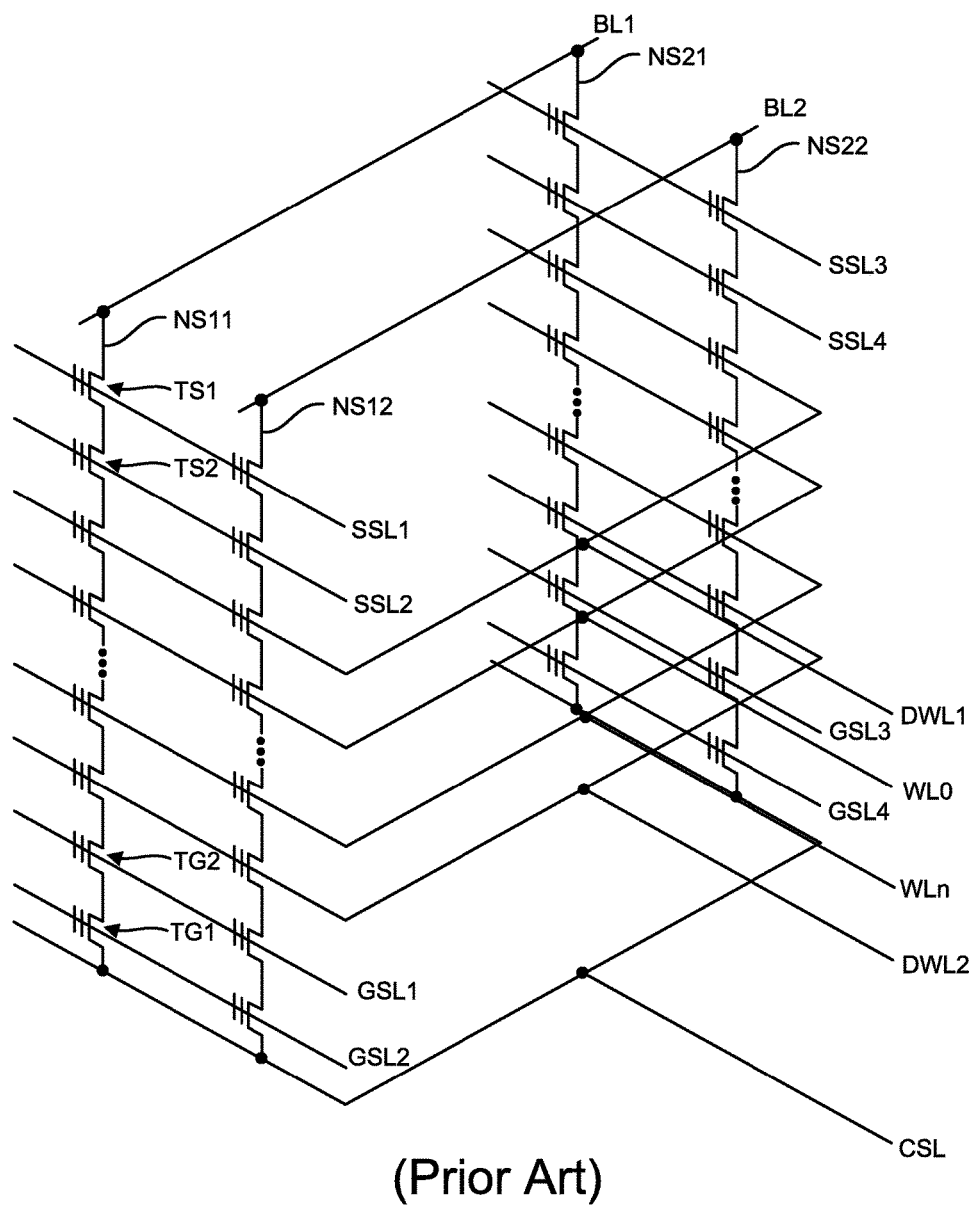
Figure 15:
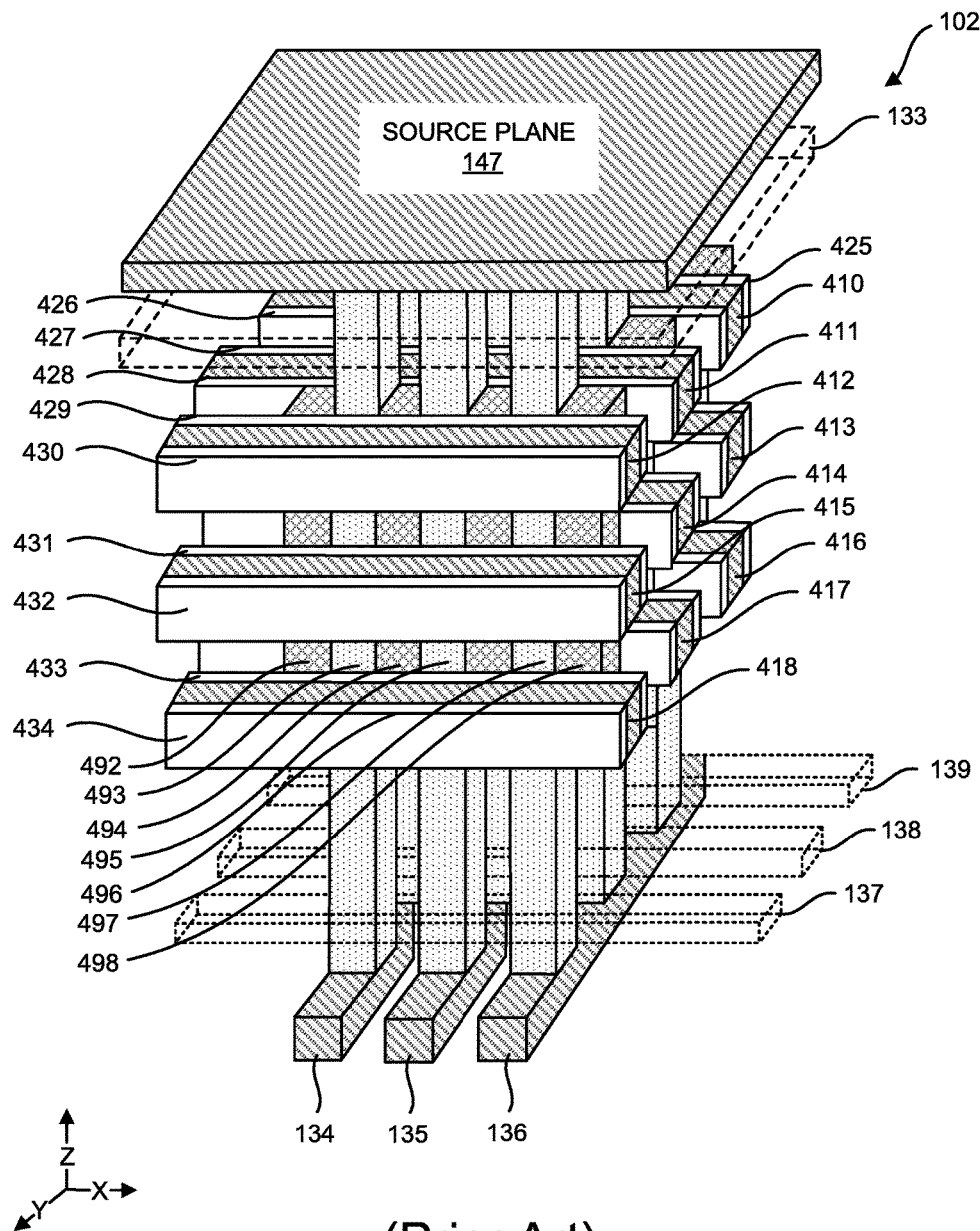
FIG. 15 is an illustration of the construction of x-axis, y-axis and z-axis conductive lines in a 3D memory device according to a prior art.
Figure 27A:
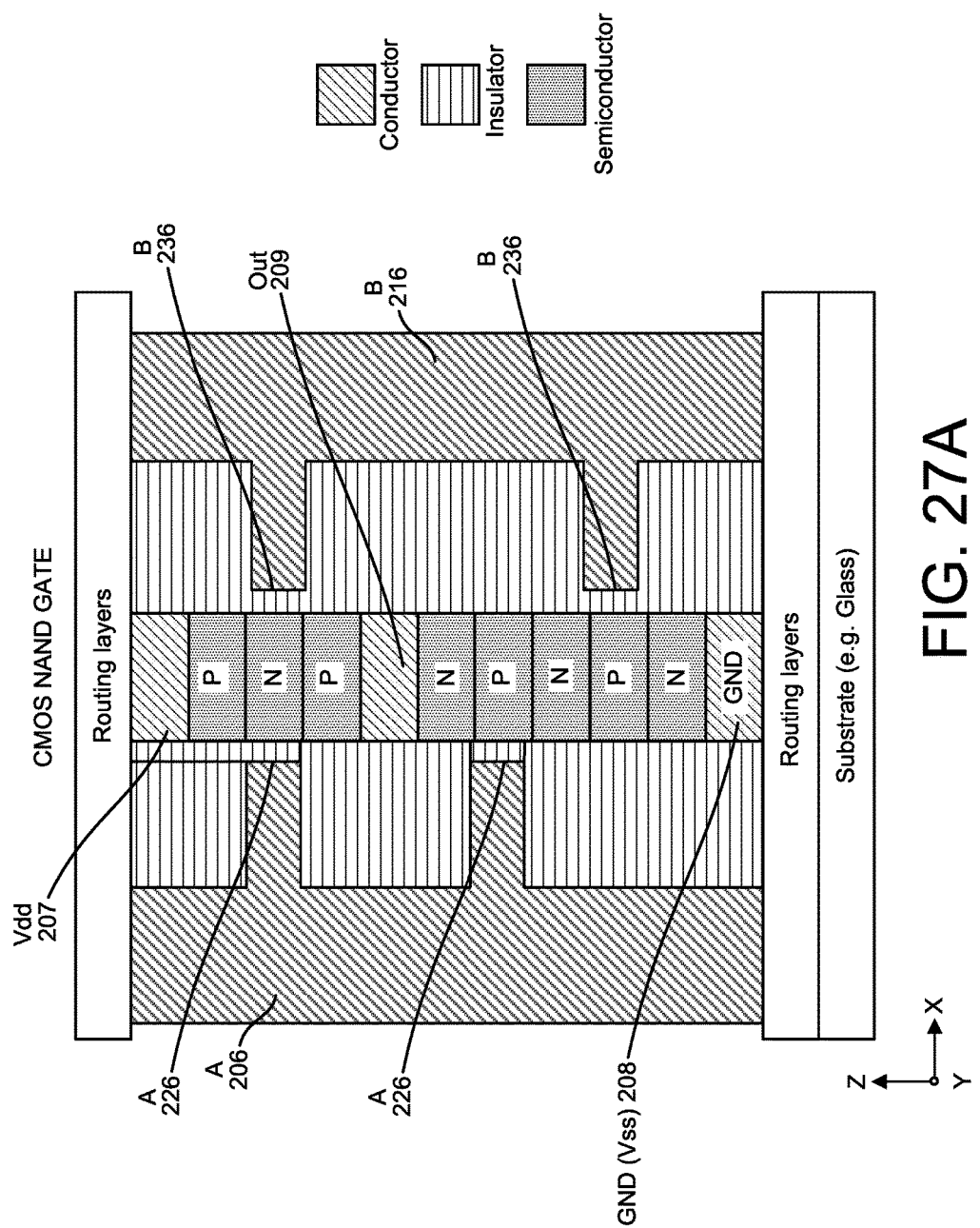
FIG. 27a and FIG. 27b—Side cross section illustrations of a VLG (CMOS NAND Gate type).
Figure 27B:
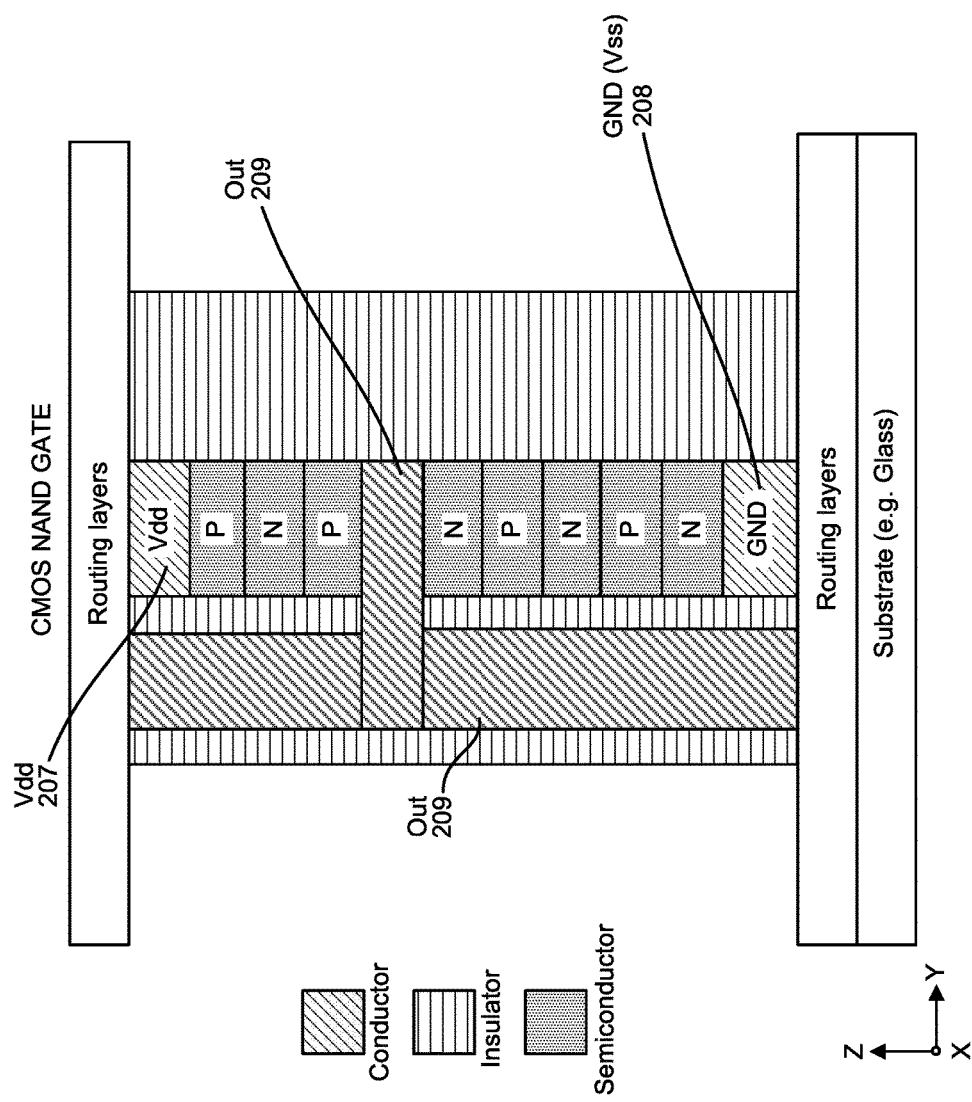
Figures 27C, 27D:
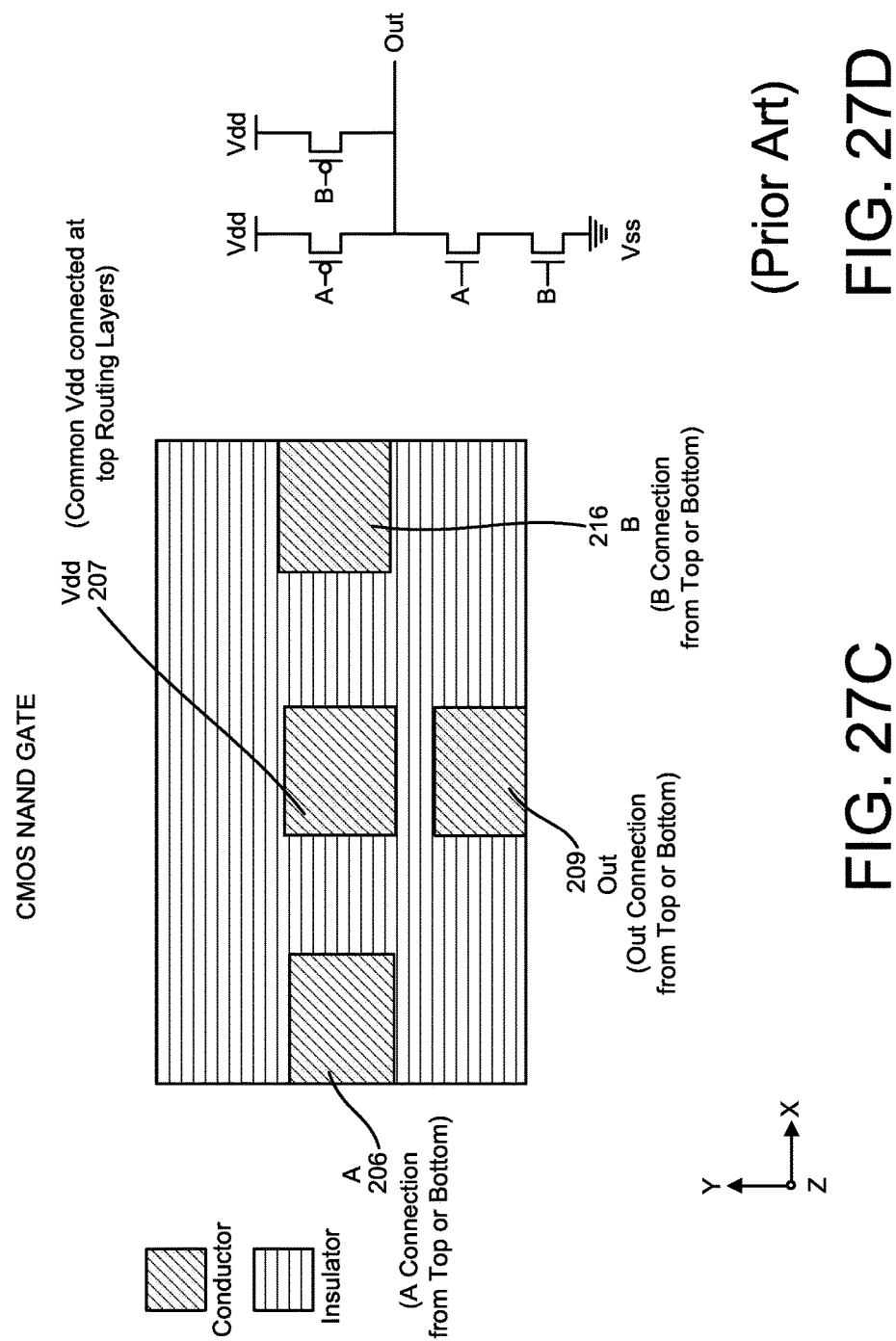
Figure 27F:
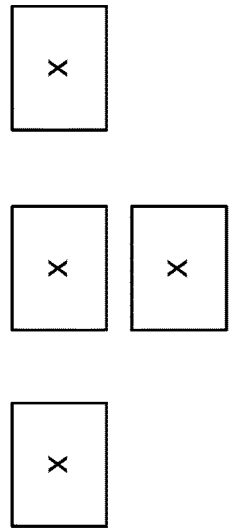
Figure 27E:
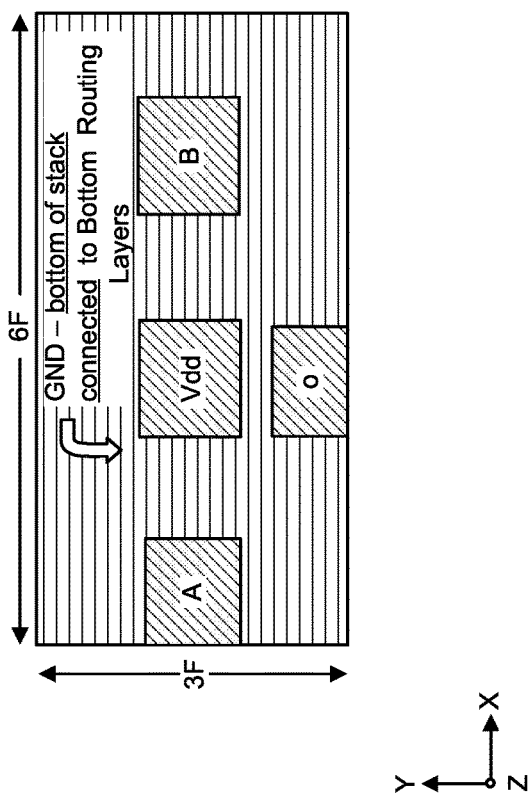
Figure 27G:
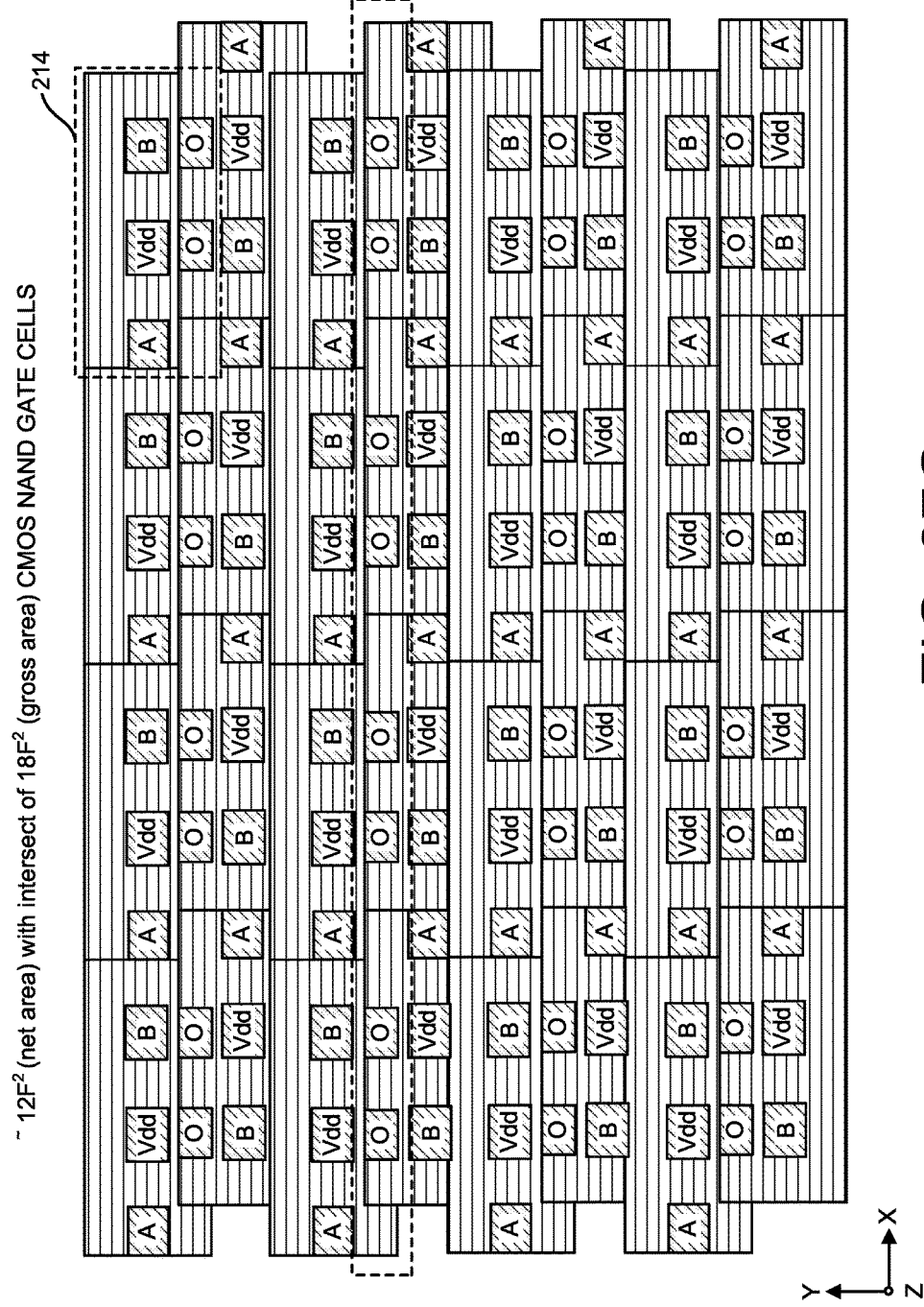
Figures 2, 27H:
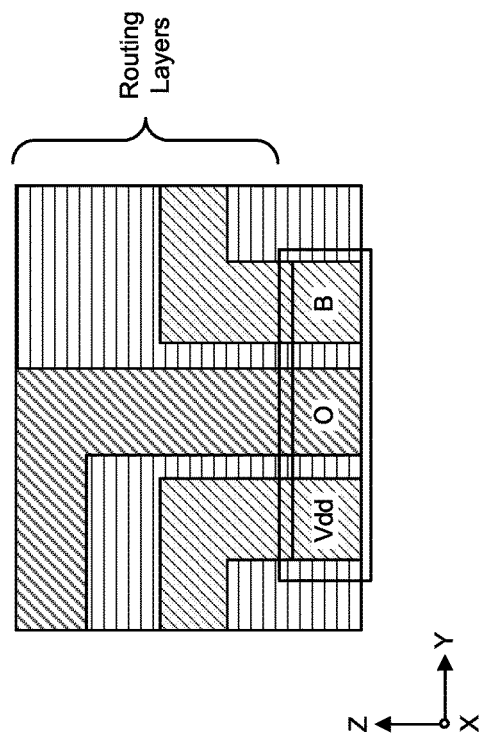
Figures 1, 27H:
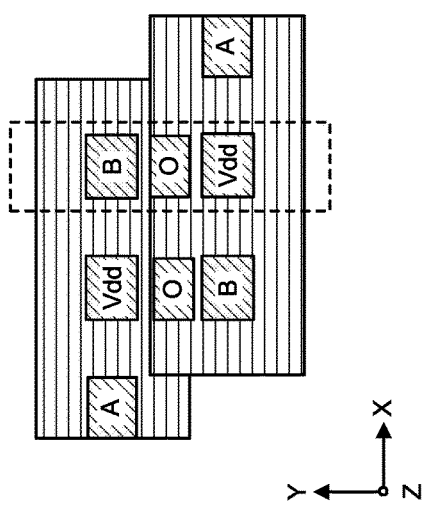
Figure 28A:
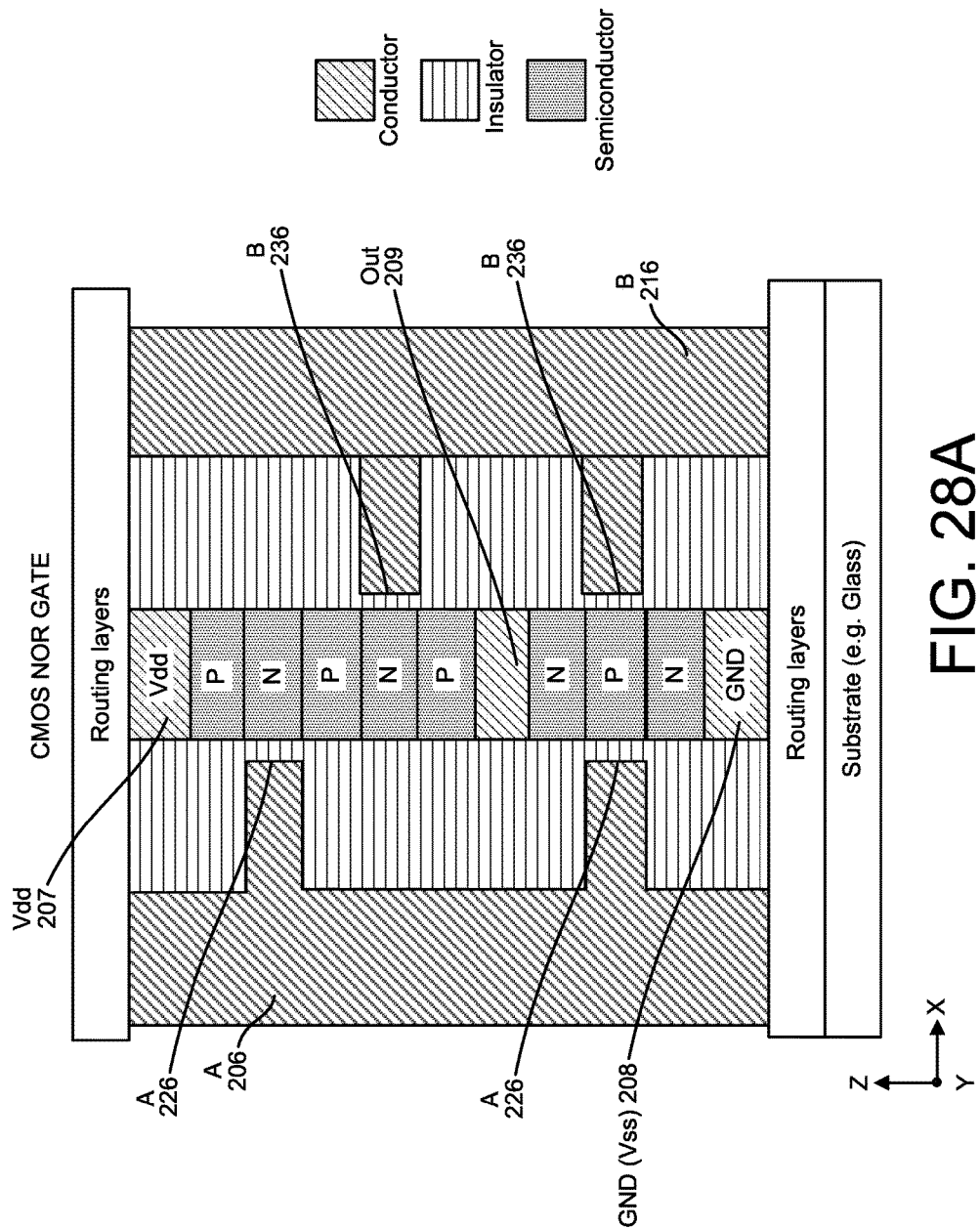
FIG. 28a and FIG. 28b—Side cross section illustrations of a VLG (CMOS NOR Gate type).
Figure 28B:
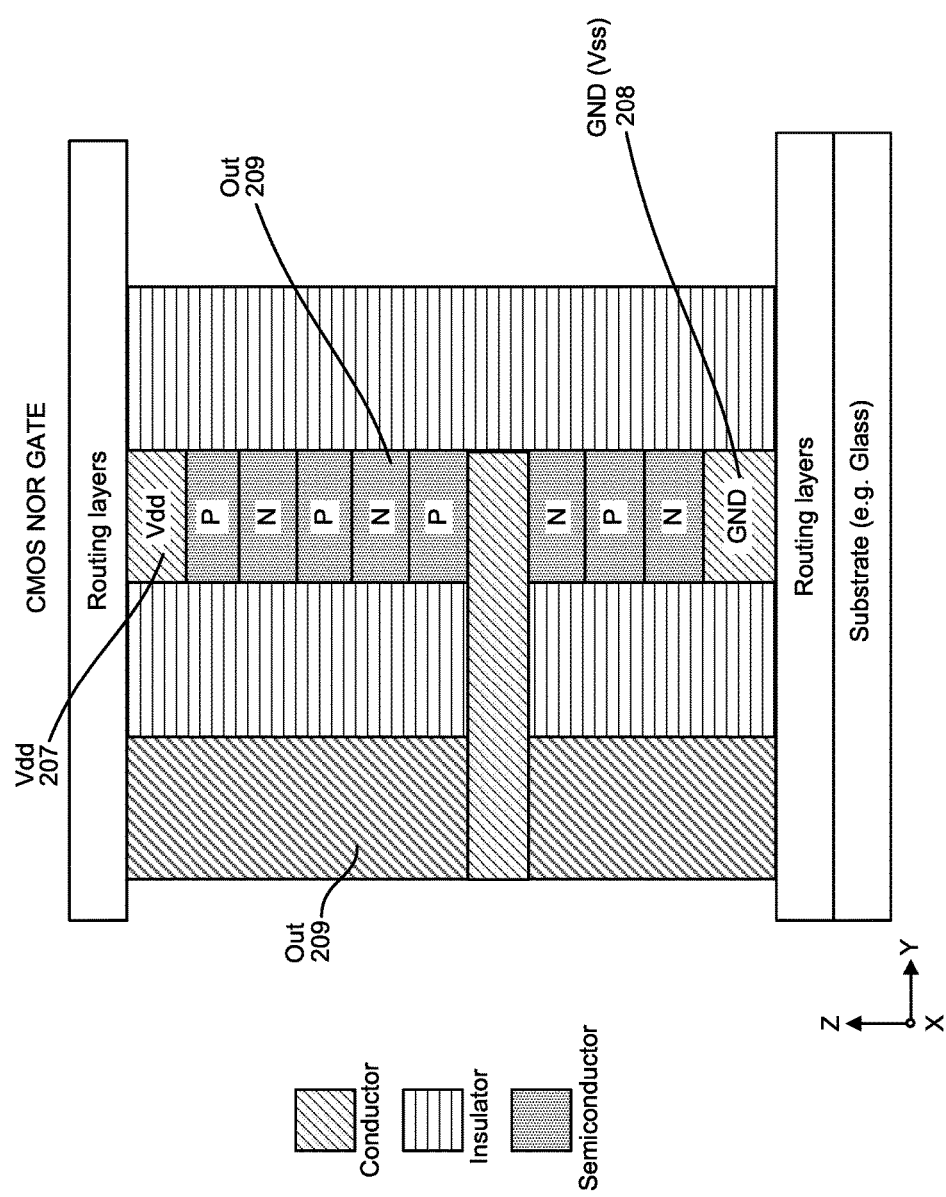
Figure 28E:
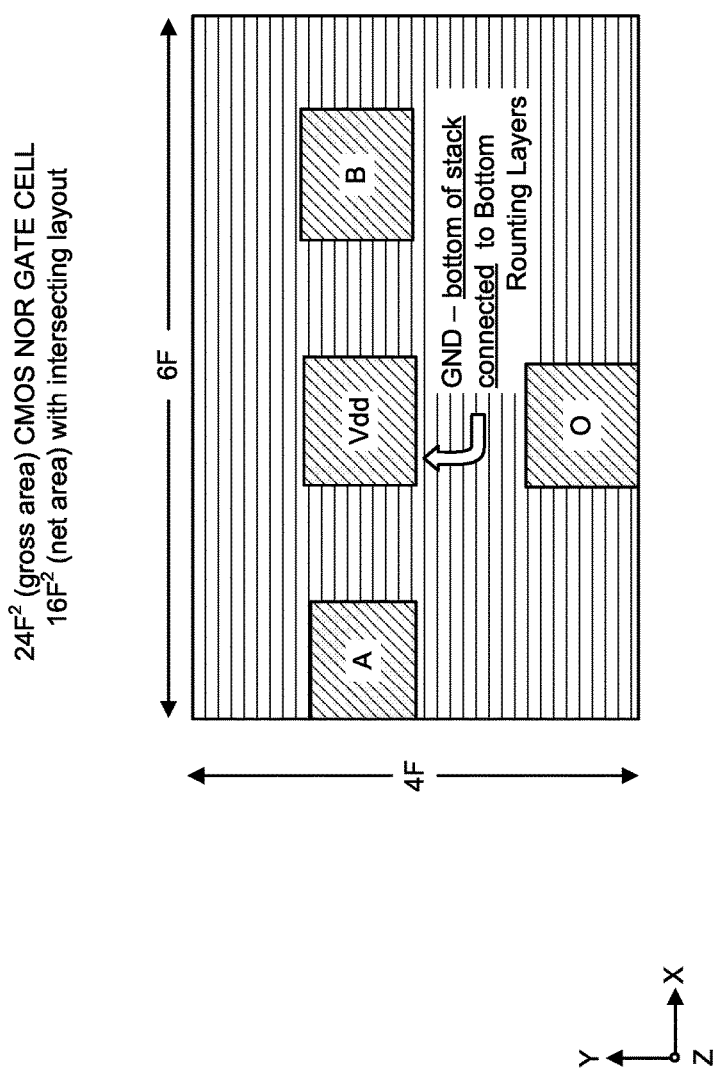

Certain designs of VLGs, such as shown in FIG. 27a to FIG. 27g in the present disclosure and those of FIG. 5A to FIG. 5G, and FIG. 8A to FIG. 8F of U.S. Provisional Application No. 62/252,522 indicate connections requiring routing that are spaced less than 1F distance apart from each other—as indicated in FIG. 27h-1—due to the nature of the construction which relies in part on conformal deposition of materials which allows for <1F feature sizes. The routing of such connections to routing layers above will present challenges unless smaller feature size lithography is used which is not desirable. One approach is to construct and route the first electrodes (501) to a first routing layer (601), and conformal coat the insulator layer prior to routing of the second electrode (502) to a second routing layer (602). Other methods may be employed to route such connections that are spaced less than 1F apart without resorting to the need for lithography processes less than 1F. One may consider the spacing between the different contacts to be the alignment space plus a margin so that contact is not made.

Another advantage of the monolithic stacking method shown in FIG. 25 is that by stacking volumetric memory array devices (400) each with lower number of memory layers (300) one can achieve a high total number of memory layers without incurring a large area penalty due to the taper angle associated with the patterning (etching) of the many layers. This taper angle relationship and its effect on the required memory cell pitch in the X and Y directions is detailed in: A Rigorous 3-D NAND Flash Cost Analysis, Andrew J. Walker, IEEE Transactions on Semiconductor Manufacturing, Vol. 26, No. 4, November 2013—Digital Object Identifier 10.1109/TSM.2013.2283274, 0894-6507 _c 2013 IEEE. Hence, for example, at the same minimum feature size (F) processing node, a 128 layer device made according to prior art methods would necessarily require more die area for the memory array layout than a 128 layer device made according to FIG. 25 where for example 8 devices of 16 layers each are stacked. This is due to the fact that the taper angle effect of etching multiple devices comprising 16 layers of memory each is much less than etching a single device with 128 layers in one process.

The following are non-exclusive descriptions of possible embodiments of the present invention.

Some embodiments relate to a memory device includes an insulative substrate a non-monocrystalline active-device layer deposited upon the insulative substrate, an insulative layer on the non-monocrystalline active-device layer, and a three-dimensional volumetric memory array disposed on top of the insulative layer. The non-monocrystalline active device layer includes a plurality of active devices. The three-dimensional volumetric memory array is disposed directly above one or more to the plurality of active devices. The three-dimensional volumetric memory array is electrically connected to the non-monocrystalline active-device layer via a plurality of vias through the insulative layer and between the three-dimensional volumetric memory array and the non-monocrystalline active device layer.

The memory device of the preceding paragraph can optionally include, additionally and/or alternatively, any one or more of the following features, configurations and/or additional components: i) a display screen having a plurality of display pixels; and/or ii) a non-monocrystalline active device layer disposed upon the three-dimensional volumetric memory array. The non-monocrystalline active device layer can include a plurality of active devices. The non-monocrystalline active device layer can be electrically connected to the three-dimensional volumetric memory array via a plurality of vias that are located between the three-dimensional volumetric memory array and the non-monocrystalline active device layer A further embodiment of the foregoing memory device, wherein the plurality of active devices can be electrically configured as decoder logic for the three-dimensional volumetric memory array. A further embodiment of any of the foregoing memory devices, wherein the plurality of active devices can be electrically configured as drivers for the three-dimensional volumetric memory array. A further embodiment of any of the foregoing memory devices, wherein the plurality of active devices can be electrically configured as sense circuitry for the three-dimensional volumetric memory array. A further embodiment of any of the foregoing memory devices, wherein the dielectric substrate includes glass (plastic, etc.). A further embodiment of any of the foregoing memory devices, wherein the display screen is disposed above or below the three dimensional volumetric memory array. A further embodiment of any of the foregoing memory devices, wherein a ratio of a number of a first portion of the plurality of active devices to a number of a second portion of active devices is less than 10%. The first portion of active devices defined as those located not directly below the three-dimensional volumetric memory array, and the second portion of active devices defined as those located directly below the three-dimensional volumetric memory array.

Some embodiments relate to a memory device including a substrate, a three-dimensional volumetric memory array disposed on top of the substrate, and a non-monocrystalline active device layer disposed upon the three-dimensional volumetric memory array. The non-monocrystalline active device layer includes a plurality of active devices. The non-monocrystalline active device layer is electrically connected to the three-dimensional volumetric memory array via a plurality of vias that are located between the three-dimensional volumetric memory array and the non-monocrystalline active device layer.

A further embodiment of the foregoing memory device, wherein the plurality of active devices can be electrically configured as decoder logic for the three-dimensional volumetric memory array. A further embodiment of any of the foregoing memory devices, wherein the plurality of active devices can be electrically configured as drivers for the three-dimensional volumetric memory array. A further embodiment of any of the foregoing memory devices, wherein the plurality of active devices can be electrically configured as sense circuitry for the three-dimensional volumetric memory array. A further embodiment of any of the foregoing memory devices, wherein the substrate can be a monocrystalline semiconductor substrate having a plurality of active devices. A further embodiment of any of the foregoing memory devices, wherein the plurality of active devices can be configured as a processor. A further embodiment of any of the foregoing memory devices, wherein the substrate can be an insulative substrate. A further embodiment of any of the foregoing memory devices, wherein the non-monocrystalline active device layer is a first non-monocrystalline active device layer and the plurality of vias is a first plurality of vias, and the memory device further includes a second non-monocrystalline active device layer disposed upon the first non-monocrystalline active device layer. The second non-monocrystalline active device layer can includes a plurality of active devices. The second non-monocrystalline active device layer can be electrically connected to first non-monocrystalline active device layer via a second plurality of vias that are located between the second non-monocrystalline active device layer and the first non-monocrystalline active device layer.

Some embodiments relate to a memory device including a substrate, a first insulative layer on the substrate, a non-monocrystalline active device layer on the first insulative layer, a second insulative layer on the non-monocrystalline active-device layer, and a three-dimensional volumetric memory array disposed on top of the second insulative layer. The substrate has a first plurality of active devices. The non-monocrystalline active-device layer has a second plurality of active devices. One or more of the second plurality of active devices is in electrical communication with one or more of the first plurality of active devices via one or more vias through the first insulative layer and between the non-monocrystalline active-device layer and the substrate. The three-dimensional volumetric memory array is electrically connected to the non-monocrystalline active-device layer via a plurality of vias through the second insulative layer and between the three-dimensional volumetric memory array and the non-monocrystalline active device layer.

The memory device of the preceding paragraph can optionally include, additionally and/or alternatively, any one or more of the following features, configurations and/or additional components: i) a second non-monocrystalline active-device layer on the three-dimensional volumetric memory array, the second non-monocrystalline active-device layer having a third plurality of active devices. A further embodiment of any of the foregoing memory devices, wherein the substrate can be a monocrystalline semiconductor substrate. A further embodiment of any of the foregoing memory devices, wherein the non-monocrystalline active-device layer can be a second non-monocrystalline active-device layer, and wherein the substrate is an insulative substrate having a first non-monocrystalline active-device layer deposited thereupon. A further embodiment of any of the foregoing memory devices, wherein the three-dimensional volumetric memory array can be disposed directly above one or more of the second plurality of active devices. A further embodiment of any of the foregoing memory devices, wherein the substrate can be an insulative substrate, and wherein the first plurality of active devices can include a third plurality of active devices. A further embodiment of any of the foregoing memory devices, wherein the first plurality of active devices can include a third plurality of MOSFET transistors. A further embodiment of any of the foregoing memory devices, wherein the first plurality of active devices can be configured as a processor.

Some embodiments relate to a method of manufacturing a memory device. The method includes providing an insulative substrate. The method includes the step of depositing a non-monocrystalline active device layer on the provided substrate. The method includes the step of selectively doping the deposited non-monocrystalline active device layer so as to form a plurality of active devices. The active devices have a minimum critical dimension. The method includes the step of disposing a three-dimensional volumetric memory array on top of the deposited non-monocrystalline active device layer. The method also includes the step of connecting the disposed three-dimensional volumetric memory array to the plurality of active devices formed in the deposited non-monocrystalline active device layer. The thermal budget of the sum of the depositing, the selectively doping, the disposing, and the connecting steps is less than 30% of the minimum critical dimension, wherein the thermal budget measured as a change in the critical dimension resulting from diffusion of carriers in response to the thermal budget.

Some embodiments relate to a method of manufacturing a memory device. The method includes the step of providing a substrate. The method includes the step of disposing a three-dimensional volumetric memory array on top of the provided substrate. The method includes the step of depositing a non-monocrystalline active device layer on the three-dimensional volumetric memory array. The method includes the step of selectively doping the deposited non-monocrystalline active device layer so as to form a plurality of active devices. The method also includes the step of connecting one or more of the plurality of active devices to the three-dimensional volumetric memory array deposited on the substrate. The thermal budget of the sum of the sum of the disposing, the depositing, the selectively doping, and the connecting steps is less than 30% of the minimum critical dimension, wherein the thermal budget measured as a change in the critical dimension resulting from diffusion of carriers in response to the thermal budget.

The term "processor," as used in the phrase "the plurality of active devices can be configured as a processor" above, can be one or more processors. Processor(s), in one example, are configured to implement functionality and/or process instructions for execution within the memory device. For instance, processor(s) can be capable of processing instructions stored in the memory device. Examples of processor(s) can include any one or more of a microprocessor, a controller, a digital signal processor (DSP), an application specific integrated circuit (ASIC), a field-programmable gate array (FPGA), or other equivalent integrated logic circuitry While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

TABLE 1

| ESTIMATE OF PERIPHERY CIRCUITRY AREA REQUIRED FOR VOLUMETRIC MEMORY ARRAYS | | | | | | | | | | | |
|---|---|---|---|---|---|---|---|---|---|---|---|
| | Mem Array | | | | A × B | BL (1s) | WL | BL routed to 1 side | | BL routed to 2 sides | |
| FIG. | Type | Rx | A | B | Mem-A | Periph-A | Periph-A | Total-A | PA % | Total-A | PA % |
| M = 256 word × bit lines (M × M), array size | | | | | | | | | | | |
| Fm = 90 nm | | | | | | | | | | | |
| L = 8 memory layers in single 3D volumetric array | | | | | | | | | | | |
| Measurements (A and B) in microns; area measurements in square microns | | | | | | | | | | | |
| 20d | Cross Point | 32 | 46 | 6 | 265 | 8 | 0 | 274 | 3.0% | 270 | 1.5% |
| 21d | Cross Point | 64 | 23 | 12 | 265 | 17 | 0 | 282 | 5.9% | 274 | 3.0% |

TABLE 1-continued

ESTIMATE OF PERIPHERY CIRCUITRY AREA REQUIRED FOR VOLUMETRIC MEMORY ARRAYS

| FIG. | Mem Array Type | Rx | A | B | A × B Mem-A | BL (1s) Periph-A | WL Periph-A | BL routed to 1 side Total-A | PA % | BL routed to 2 sides Total-A | PA % |
|---|---|---|---|---|---|---|---|---|---|---|---|
| 22d | 1T1R | 64 | 35 | 12 | 398 | 8 | 12 | 419 | 5.0% | 415 | 4.0% |
| 23d | 1T1R | 64 | 23 | 12 | 265 | 8 | 8 | 282 | 5.9% | 278 | 4.0% |
| 24d | Cross Point | 64 | 23 | 12 | 265 | 8 | 8 | 282 | 5.9% | 278 | 4.5% |

M = 256 word × bit lines (M × M), array size
Fm = 90 nm
L = 16 memory layers in single 3D volumetric array
Measurements (A and B) in microns; area measurements in square microns

| 20d | Cross Point | 16 | 46 | 3 | 133 | 8 | 0 | 141 | 5.9% | 137 | 3.0% |
|---|---|---|---|---|---|---|---|---|---|---|---|
| 21d | Cross Point | 32 | 23 | 6 | 133 | 17 | 0 | 149 | 11.1% | 141 | 5.9% |
| 22d | 1T1R | 32 | 35 | 6 | 199 | 8 | 12 | 220 | 9.4% | 216 | 7.7% |
| 23d | 1T1R | 32 | 23 | 6 | 133 | 8 | 8 | 149 | 11.1% | 145 | 8.6% |
| 24d | Cross Point | 32 | 23 | 6 | 133 | 8 | 8 | 149 | 11.1% | 145 | 8.6% |

M = 512 word × bit lines (M × M), array size
Fm = 90 nm
L = 8 memory layers in single 3D volumetric array
Measurements (A and B) in microns; area measurements in square microns

| 20d | Cross Point | 64 | 92 | 12 | 1,062 | 17 | 0 | 1,078 | 1.5% | 1,070 | 0.8% |
|---|---|---|---|---|---|---|---|---|---|---|---|
| 21d | Cross Point | 128 | 46 | 23 | 1,062 | 33 | 0 | 1,095 | 3.0% | 1,078 | 1.5% |
| 22d | 1T1R | 128 | 69 | 23 | 1,593 | 17 | 25 | 1,634 | 2.5% | 1,626 | 2.0% |
| 23d | 1T1R | 128 | 46 | 23 | 1,062 | 17 | 17 | 1,095 | 3.0% | 1,087 | 2.3% |
| 24d | Cross Point | 128 | 46 | 23 | 1,062 | 17 | 17 | 1,095 | 3.0% | 1,087 | 2.3% |

M = 512 word × bit lines (M × M), array size
Fm = 90 nm
L = 16 memory layers in single 3D volumetric array
Measurements (A and B) in microns; area measurements in square microns

| 20d | Cross Point | 32 | 92 | 6 | 531 | 17 | 0 | 547 | 3.0% | 539 | 1.5% |
|---|---|---|---|---|---|---|---|---|---|---|---|
| 21d | Cross Point | 64 | 46 | 12 | 531 | 33 | 0 | 564 | 5.9% | 547 | 3.0% |
| 22d | 1T1R | 64 | 69 | 12 | 796 | 17 | 25 | 838 | 5.0% | 829 | 4.0% |
| 23d | 1T1R | 64 | 46 | 12 | 531 | 17 | 17 | 564 | 5.9% | 556 | 4.5% |
| 24d | Cross Point | 64 | 46 | 12 | 531 | 17 | 17 | 564 | 5.9% | 556 | 4.5% |

M = 1,024 word × bit lines (M × M), array size
Fm = 90 nm
L = 8 memory layers in single 3D volumetric array
Measurements (A and B) in microns; area measurements in square microns

| 20d | Cross Point | 128 | 184 | 23 | 4,247 | 33 | 0 | 4,280 | 0.8% | 4,263 | 0.4% |
|---|---|---|---|---|---|---|---|---|---|---|---|
| 21d | Cross Point | 256 | 92 | 46 | 4,247 | 66 | 0 | 4,313 | 1.5% | 4,280 | 0.8% |
| 22d | 1T1R | 256 | 138 | 46 | 6,370 | 33 | 50 | 6,453 | 1.3% | 6,436 | 1.0% |
| 23d | 1T1R | 256 | 92 | 46 | 4,247 | 33 | 33 | 4,313 | 1.5% | 4,296 | 1.2% |
| 24d | Cross Point | 256 | 92 | 46 | 4,247 | 33 | 33 | 4,313 | 1.5% | 4,296 | 1.2% |

M = 1,024 word × bit lines (M × M), array size
Fm = 90 nm
L = 16 memory layers in single 3D volumetric array
Measurements (A and B) in microns; area measurements in square microns

| 20d | Cross Point | 64 | 184 | 12 | 2,123 | 33 | 0 | 2,157 | 1.5% | 2,140 | 0.8% |
|---|---|---|---|---|---|---|---|---|---|---|---|
| 21d | Cross Point | 128 | 92 | 23 | 2,123 | 66 | 0 | 2,190 | 3.0% | 2,157 | 1.5% |
| 22d | 1T1R | 128 | 138 | 23 | 3,185 | 33 | 50 | 3,268 | 2.5% | 3,251 | 2.0% |
| 23d | 1T1R | 128 | 92 | 23 | 2,123 | 33 | 33 | 2,190 | 3.0% | 2,173 | 2.3% |
| 24d | Cross Point | 128 | 92 | 23 | 2,123 | 33 | 33 | 2,190 | 3.0% | 2,173 | 2.3% |

M = 1,024 word × bit lines (M × M), array size
Fm = 90 nm
L = 32 memory layers in single 3D volumetric array
Measurements (A and B) in microns; area measurements in square microns

| 20d | Cross Point | 32 | 184 | 6 | 1,062 | 33 | 0 | 1,095 | 3.0% | 1,078 | 1.5% |
|---|---|---|---|---|---|---|---|---|---|---|---|
| 21d | Cross Point | 64 | 92 | 12 | 1,062 | 66 | 0 | 1,128 | 5.9% | 1,095 | 3.0% |
| 22d | 1T1R | 64 | 138 | 12 | 1,593 | 33 | 50 | 1,675 | 5.0% | 1,659 | 4.0% |
| 23d | 1T1R | 64 | 92 | 12 | 1,062 | 33 | 33 | 1,128 | 5.9% | 1,111 | 4.5% |
| 24d | Cross Point | 64 | 92 | 12 | 1,062 | 33 | 33 | 1,128 | 5.9% | 1,111 | 4.5% |

Equations for estimating periphery area for routing WL to both sides and BL to one side (1s) only.
BL Periph-Area = 2 edges × B × (L/2 × 2 Fm) = 2 BL × Fm, FIG. 20d and 21d
BL Periph-Area = 2 edges × B × (L/4 × 2 Fm) = BL × Fm, FIG. 22d, 23d and 24d
WL Periph-Area = 2 edges × A × (2 Fm) = 4 A × Fm, except FIG. 20d and 21d (vertical WL)
For the case BL are routed to both sides (top and bottom), the Periph-A for BL is reduced by 50%

The invention claimed is:

1. A memory device comprising:
an insulative substrate;
a non-monocrystalline active-device layer deposited upon the insulative substrate, the non-monocrystalline active device layer comprising a plurality of active devices;
an insulative layer on the non-monocrystalline active-device layer; and
a three-dimensional volumetric memory array disposed on top of the insulative layer and directly above one or more to the plurality of active devices, wherein the three-dimensional volumetric memory array is electrically connected to the non-monocrystalline active-device layer via a plurality of vias through the insulative layer and between the three-dimensional volumetric memory array and the non-monocrystalline active device layer,
wherein a ratio of a number of a first portion of the plurality of active devices to a number of a second portion of active devices is less than 10%, wherein the first portion of active devices are not located directly below the three-dimensional volumetric memory array, and the second portion of active devices are located directly below the three-dimensional volumetric memory array.

2. The memory device of claim 1, wherein the plurality of active devices are electrically configured as decoder logic for the three-dimensional volumetric memory array.

3. The memory device of claim 1, wherein the plurality of active devices are electrically configured as drivers for the three-dimensional volumetric memory array.

4. The memory device of claim 1, wherein the plurality of active devices are electrically configured as sense circuitry for the three-dimensional volumetric memory array.

5. The memory device of claim 1, wherein the dielectric substrate comprises glass (plastic, etc.).

6. The memory device of claim 1, further comprising a display screen having a plurality of display pixels.

7. The memory device of claim 6, wherein the display screen is disposed above or below the three dimensional volumetric memory array.

8. A memory device comprising:
a substrate;
a three-dimensional volumetric memory array disposed on top of the substrate; and
a non-monocrystalline active device layer disposed upon the three-dimensional volumetric memory array, the non-monocrystalline active device layer comprising a plurality of active devices, wherein the non-monocrystalline active device layer is electrically connected to the three-dimensional volumetric memory array via a plurality of vias that are located between the three-dimensional volumetric memory array and the non-monocrystalline active device layer,
wherein the non-monocrystalline active device layer is a first non-monocrystalline active device layer and the plurality of vias is a first plurality of vias, the memory device further comprising:
a second non-monocrystalline active device layer disposed upon the first non-monocrystalline active device layer, the second non-monocrystalline active device layer comprising a plurality of active devices, wherein the second non-monocrystalline active device layer is electrically connected to first non-monocrystalline active device layer via a second plurality of vias that are located between the second non-monocrystalline active device layer and the first non-monocrystalline active device layer.

9. The memory device of claim 8, wherein the plurality of active devices are electrically configured as decoder logic for the three-dimensional volumetric memory array.

10. The memory device of claim 8, wherein the plurality of active devices are electrically configured as drivers for the three-dimensional volumetric memory array.

11. The memory device of claim 8, wherein the plurality of active devices are electrically configured as sense circuitry for the three-dimensional volumetric memory array.

12. The memory device of claim 8, wherein the substrate is a monocrystalline semiconductor substrate having a plurality of active devices.

13. The memory device of claim 12, wherein the plurality of active devices are configured as a processor.

14. The memory device of claim 8, wherein the substrate is an insulative substrate.

15. A memory device comprising:
a substrate having a first plurality of active devices;
a first insulative layer on the substrate;
a non-monocrystalline active-device layer on the first insulative layer, the non-monocrystalline active-device layer having a second plurality of active devices, wherein one or more of the second plurality of active devices is in electrical communication with one or more of the first plurality of active devices via one or more vias through the first insulative layer and between the non-monocrystalline active-device layer and the substrate;
a second insulative layer on the non-monocrystalline active-device layer; and a three-dimensional volumetric memory array disposed on top of the second insulative layer, wherein the three-dimensional volumetric memory array is electrically connected to the non-monocrystalline active-device layer via a plurality of vias through the second insulative layer and between the three-dimensional volumetric memory array and the non-monocrystalline active device layer.

16. The memory device of claim 15, wherein the substrate is a monocrystalline semiconductor substrate.

17. The memory device of claim 15, wherein the non-monocrystalline active-device layer is a second non-monocrystalline active-device layer, and wherein the substrate is an insulative substrate having a first non-monocrystalline active-device layer deposited thereupon.

18. The memory device of claim 15, wherein the three-dimensional volumetric memory array is disposed directly above one or more of the second plurality of active devices.

19. The memory device of claim 15, wherein the substrate is an insulative substrate, and wherein the first plurality of active devices comprises a third plurality of active devices.

20. The memory device of claim 15, wherein the first plurality of active devices comprise a third plurality of MOSFET transistors.

21. The memory device of claim 15, wherein the first plurality of active devices are configured as a processor.

22. The memory device of claim 15, further comprising:
a second non-monocrystalline active-device layer on the three-dimensional volumetric memory array, the second non-monocrystalline active-device layer having a third plurality of active devices.

23. A method of manufacturing a memory device, the method comprising the steps of: providing an insulative substrate;

depositing a non-monocrystalline active device layer on the provided substrate; selectively doping the deposited non-monocrystalline active device layer so as to form a plurality of active devices, the active devices having a minimum critical dimension;

disposing a three-dimensional volumetric memory array on top of the deposited non-monocrystalline active device layer; and connecting the disposed three-dimensional volumetric memory array to the plurality of active devices formed in the deposited non-monocrystalline active device layer, wherein the thermal budget of the sum of the depositing, the selectively doping, the disposing, and the connecting steps is less than 30% of the minimum critical dimension, wherein the thermal budget measured as a change in the critical dimension resulting from diffusion of carriers in response to the thermal budget.

24. A method of manufacturing a memory device, the method comprising the steps of: providing a substrate;

disposing a three-dimensional volumetric memory array on top of the provided substrate; and depositing a non-monocrystalline active device layer on the three-dimensional volumetric memory array;

selectively doping the deposited non-monocrystalline active device layer so as to form a plurality of active devices;

connecting one or more of the plurality of active devices to the three-dimensional volumetric memory array deposited on the substrate, wherein the thermal budget of the sum of the disposing, the depositing, the selectively doping, and the connecting steps is less than 30% of the minimum critical dimension, wherein the thermal budget measured as a change in the critical dimension resulting from diffusion of carriers in response to the thermal budget.

* * * * *